United States Patent [19]
Wada

[11] Patent Number: 5,724,292
[45] Date of Patent: Mar. 3, 1998

[54] STATIC SEMICONDUCTOR MEMORY DEVICE

[75] Inventor: Tomohisa Wada, Hyogo, Japan

[73] Assignee: Mitsubishi Denki Kabushiki Kaisha, Tokyo, Japan

[21] Appl. No.: 781,386

[22] Filed: Jan. 13, 1997

[30] Foreign Application Priority Data

Jun. 18, 1996 [JP] Japan .................................. 8-156795

[51] Int. Cl.$^6$ ...................................................... G11C 7/02
[52] U.S. Cl. .................... 365/207; 365/154; 365/189.01; 365/205
[58] Field of Search ................................ 365/207, 205, 365/154, 189.01

[56] References Cited

U.S. PATENT DOCUMENTS 5,280,441  1/1994  Wada et al. ............................. 365/63
5,434,821  7/1995  Watanabe et al. ..................... 365/207

FOREIGN PATENT DOCUMENTS 63-83992  4/1988  Japan .

OTHER PUBLICATIONS

Shiomi, Toru, et al: "A 5.8-ns 256-Kb BiCMOS TTL SRAM with T-Shaped Bit Line Architecture", IEEE Journal of Solid-State Circuits, vol. 28, No. 12, Dec. 1993, pp. 1362-1369.

Wada, Tomohisa, et al: "A 34-ns 1-Mbit CMOS SRAM Using Triple Polysilicon", IEEE Journal of Solid-State Circuits, vol. SC-22, No. 5, Oct. 1987, pp. 727-732.

Sasaki, Katsuro, et al: "A 9-ns 1-Mbit CMOS SRAM", IEEE Journal of Solid-State Circuits, vol. 24, No. 5, Oct. 1989, pp. 1219-1225.

Primary Examiner—David C. Nelms
Assistant Examiner—Hoai V. Ho
Attorney, Agent, or Firm—Lowe, Price, LeBlanc & Becker

[57] ABSTRACT

Sense circuits are provided correspondingly to bit line pairs provided corresponding to memory cell columns, respectively. The sense circuit senses, amplifies and latches storage data of the selected memory cell, and information latched by the sense amplifier is rewritten into the selected memory cell after selection of the memory cell. Thereby, destruction of storage information of the memory cell is prevented.

22 Claims, 25 Drawing Sheets

$\beta a : \beta d \fallingdotseq 1:1$

FIG. 7A
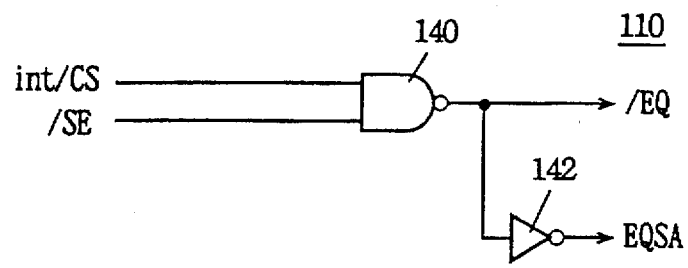
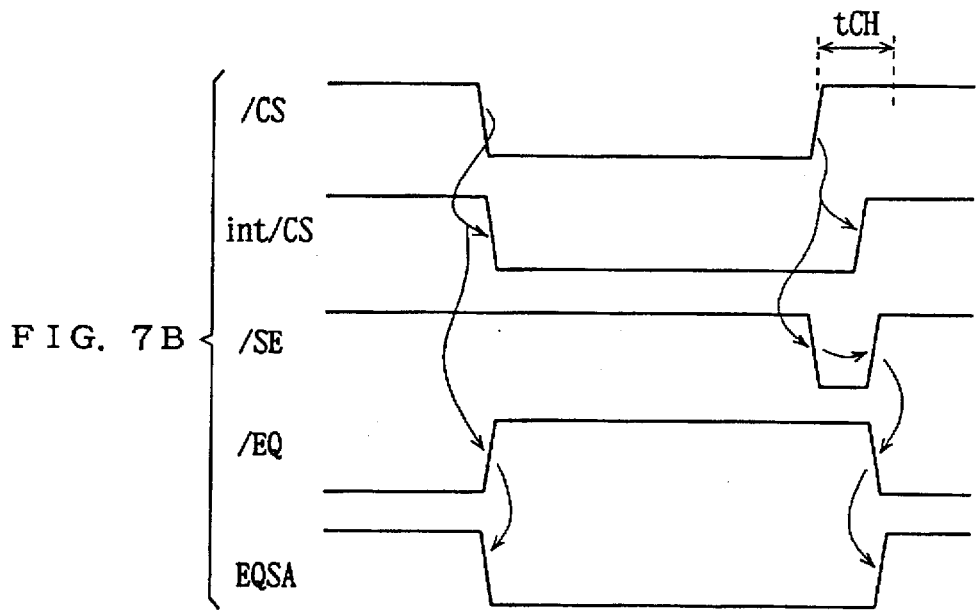
FIG. 7B
FIG. 8A
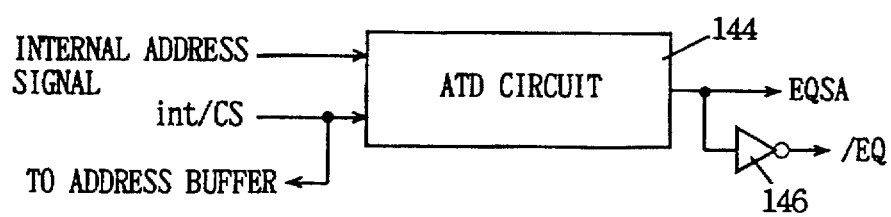
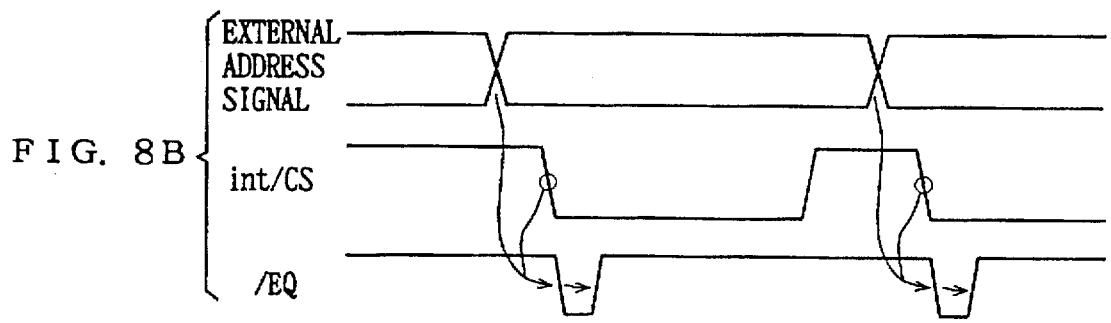
FIG. 8B

H READ

L READ

H WRITE

L WRITE

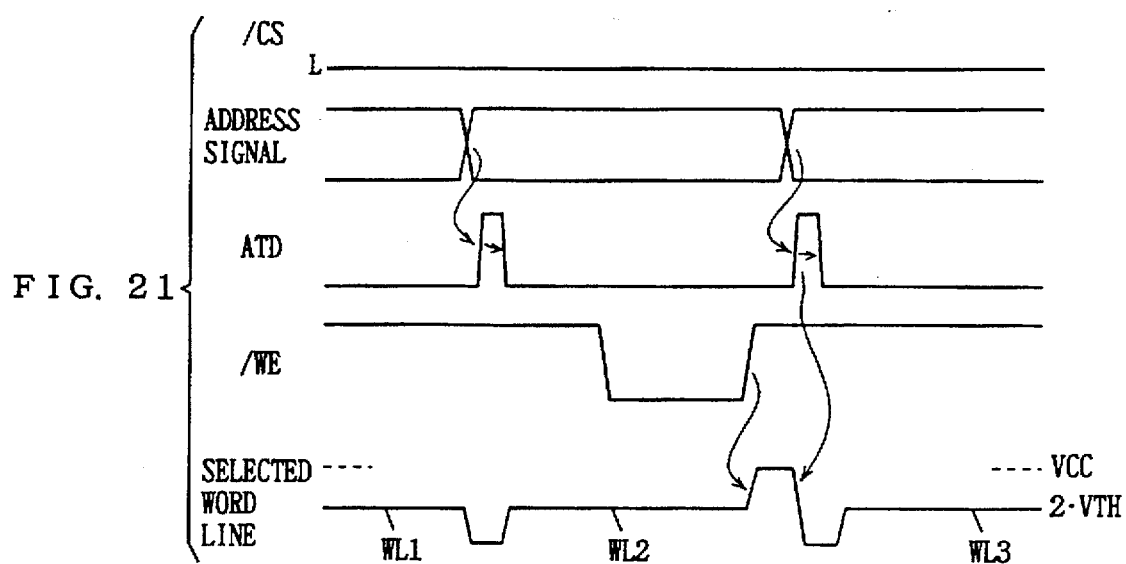
FIG. 21
FIG. 22A
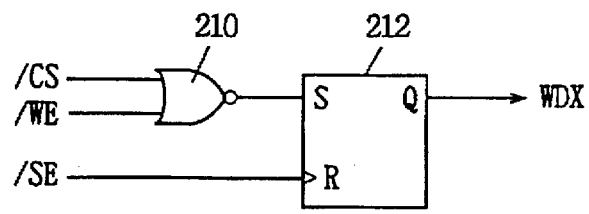
FIG. 22B
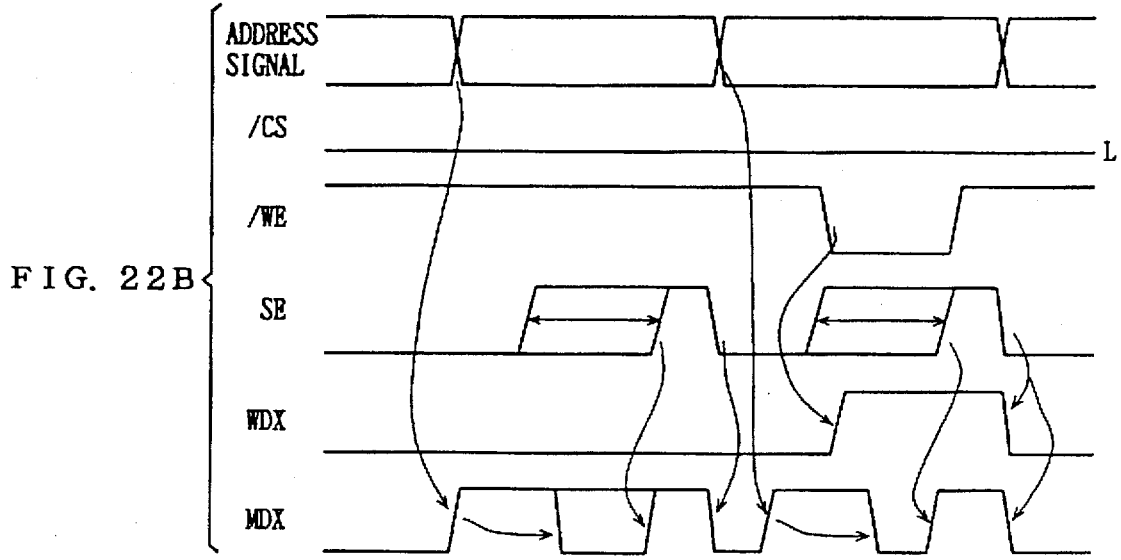

260

5,724,292

1

STATIC SEMICONDUCTOR MEMORY DEVICE

BACKGROUND OF THE INVENTION

1. Field of the Invention

The present invention relates to a semiconductor memory device, and particularly to a circuit structure for data reading/writing in a static semiconductor memory device.

2. Description of the Background Art

FIG. 31 schematically shows a structure of an array of a static semiconductor memory device (SRAM) in the prior art. In FIG. 31, the SRAM includes a plurality of word lines 5a . . . 5b extending in a row direction, a plurality of bit line pairs 6a . . . 6b extending in a column direction, and memory cells (MC) 1a–1d arranged corresponding to crossings of these word lines 5a . . . 5a and bit line pairs 6a . . . 6b. Each of bit line pairs 6a . . . 6b includes bit lines 6x and 6y for transmitting mutually complementary data signals. Memory cells (MC) 1a and 1b are arranged corresponding to crossings of word line 5a and bit line pairs 6a and 6b, respectively. Memory cells 1c and 1d are arranged corresponding to crossings of word line 5b and bit line pairs 6a and 6b, respectively. Corresponding to bit line pairs 6a . . . 6b, there are arranged bit line load circuits 2a . . . 2b, which pull up the corresponding bit line pairs to a predetermined potential of (VBL–VTH), respectively, equalize transistors 3a . . . 3b formed of p-channel MOS transistors which are turned on in response to an equalize instructing signal /EQ and thereby electrically short-circuit bit lines 6x and 6y of the corresponding bit line pairs, and column select gates 31a . . . 31b which couple the corresponding bit line pairs to internal data lines 32 in response to column select signals YSEL0–YSELn–1 from a column decoder (not shown), respectively. In FIG. 31, there is also shown a column select gate 31c arranged for a not shown bit line pair.

Each of bit line load circuits 2a . . . 2b includes a resistance-connected n-channel MOS transistor 2x which is coupled between an intermediate potential node and bit line 6x, and a resistance-connected n-channel MOS transistor 2y which is coupled between the intermediate potential node and bit line 6y. These MOS transistors 2x and 2y function as pull-up resistor elements or clamp elements. An intermediate potential VBL is slightly higher than half the sum of a power supply potential VCC and a ground potential GND.

Each of column select gates 31a . . . 31b includes n-channel MOS transistors 31x and 31y, which are turned on in response to a corresponding column select signal YSEL and thereby couple bit lines 6x and 6y to internal data lines included in internal data bus 32, respectively. MOS transistors 31x and 31y included in a column select gate, which receives a column select signal in the selected state among column select signals YSEL0–YSELn–1, are turned on to connect electrically the corresponding bit line pair to internal data bus 32.

The SRAM further includes a row decoder 4 which decodes internal row address signals received from a not shown address buffer and drives an addressed word line among word lines 5a . . . 5b to the selected state, a sense amplifier which operates in a data read operation to amplify data read onto internal data bus 32 for transmission onto a read/write bus 33, a write driver which operates in a data write operation to produce internal write data from data applied onto read/write bus 33 and transmit the same onto internal data bus 32, and a DQ buffer 8 which performs external input/output of data onto and from read/write bus

2

33. In FIG. 31, the sense amplifier and write driver are shown as one block 7.

Further, the SRAM includes a control buffer 9 which receives a chip select signal /CS and a write enable signal /WE for controlling operations of row decoder 4, sense amplifier and write driver 7, and DQ buffer 8 in accordance with states (active and inactive states) of the received signals, and an ATDEQ circuit 10 which detects transition in the address signal and sets equalize instructing signal /EQ to the active state of L-level for a predetermined period in accordance with results of detection.

When chip select signal /CS is at L-level (low level), the semiconductor memory device is selected, and the internal circuits of this semiconductor memory device are enabled under the control of control buffer 9. When chip select signal /CS is inactive (at H-level), the semiconductor memory device is nonselected and in a standby state.

When write enable signal /WE is at L-level, it indicates that data writing is to be performed. When write enable signal /WE is at H-level, it indicates that data reading is to be performed. The sense amplifier included in block 7 is activated by active chip select signal /CS during any of data reading and data writing. The write driver is activated when write enable signal /WE is at L-level indicating data writing, and thereby produces internal write data at a predetermined timing for transmitting the same to internal data bus 32.

DQ buffer 8 is set to an output high impedance state when chip select signal /CS is inactive. In DQ buffer 8, a buffer for data input or a buffer for data output is activated in accordance with H-level/L-level of write enable signal /WE, when chip select signal /CS is active.

Data reading/writing of the SRAM shown in FIG. 31 will be described below with reference to operation waveforms shown in FIG. 32.

In FIG. 32, chip select signal /CS is active and therefore at L-level, and the SRAM is enabled.

In a read cycle for data reading, write enable signal /WE is at H-level. When the address signal makes a transition, the internal row address signal from the address buffer makes a transition, and an ATDEQ circuit 10 sets equalize instructing signal /EQ to the active state of L-level for a predetermined period in response to this address transition. Thereby, bit lines 6x and 6y which have been precharged to intermediate potential VBL are electrically short-circuited to be equalized in potential. Then, row decoder 4 decodes the received internal row address signal, and drives the word line designated by the row address signal to the selected state, so that the potential on the selected word line rises to power supply potential VCC level.

When the potential on this selected word line rises to power supply potential VCC level, data of memory cells (MC) connected to this selected word line are read onto corresponding bit line pairs 6a–6b, and the potentials on bit lines 6x and 6y change in accordance with the read memory cell data.

Further, one of the column select signals from the column decoder is activated, and the selected bit line pair is connected to internal data bus 32. The sense amplifier included in block 7 amplifies data read onto internal data bus 32 for transmission onto read/write bus 33. The sense amplifier included in block 7 does not affect the potential on internal data bus 32. The internal read data transmitted onto read/write bus 33 is output as read data Q via DQ buffer 8.

The SRAM is statically operating, and row decoder 4 decodes the row address signal applied thereto. When the address signal changes, the selected word line is driven to the nonselected or selected state in accordance with the changed address signal. When the selected word line is driven to the nonselected state, bit lines 6x and 6y are pulled up to intermediate potential VBL level by load transistors 2x and 2y included in the bit line load circuit. In this operation, equalize instructing signal /EQ from ATDEQ circuit 10 is set to the active state of L-level for a predetermined period, and equalize transistors 3a–3b are turned on, so that bit lines 6x and 6y are precharged and equalized to intermediate potential VBL.

In the write cycle for data writing, the same operations up to completion of word line selection are performed as those for data reading. When write enable signal /WE is set to the active state of L-level, the data input buffer included in DQ buffer 8 is activated to produce internal write data from external write data DQ and transmit the same onto read/write bus 33. Then, the write driver included in block 7 is activated under the control of control buffer 9, and thereby produces internal write data from write data applied onto read/write bus 33 for transmitting the same. The internal write data transmitted onto internal data bus 32 is transmitted onto the corresponding bit line pair 6 (one of pairs 6a . . . 6b) via the column select gate which is turned on in accordance with column select signal YSEL (one of YSEL0–YSELn–1).

The write driver transmits complementary internal write data at power supply potential VCC level and ground potential GND level onto internal data bus 32. In this data write operation, therefore, the potentials on bit lines 6x and 6y of the selected bit line pair change to power supply potential VCC level and ground potential GND level in accordance with the internal write data. Thereby, data is written into the memory cell (MC) arranged corresponding to the crossing of the selected row and column. When the data writing is completed, write enable signal /WE is set to H-level, and the write driver stops driving of internal data bus 32. The potential on the selected bit line is driven to the intermediate potential level by the bit line load circuit 2 (one of circuits 2a–2b). When the address signal changes, equalize instructing signal /EQ from ATDEQ circuit 10 is set to the active state of L-level for a predetermined period, and equalize transistors 3a–3b are turned on, so that bit lines 6x and 6y are electrically short-circuited and equalized to intermediate potential VBL level.

In general, the SRAM operates statically, and temporary reset of row decoder 4 is not made. Therefore, the word line and bit line pair are selected in accordance with change in the address signal, so that it is not necessary to perform temporary internal resetting in contrast to a dynamic semiconductor memory device (DRAM), and thus rapid access is allowed.

FIGS. 33A and 33B show a specific structure of memory cell (MC) shown in FIG. 31. In FIG. 33A, memory cell (MC) 1 includes an access transistor Q1 formed of an n-channel MOS transistor, which is connected between storage node N1 and bit line 6x, and is turned on in response to a signal potential on word line 5, an access transistor Q2 formed of an n-channel MOS transistor, which is connected between storage node N2 and bit line 6y, and is turned on in response to a signal potential on word line 5, a drive transistor Q3 formed of an n-channel MOS transistor, which is connected between storage node N1 and ground node GND (the same reference characters indicate both the node and the potential thereon), and has a gate connected to storage node N2, a drive transistor Q4 formed of an n-channel MOS transistor, which is connected between storage node N2 and the ground node, and has a gate connected to storage node N1, a high resistance load element R1 connected between power supply node VCC and storage node N1, and a high resistance load element R2 connected between power supply node VCC and storage node N2.

Drive transistors Q3 and Q4 form a flip-flop, and high resistance load elements R1 and R2 function as a pull-up resistance element.

When the signal potential on word line 5 is at L-level, access transistors Q1 and Q2 are off, and storage nodes N1 and N2 are isolated from bit lines 6x and 6y, respectively. In this state, the potentials on storage nodes N1 and N2 are held by the flip-flop formed of drive transistors Q3 and Q4. For example, when storage node N1 is at H-level, drive transistor Q4 is turned on to discharge storage node N2 to the ground potential level, and the drive transistor Q3 is surely turned off. Therefore, storage node N1 is held at power supply potential VCC level via high resistance load element R1.

When the signal potential on word line 5 is set to H-level, access transistors Q1 and Q2 are turned on, and storage nodes N1 and N2 are electrically connected to bit lines 6x and 6y, respectively. Bit lines 6x and 6y have been held at intermediate potential VBL level by bit line load circuit 2 shown in FIG. 31. When storage node N1 holds the potential at H-level, a current flows from storage node N1 to bit line 6x. A value of the current flowing from high resistance load element R1 to bit line 6x is extremely small, and the potential on bit line 6x substantially maintains intermediate potential VBL level. Meanwhile, the potential on storage node N2 is at ground potential GND level and therefore L-level, and a current flows from bit line 6y to ground node GND via access transistor Q2 and drive transistor Q4. When a current flows through bit line 6y, the potential on bit line 6y lowers due to the resistance of bit line 6y, and a potential difference occurs between bit lines 6x and 6y. This potential difference between bit lines 6x and 6y is sensed and amplified by the sense amplifier for outputting.

In the data write operation, word line 5 is held at the selected state, and bit lines 6x and 6y are fully swung to power supply potential VCC level and ground potential GND level in accordance with data to be written, respectively. Thereby, the potentials on bit lines 6x and 6y are transmitted to storage nodes N1 and N2, and the latch state of the flip-flop formed of drive transistors Q3 and Q4 attains the potential levels corresponding to the signal potential levels transmitted onto bit lines 6x and 6y via the write driver.

In the structure of the memory cell shown in FIG. 33A, a current always flows through one of high resistance load elements R1 and R2. If the SRAM has a large storage capacity and therefore includes an increased number of memory cells, the value of this current cannot be ignored, and the SRAM cannot operate with a lower current consumption.

FIG. 33B shows another structure of SRAM memory cell (MC) 1 in the prior art. Memory cell (MC) 1 shown in FIG. 33B includes cross-coupled p-channel MOS transistors Q5 and Q6 instead of high resistance load elements R1 and R2 in the memory cell shown in FIG. 33A. More specifically, p-channel MOS transistor Q5 is connected between power supply node VCC and storage node N1, and has a gate connected to storage node N2. P-channel MOS transistor Q6 is connected between power supply node VCC and storage node N2, and has a gate connected to storage node N1.

In the structure of memory cell (MC) 1 shown in FIG. 33B, when the potential on storage node N1 is at H-level, p-channel MOS transistor Q6 is completely turned off, and a current path from power supply node VCC to storage node N2 is cut off. In this state, the storage node N2 is discharged to the ground potential level via drive transistor Q4, and p-channel MOS transistor Q5 is on, so that storage node N1 is held at power supply potential VCC level. Drive transistor Q3 is off, because storage node N2 is L level at the ground potential level. Accordingly, no path for current flow is present between power supply node VCC and ground node GND, and a current consumption is reduced.

FIG. 34 schematically shows a cross sectional structure of the memory cell including the high resistance load element shown in FIG. 33A. FIG. 34 representatively shows one access transistor and one high resistance load element. In FIG. 34, the memory cell includes heavily doped N-type impurity regions 51 and 52 which are formed on a P-well 50 with a space between each other, and conductive layers 53 formed on the channel region between impurity regions 51 and 52 with a gate insulating film (not shown) therebetween. Impurity region 51 is connected to a low resistance conductive layer 55 via an intermediate conductive layer 54. Conductive layer 53 is formed of, e.g., polycrystalline silicon, and serves as a word line. FIG. 34 shows conductive layers 53, which serves as word lines WLa and WLb arranged at opposite sides of impurity region 51. Conductive layer 55 is made of, e.g., aluminum, and serves as a bit line BL.

The memory cell further includes a conductive layer 56 connected to impurity region 52, and a polycrystalline silicon high resistance layer 57 formed over conductive layer 56 with an interlayer insulating film (not shown) therebetween and connected to impurity region 52. Conductive layer 56 is made of, e.g., polycrystalline silicon, and connects impurity region 52 to a gate electrode of an access transistor which is arranged at another side (not shown). Impurity region 52 serves as a storage node. High resistance polycrystalline silicon layer 57 is connected to a power supply interconnection 58, and transmits power supply voltage VCC to impurity region 52.

High resistance polycrystalline silicon layer 57 has a high resistance of gigaohms or teraohms, and supplies a current of a magnitude of approximately a few picoamperes to impurity region 52 serving as a storage node.

As shown in FIG. 34, in the memory cell polycrystalline silicon layer 57 serving as a high resistance load element is provided on a region forming a drive transistor. Therefore, it is possible to reduce an area occupied by regions for forming the drive transistor and the high resistance load element, and therefore, an area occupied by the memory cell can be reduced, so that high density integration can be achieved.

A field insulating film 59 for element isolation is formed adjacent to impurity region 52 for isolating from another drive transistor formation region.

FIG. 35 schematically shows a cross sectional structure of a memory cell using a thin film transistor (TFT) as a high resistance load element. Instead of high resistance polycrystalline silicon layer 57 in the structure shown in FIG. 34, the structure shown in FIG. 35 includes a polycrystalline silicon gate electrode layer 60 formed on conductive layer 56, and a polycrystalline silicon interconnection layer 61 formed on gate electrode layer 60 and connected to impurity region 52. Polycrystalline silicon interconnection layer 61 includes a low resistance portion 61b connected to impurity region 52, a low resistance interconnection portion 61a connected to a not shown power supply interconnection, and a high resistance polycrystalline silicon region 61c which is formed on gate electrode layer 60 and serves as a channel region. This gate electrode layer 60 is connected to a connection node (i.e., storage node) of not shown access and drive transistors at the counterpart (not shown). Conductive layer 56 is connected to gate electrodes of a thin film transistor and a drive transistor at the counterpart. The element isolating region 59 is arranged for isolation from another the drive transistor formation region and another access transistor formation region.

In the structure of memory cell shown in FIG. 35, low resistance interconnection portions 61a and 61b of polycrystalline silicon interconnection layer 61 function as source and drain regions of the thin film transistor, respectively, and a channel is formed at high resistance region 61c in accordance with the potential applied to gate electrode layer 61. In the structure using this thin film transistor as a high resistance load element, the thin film transistor is formed above the drive transistor formation region, so that an area occupied by the memory cell can be reduced similarly to the structure already described. In contrast to the structure using the polycrystalline silicon high resistance element, the thin film transistor has a relatively large current drive capability when it is on, and the quantity of its drive current is larger than that of the high resistance polycrystalline silicon layer, which allows stable holding of storage data in accordance with the current supply capability, compared with the structure using the polycrystalline silicon high resistance element.

A structure in which a high resistance element is formed above a drive transistor as shown in FIGS. 34 and 35 is disclosed by Wada et al., "A 34-ns 1-Mbit CMOS SRAM Using Triple Polysilicon", IEEE Journal of Solid-State Circuits, Vol. SC22, No. 5, October 1987, pp. 727–732. A structure of an SRAM cell in which a thin film transistor is formed above a drive transistor is disclosed by Sasaki et al, "A 9-ns 1-Mbit CMOS SRAM", IEEE Journal of Solid-State Circuits, Vol. 24, No. 5, October 1989, pp. 1219–1225.

As described above, an area occupied by the memory cell can be reduced in such a structure that a polycrystalline silicon layer or a thin film transistor forming a high resistance load element is formed above a drive transistor and an access transistor. However, a resistance value of such a high resistance load element is sufficiently larger than on-resistances (channel resistances) of access transistors Q1 and Q2 and drive transistors Q3 and Q4. As described below, therefore, it is necessary that a transfer coefficient βa (ratio between a channel width Wa and a channel length La) of each of access transistors Q1 and Q2 is equal to or larger than a tripled transfer coefficient of each of drive transistors Q3 and Q4 in order to ensure holding of storage information at storage nodes N1 and N2, when the word line is selected and access transistors Q1 and Q2 are turned on. The access transistor and the drive transistor must have different transfer coefficients βb for the reason described below.

FIG. 36A shows an inverter I, and FIG. 36B shows input/output transfer characteristics of inverter I. Inverter I inverts an input signal IN to produce an output signal OUT. According to the input/output transfer characteristics shown in FIG. 36B, as a gain of the inverter increases, a signal change occurs more rapidly.

FIG. 37A shows a structure of an inverter latch. In FIG. 37A, there are arranged an inverter I1 which inverts a signal on node N1 for transmission to node N2, and an inverter I2 which inverts a signal on node N2 for transmission to node N1. Inverters I1 and I2 have the same input/output transfer characteristics. These transfer characteristics are shown in FIG. 37B. In FIG. 37B, a curve A1 represents transfer characteristics of inverter I1, and a curve A2 represents input/output transfer characteristics of inverter I2. Curve A2 is obtained by folding curve A1 along dotted line shown in FIG. 37. Crossing points S1 and S2 of curves A1 and A2 form stable points of this inverter latch.

A voltage corresponding to one of the states at stable points S1 and S2 appears on nodes N1 and N2. For stable operation of the inverter latch, the curves shown in FIG. 37B must have two stable points. A point M is a metastable point. Even when nodes N1 and N2 in an initial state are at potentials corresponding to a state near point M, a certain noise shifts the latch state to stable point S1 or S2. In order to attain such a state that the inverter latch formed of inverters I1 and I2 stably operates as a flip-flop to hold stably the potentials on nodes N1 and N2, a static noise margin defined by an area surrounded by the curves A1 and A2 must be large. If it were small, curves A1 and A2 would be close to each other, and any point in such close portion would falsely function as a stable point.

FIG. 38A shows a standby state (word line nonselected state) of a static memory cell. In FIG. 38A, access transistors Q1 and Q2 are off. In this state, nodes N1 and N2 are connected to the power supply node via high resistance load elements R1 and R2, respectively. In this state, high resistance load element R1 and drive transistor Q3 form inverter I2, and high resistance load element R2 and drive transistor Q4 form inverter I1. In the structure which uses the inverters including the high resistance load elements, when the drive transistor is turned on, the output node is rapidly discharged. (A current supply capability is extremely small owing to the high resistance load element.) In this case, therefore, the transfer characteristics of the inverter latch have an extremely steep transition portion allowing stable holding of data.

FIG. 39A shows a state of a memory cell in the word line selected state. In this state, access transistors Q1 and Q2 are turned on, and nodes N1 and N2 are connected to the bit lines, respectively. A current flows from the bit line into a storage node, which holds a potential at L-level, between nodes N1 and N2. This state is equivalent to a state that a load of a low impedance is connected in parallel to the high resistance load element, and therefore is equivalent to a structure where high resistance load elements R1 and R2 are not present. In this state, memory cell inverters I1 and I2 must be treated as NMOS enhancement type load inverters using access transistors (Q1 and Q2) as loads. In this case, a current is supplied from an NMOS enhancement load type transistor, so that signal change occurs more slowly at the transition portion of the input/output signal characteristics, and a gain lowers, as compared with the case where a high resistance load element is used. As shown in FIG. 39B, therefore, an area of a region defined by curves A1 and A2 decreases.

It is now assumed that access transistors Q1 and Q2 and drive transistors Q3 and Q4 have equal current drive capabilities. In this state, a quantity of current discharged by the turned-on drive transistor (e.g., Q4) is equal to a quantity of current supplied from the access transistor (e.g., Q2), so that inverters I1 and I2 have extremely slow input/output transfer characteristics, and therefore, as shown in FIG. 39C, curves A1 and A2 nearly attain a state that only one stable point is present. More specifically, the access transistors and the drive transistors have equal conductances, a potential on the storage node rises, and the other drive transistor starts to be turned on to lower a potential on the other storage node. The stable points S1 and S2 are operation points of the flip-flop formed of these inverters, and the flip-flop is held at either one of these states. When input/output transfer characteristics change as shown in FIG. 39C, bistable points are not present (monostable point is present), and data held at storage nodes N1 and N2 are destroyed.

Therefore, in order to ensure two stables points in the input/output transfer characteristics of the inverter latch, it is necessary to reduce a ratio between conductances of the access and drive transistors so as to prevent shift of the potential on storage node to an intermediate potential level, and in other words, it is necessary to set a current drive capability (conductance) of the drive transistor larger than a current drive capability (conductance) of the access transistor. The current drive capability (conductance) of this MOS transistor (insulated gate field effect transistor) is proportional to a ratio βb (transfer coefficient) between a channel width W and a channel length L. A ratio (cell ratio) R between these current drive capabilities is set to a value between 3 and 4. Thereby, the inverters have relatively steep input/output characteristics, ensuring two stable points, so that destruction of storage data in the data read operation can be prevented. However, in order to set transfer coefficients βb of drive transistors Q3 and Q4 larger than those of access transistors Q1 and Q2, channel widths of drive transistors Q3 and Q4 must be larger than those of access transistors Q1 and Q2.

If only the channel length is reduced, a short-channel effect occurs, so that a threshold voltage lowers, and a current consumption increases. Therefore, in order to hold data stably even in the data read operation, drive transistors Q3 and Q4 must have sizes (ratios of channel width to channel length) larger than those of the access transistors, so that the sizes (occupying area of memory cell) cannot be made small, which impedes high integration.

FIG. 39D shows transfer characteristics in a state that the power supply voltage of the inverter latch lowers. If power supply voltage VCC is lowered to a power supply voltage VCCa for low power consumption, such a state arises that two stable points are not present but only one stable point is present (or that a static noise margin is extremely small), because a variation range of the potential on each storage node is small, even if the inverter input/output transfer characteristics are steep. In this case, therefore, storage data is destroyed during data reading in the semiconductor memory device operating with a low power supply voltage, and data cannot be held stably.

Compared with the structure using the above high resistance load element, the structure using the CMOS inverter latch shown in FIG. 33B has the following difference. The current supply capabilities of the p-channel MOS transistors are larger than those of the high resistance load elements (high resistance element and thin film transistor). Even if a current is supplied via the access transistor to the node storing the potential at L-level when the access transistor is on, the current is transmitted to the corresponding storage node via the turn-on p-channel MOS transistor, and the storage information is stably held (even when the access transistor is on, the turned-on p-channel MOS transistor maintains the on state to supply an innegligible current for preventing lowering of the potential level of data at H-level). However, in the structure where the memory cell is formed of this CMOS inverter, it is necessary to increase the current supply capability of the p-channel MOS transistor, compared with the case where the thin-film transistor is used, and it is necessary to form this p-channel MOS transistor at the surface of the semiconductor well. Therefore, it is necessary to form the MOS transistors of different conductivity types, i.e., p-channel and n-channel MOS transistors at a single memory cell region, and it is necessary to form an element isolation region or provide well isolation, which impedes reduction of an area occupied by the memory cell. When the well isolation is used, a latch-up phenomenon peculiar to the CMOS transistor occurs, resulting in unpreferable flow of a large current through the memory cell.

SUMMARY OF THE INVENTION

It is an object of the invention to provide a semiconductor memory device which can perform a low voltage operation with reduced memory cell occupying area.

Briefly stating, in a semiconductor memory device according to the invention, sense amplifiers are provided for bit line pairs, respectively. When a memory cell is selected, the sense amplifier latches memory cell data appearing on the bit line pair, and the latched data is rewritten into the selected memory cell when required. Preferably, an access transistor and a drive transistor in the memory cell have equal sizes (ratio of channel width W to channel length L).

Since the sense amplifier is provided for each bit line pair and the potentials on each bit line pair is amplified and latched, the potential on one of paired bit lines is driven to L-level near the ground potential level, even if the potentials on the bit lines change in accordance with memory cell data or write data. Therefore, a flip-flop formed of drive transistor elements of the memory cell can be set to a monostable state for rewriting the read data or writing the write data. Thus, the storage state of the flip-flop of the original memory cell can be shifted to the stable point. Accordingly, even in a low power supply voltage operation, and even if size ratio (i.e., ratio of channel width to channel length) of access transistors and drive transistors are nearly 1, storage data of the memory cell can be stably held without destruction.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A schematically shows a structure of an equalize instructing signal generating portion in the control circuit shown in FIG. 1;

FIG. 7B shows operation waveforms representing the operation of the structure of FIG. 7A;

FIG. 8A shows a structure of a modification of an equalize instructing signal generating portion;

FIG. 8B shows operation waveforms representing an operation of the structure of FIG. 8A;

FIG. 21 is a signal waveform diagram representing an operation of the word line drive voltage generating portion shown in FIG. 20;

FIG. 22A shows a structure of a write data transfer control signal generating portion in the embodiment 3 of the invention;

FIG. 22B shows operation waveforms representing an operation of the structure of FIG. 22A;

DESCRIPTION OF THE PREFERRED EMBODIMENTS

[Embodiment 1]

Figure 1:
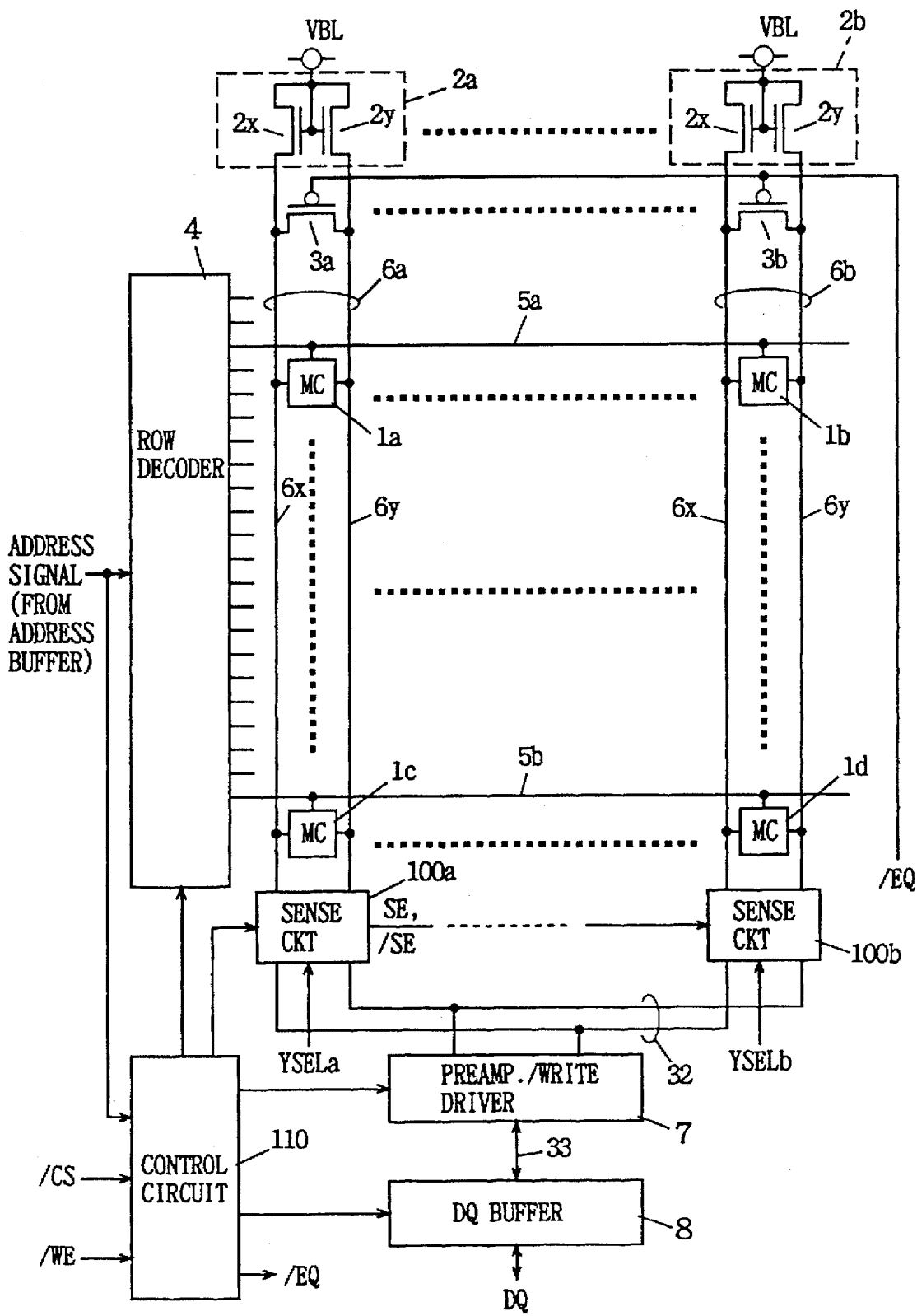
FIG. 1 schematically shows a whole structure of a semiconductor memory device according to an embodiment 1 of the invention.

FIG. 1 schematically shows a whole structure of an SRAM according to an embodiment 1 of the invention. In FIG. 1, the SRAM includes memory cells (MC) which are arranged in a matrix form, word lines 5 which are arranged corresponding to rows of the memory cells, respectively, and each of which are connected to the memory cells (MC) in the corresponding row, and a plurality of bit line pairs 6 which are arranged corresponding to columns of the memory cells, respectively, and each of which are connected to the memory cells in the corresponding column. FIG. 1 representatively shows memory cells 1a, 1b, 1c and 1d arranged corresponding to crossings at which word lines 5a and 5b cross bit line pairs 6a and 6b.

Equalize transistors 3a . . . 3b, which are turned on in response to an equalize instructing signal /EQ for a predetermined period and are formed of p-channel MOS transistors, are provided corresponding to bit line pairs 6a . . . 6b, respectively. Bit line load circuits 2a . . . 2b for precharging the corresponding bit line pairs to a predetermined potential (VBL−VTH) are provided corresponding to bit line pairs 6a . . . 6b, respectively. Each of bit line load circuits 2a . . . 2b includes load elements 2x and 2y formed of n-channel MOS transistors which are connected between power supply node VBL and bit lines 6x and 6y, respectively. The load elements 2x and 2y function as resistance elements or diode elements, and charge corresponding bit lines 6x and 6y to the potential level of (VBL−VTH), where VTH represents a threshold voltage of the MOS transistor forming the load element. Precharge potential VBL may be power supply voltage VCC.

The SRAM further includes sense circuits 100a . . . , 100b, which are provided corresponding to bit line pairs 6a . . . 6b for differentially amplifying and latching the potential difference of corresponding bit line pairs 6a . . . 6b when activated, respectively. Each of sense circuits 100a . . . 100b includes a column select gate, which is turned on in response to column select signal YSELa . . . YSELb applied from a column decoder (not shown) and thereby connects the corresponding bit line pair or sense nodes of the sense amplifier to an internal data bus 32. Specific structures of sense circuits 100a–100b will be described later.

Owing to provision of sense circuits 100a . . . 100b corresponding to bit line pairs 6a . . . 6b, respectively, the sense circuits can perform rewriting (restoring) even if data held in memory cells (MC) 1a . . . 1b would be destroyed during data reading. Consequently, storage data which was destroyed during data reading is restored, and thus data can be held stably.

The SRAM further includes a control circuit 110 which receives a chip select signal /CS, a write enable signal /WE and an address signal, and generates various internal control signals to be activated for a predetermined period in response to address transition, a block 7 which is formed of preamplifiers for amplifying data on internal data bus 32 and a write driver for amplifying and transmitting internal write data on a read/write data bus 33 to internal data bus 32, a DQ buffer 8 for performing external input/output of data to and from read/write data bus 33, and a row decoder 4 which includes unit decode circuits corresponding to word lines 5a . . . 5b, respectively, and decodes the address signal to drive the word line (selected word line) corresponding the addressed row to the selected state.

Row decoder 4 is controlled by control circuit 110. When chip select signal /CS is active, row decoder 4 is activated to decode the received address signal and drive the selected word line to the power supply voltage VCC level in both the data writing and reading operations. Preamplifier and write driver block 7 has a structure similar to the conventional structure. The preamplifier has the structure of a current mirror type differential amplifier circuit and differentially amplify a minute potential difference appearing on internal data bus 32, and transmits the amplified signal potential onto the read data bus of read/write data bus 33. Therefore, the preamplifier does not affect the signal potential difference on internal data bus 32. The write driver is activated in response to a write pulse which is generated when write enable signal /WE is active, to buffer the internal write data transmitted onto the write data bus of write/read data bus 33 for transmission onto internal data bus 32.

Figure 2:
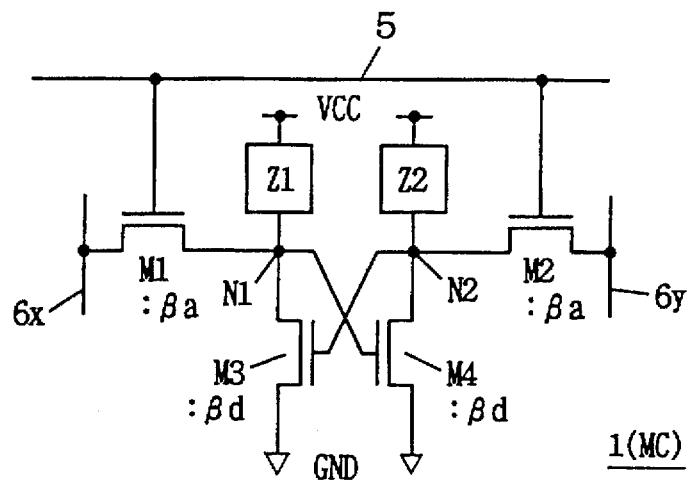
FIG. 2 shows a structure of a memory cell shown in FIG. 1.
Figure 34:
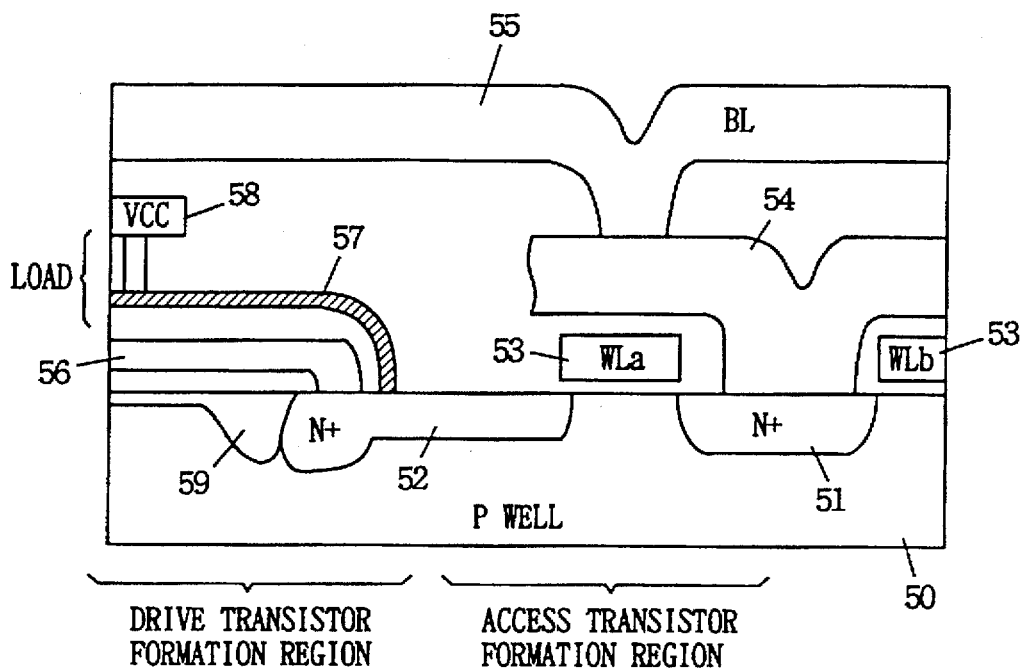
FIG. 34 schematically shows a cross sectional structure of the memory cell shown in FIG. 33A.
Figure 35:
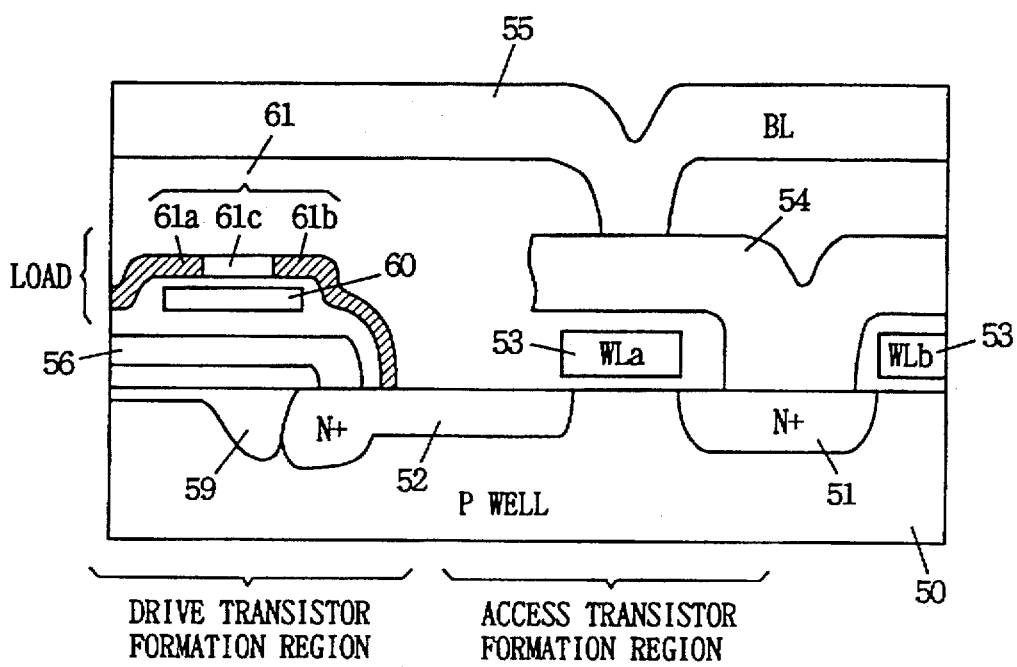
FIG. 35 shows another sectional structure of the conventional memory cell shown in FIG. 33A.
Figure 36A:
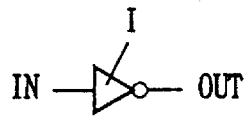
FIGS. 36A and 36B show a structure of an inverter circuit and input/output transfer characteristics of the same.
Figure 36B:
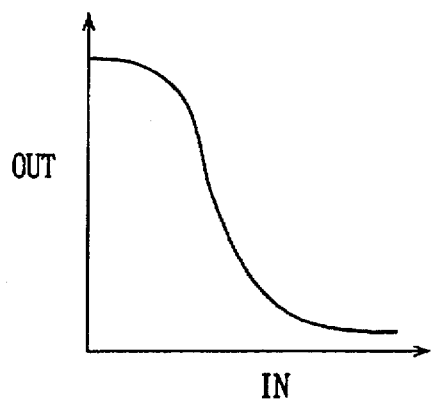
Figure 37A:
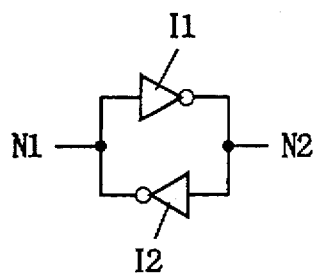
FIGS. 37A and 37B show a structure of an inverter latch and transfer characteristics of the same.
Figure 37B:
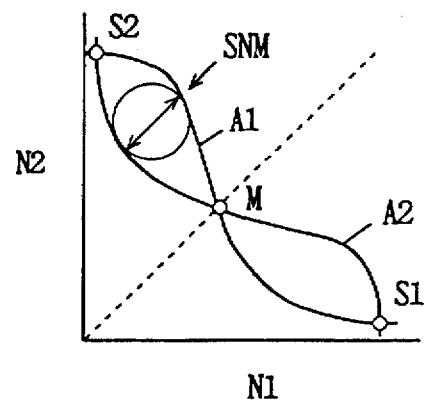
Figure 38A:
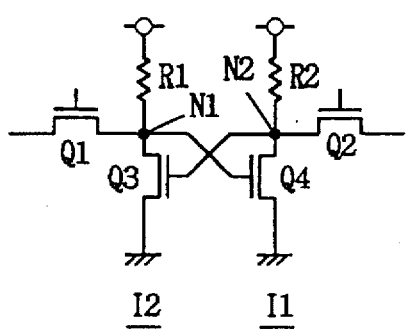
FIGS. 38A and 38B show transfer characteristics of an inverter latch in an off state of a memory cell access transistor.
Figure 38B:
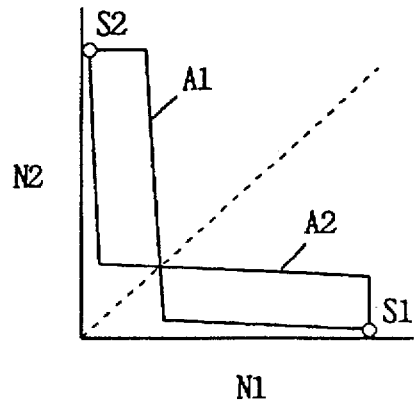
Figure 39A:
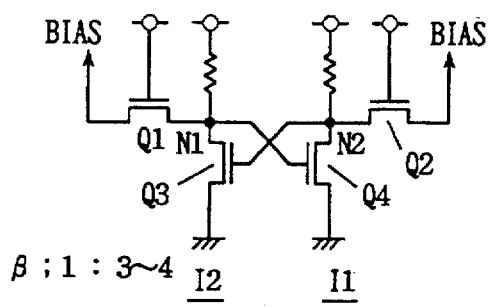
FIGS. 39A through 39D illustrate input/output transfer characteristics during accessing of a conventional memory cell and a disadvantage of the same.
Figure 39B:
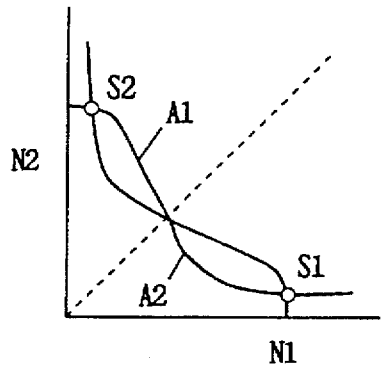
Figure 39C:
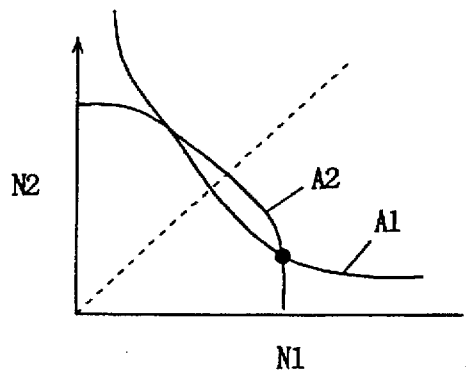
Figure 39D:
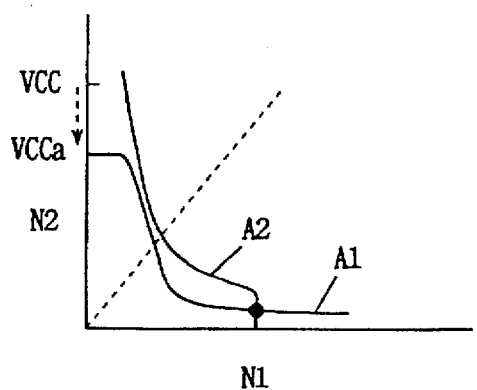

FIG. 2 shows a structure of memory cell (MC) shown in FIG. 1. In FIG. 2, memory cell (MC) includes an access transistor M1 formed of an n-channel MOS transistor, which is connected between bit line 6x and storage node N1 and is turned on in response to a signal potential on word line 5, an access transistor M2 formed of an n-channel MOS transistor, which is connected between bit line 6y and storage node N2 and is turned on in response to a signal potential on word line 5, an drive transistor M3 formed of an n-channel MOS transistor, which is connected between storage node N1 and the ground node, and has a gate connected to storage node N2, a drive transistor M4 formed of an n-channel MOS transistor, which is connected between storage node N2 and the ground node, and has a gate connected to storage node N1, a high resistance load element Z1 connected between power supply node VCC and storage node N1, and a high resistance load element Z2 connected between power supply node VCC and storage node N2. High resistance load elements Z1 and Z2 may be formed of polycrystalline silicon high resistances, or may be formed of TFTs (thin film transistors). Load elements Z1 and Z2 are formed at layers above those for drive transistors M3 and M4, respectively, and the memory cell has a hierarchical structure as shown in FIGS. 34 and 35 already described. This reduces an area occupied by the memory cell.

Each of access transistors M1 and M2 has a transfer coefficient βa (ratio of channel width W to channel length L), and each of drive transistors M3 and M4 has a transfer coefficient βd. These transfer coefficients βa and βd are substantially equal to each other. Thus, a cell ratio R (=βd/βa) is substantially equal to 1, and access transistors M1 and M2 as well as drive transistors M3 and M4 have substantially equal sizes. As compared with the conventional structure, therefore, the channel widths of drive transistors M3 and M4 are reduced nearly by a factor of ⅓ (if the channel length is equal to the conventional length), so that drive transistors M3 and M4 occupy a reduced area, and therefore, an area occupied by memory cell (MC) 1 can be reduced.

Figure 3:
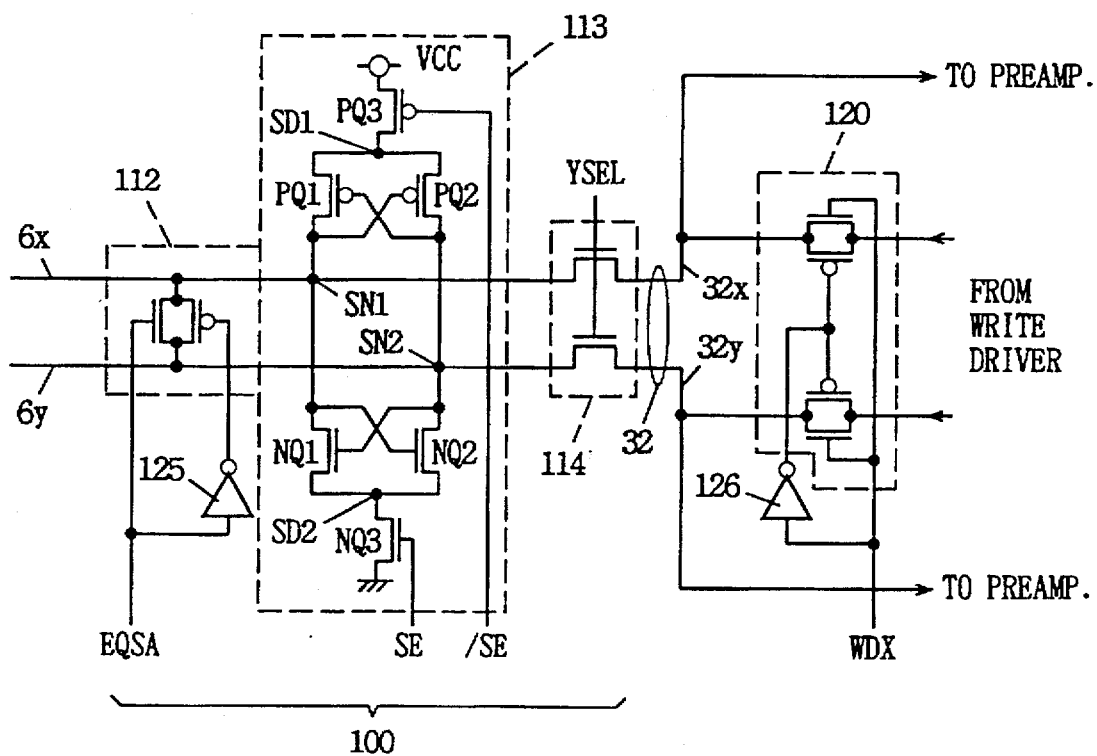
FIG. 3 shows a structure of a sense circuit shown in FIG. 1.

FIG. 3 shows an example of a structure of the sense circuit shown in FIG. 1. In FIG. 3, sense circuit 100 (generically represents 100a ... 100b) includes an equalize circuit 112 formed of a CMOS transmission gate, which is turned on when sense node equalize instructing signal EQSA is active, to electrically short-circuit corresponding bit lines 6x and 6y (sense nodes SN1 and SN2), a sense amplifier 113, which is activated in response to sense amplifier activating signals SE and /SE, to differentially amplify the potential difference on bit lines 6x and 6y (sense nodes SN1 and SN2), and a column select gate 114, which is turned on in response to column select signal YSEL sent from a column decoder (not shown), to connect bit lines 6x and 6y (sense nodes SN1 and SN2) to bus lines 32x and 32y of internal data bus 32, respectively.

Equalize circuit 112 includes an n-channel MOS transistor which is turned on when sense node equalize instructing signal EQSA is active (H-level), and also includes a p-channel MOS transistor which is turned on when sense node equalize instructing signal EQSA applied through an inverter 125 is active. By utilizing this CMOS transmission gate formed of the n- and p-channel MOS transistors in equalize circuit 112, the potentials on bit lines 6x and 6y (sense nodes SN1 and SN2) can be surely equalized without affect of a threshold voltage of the MOS transistor.

Sense amplifier 113 includes a P-sense amplifier portion, which drives a bit line at a higher potential between bit lines 6x and 6y (sense nodes SN1 and SN2) to power supply potential VCC level when activated, and also includes an N-sense amplifier portion, which drives a bit line (sense node) at a lower potential between bit lines 6x and 6y (sense nodes SN1 and SN2) to ground potential GND level when activated. The P-sense amplifier portion includes a p-channel MOS transistor PQ1 having conductive nodes, which are connected to node SD1 and sense node SN1, respectively, and a gate connected to sense node SN2, a p-channel MOS transistor PQ2 having conduction nodes connected to node SD1 and sense node SN2, respectively, and a gate connected to sense node SN1, and a p-channel MOS transistor PQ3 which is turned on in response to activation (L-level) of sense amplifier activating signal /SE to electrically connect node SD1 to power supply node VCC. P-channel MOS transistors PQ1 and PQ2 are cross-coupled to form a flip-flop.

The N-sense amplifier portion includes an n-channel MOS transistor NQ1 having conduction nodes connected to node SD2 and sense node SN1, respectively, and a gate connected to sense node SN2, an n-channel MOS transistor NQ2 having conduction nodes connected to node SD2 and sense node SN2, respectively, and a gate connected to sense node SN1, and an n-channel MOS transistor NQ3, which is turned on in response to activation (H-level) of sense amplifier activating signal SE, to electrically connect node SD2 to the ground node. N-channel MOS transistors NQ1 and NQ2 are cross-coupled to form a flip-flop.

Sense amplifier 113, which is substantially a cross-coupled CMOS inverter, has a steep transition portion in its transfer characteristics, and rapidly amplifies the potentials on sense nodes SN1 and SN2 for holding the amplified potentials. A current supply capability of sense amplifier 113 is larger than that of the drive transistor of the memory cell for rewriting/writing memory cell data.

Internal data bus 32 includes internal data bus lines 32x and 32y connected to a preamplifier (not shown). Internal data bus lines 32x and 32y are also coupled to the write driver or input buffer in the DQ buffer via a write data transfer gate 120. The write data transfer gate 120 includes a CMOS transmission gate which is turned on when a transfer instructing signal WDX is active.

Owing to provision of sense amplifier 113 at bit lines 6x and 6y as shown in FIG. 3, data latched by sense amplifier 113 can be rewritten into the corresponding memory cell, even if memory cell data is destroyed during reading of memory cell data, so that destroyed data can be restored, and therefore destruction of data is effectively prevented. Operations during data reading of the SRAM shown in FIGS. 1 to 3 will now be described below with reference to an operation waveform diagram of FIG. 4.

Figure 4:
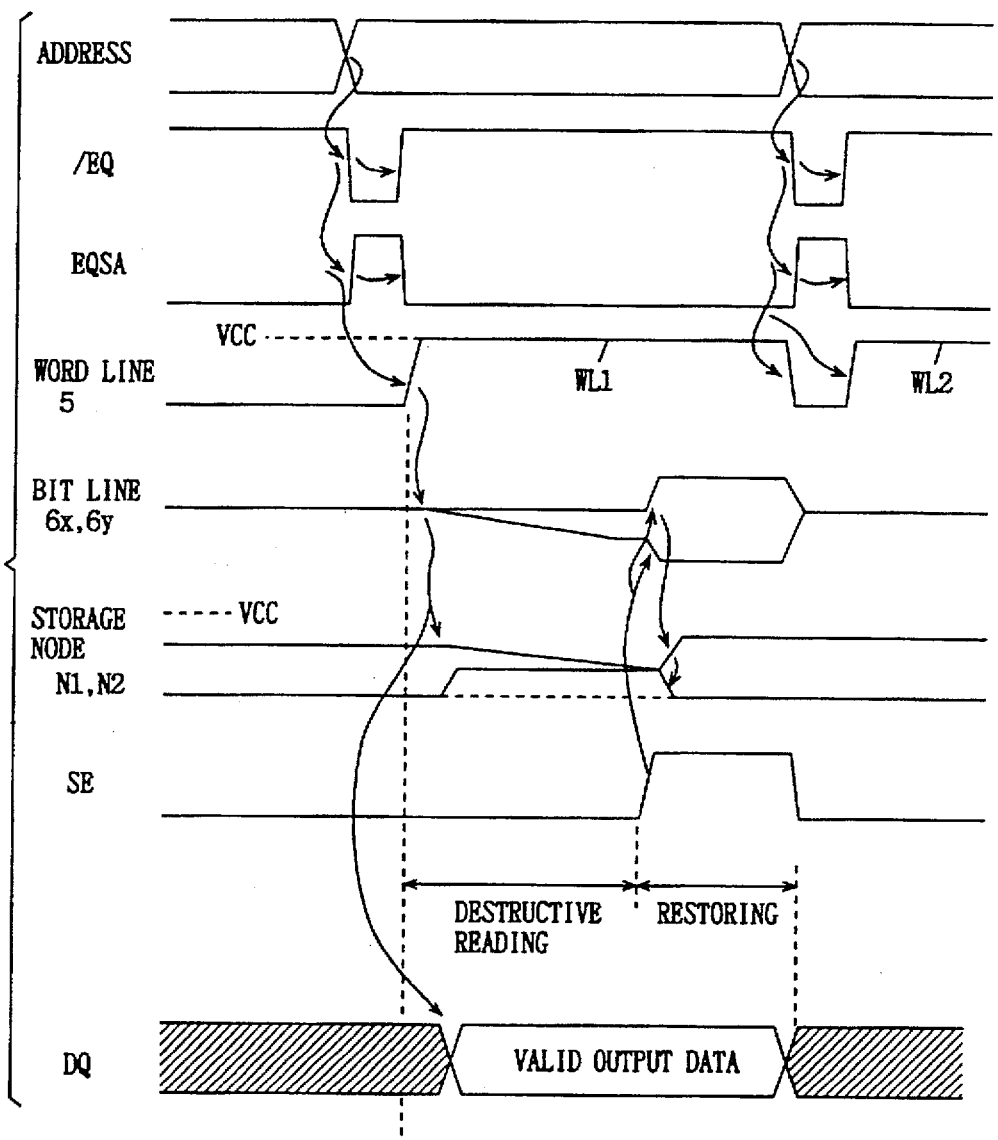
FIG. 4 is a waveform diagram representing an operation of the semiconductor memory device shown in FIG. 1.

Referring to FIG. 4, chip select signal /CS is active and at L-level. When the address signal changes, equalize instructing signal /EQ from control circuit 110 is set to the active state of L-level for a predetermined period, and equalize transistors 3a and 3b are turned on, so that the potentials on bit lines 6x and 6y are surely equalized to intermediate potential VBL precisely, VPL−VTH). In this operation, sense node equalize instructing signal EQSA is also set to the active state of H-level, and sense nodes SN1 and SN2 are equalized to the intermediate potential level. Upon completion of this equalization or in parallel thereto, row decoder 4 performs decoding, so that word line 5 (in FIG. 4, word line WL1 is shown) corresponding to the row designated by the address signal is driven to the selected state, and the potential on this selected word line WL1 rises to power supply voltage VCC level. Responsibly, access transistors M1 and M2 are turned on, so that storage nodes N1 and N2 are electrically connected to bit lines 6x and 6y, respectively, and a current flows into one of bit lines 6x and 6y via a load circuit.

Transfer coefficients βa of access transistors M1 and M2 are substantially equal to transfer coefficients βd of drive transistors M3 and M4. In accordance with turn-on of access transistors M1 and M2, a current flows into a storage node at L-level from the corresponding bit line, and a potential difference is caused between bit lines 6x and 6y. Since a large current flows from the bit line, the potential on the storage node storing L-level rises relatively rapidly. This raised potential substantially depends on a conductance ratio (ratio between β's) between the access and drive transistors. Meanwhile, as the potential on the storage node which stores information at L-level rises, the drive transistor is turned on, so that the potential on the storage node which stores information at H-level lowers because this potential at H-level is slowly discharged. As a result, storage nodes N1 and N2, are set to the monostable state due to the β ratio nearly equal to 1, so that the storage data are gradually destroyed, and finally the potentials on storage nodes N1 and N2 attain the same potential level.

Then, at a predetermined timing, which will be described later, sense amplifier activating signal SE is activated, and the sense amplifier operates to amplify rapidly the minute potential difference between bit lines 6x and 6y, so that bit lines 6x and 6y are driven to power supply voltage VCC level and ground voltage GND level in accordance with the potential appearing on bit lines 6x and 6y, respectively. In accordance with activation of the sense amplifier, the bit line potentials are fully swung, so that storage nodes N1 and N2 of the selected memory cell are driven to the state corresponding to original storage information. At this time, the one of storage nodes N1 and N2 storing H-level attains the voltage level lower than power supply voltage VCC. This is because that the transfer coefficients β of the access and drive transistors are substantially equal to each other, and the conductance ratio is nearly equal to one, so that the potential on the storage node storing this H-level is determined by the conductance ratio between the access and drive transistors.

Owing to activation of this sense amplifier activating signal SE, original storage data is rewritten into the memory cell, and the destroyed storage data is restored. Upon subsequent transition in the address signal, selected word line WL1 is driven to the nonselected state, and thereafter, equalize instructing signals /EQ and EQSA are set to the active state for a predetermined period, so that bit lines 6x and 6y are driven to a predetermined intermediate potential level. Storage nodes N1 and N2 of the selected memory cell are isolated from bit lines 6x and 6y, respectively, because access transistors M1 and M2 are turned off when the word line is deselected. Thereby, the data rewritten by this sense amplifier is stably held.

Then, another word line WL2 is selected in accordance with a new address, and the same operations are repeated.

As described above, data of the memory cells is read out destructively, and then the sense amplifier senses, amplifies and latches the bit line potentials, whereby original storage data can be restored for respective memory cells. When data is to be written, the sense nodes are connected to internal data bus 32 via the column select gate which is turned on in response to the column select signal from the column decoder. Write data is transferred from the write buffer or input buffer to internal data bus 32 via write data transfer gate 120 shown in FIG. 3. A current drive capability of the write driver and input buffer is sufficiently larger than the current supply capability (current drive capability) of this sense amplifier 113, and data latched by the sense amplifier is inverted (when write data is to be transferred after activation of the sense amplifier). In this case, therefore, write data can be surely transferred only to the memory cell which is selected for data writing. The write data may be transferred before activation of sense amplifier.

Before operation of the sense amplifier, bit lines 6x and 6y are electrically connected to the internal data bus in accordance with the column select signal, and data of the selected memory cell is transmitted to the preamplifier shown in FIG. 1. In this state, therefore, data is read rapidly before operation of the sense amplifier, as is done in the prior art. The output signal of preamplifier is supplied to DQ buffer 8 via read/write data bus 33, and read data Q is externally supplied via DQ buffer 8.

Owing to the above structures, all the data of memory cells in the row which is selected in the data read operation can be stored by sense amplifiers 113. In the data read operation, therefore, destruction of data held in the memory cell does not equivalently result in lost of information (because it is latched by the sense amplifier). Therefore, restriction that "cell ratio R must be 3 or more" is not required, and an area of the memory cell can be reduced. Additionally, even if the cell ratio R is equal to the conventional value, power supply voltage VCC is low. If the potential difference between storage nodes N1 and N2 is small and the storage information will be destroyed upon selection of the word line, the sense amplifier holds the storage data of this memory cell, so that the storage data will be held accurately. Therefore, the SRAM can operate stably even with a low power supply voltage. Both the conditions may be present in combination. More specifically, the cell ratio R may be nearly 1, and power supply voltage VCC may be sufficiently low at, for example, 2.2 V. Even in this case, the SRAM can operate stably without destruction of storage data of the memory cell.

A structure for activating the sense amplifier will now be described below.

In the SRAM, the internal circuit statically operates, and internally performs asynchronous operation in accordance with an applied address signal. Therefore, a signal such as row address strobe signal /RAS instructing start and end of a memory cycle is not present, in contrast to a DRAM. If the sense amplifier activating signal to be activated for a predetermined period is simply produced using an address transition detection signal ATD, it will be difficult to determine a timing for deactivating this sense amplifier (because, the sense amplifier may still maintain the active state even after the end of memory cycle). Structures for surely activating and deactivating the sense amplifier will be described below.

[Sense Amplifier Drive Circuit 1]

Figure 5:
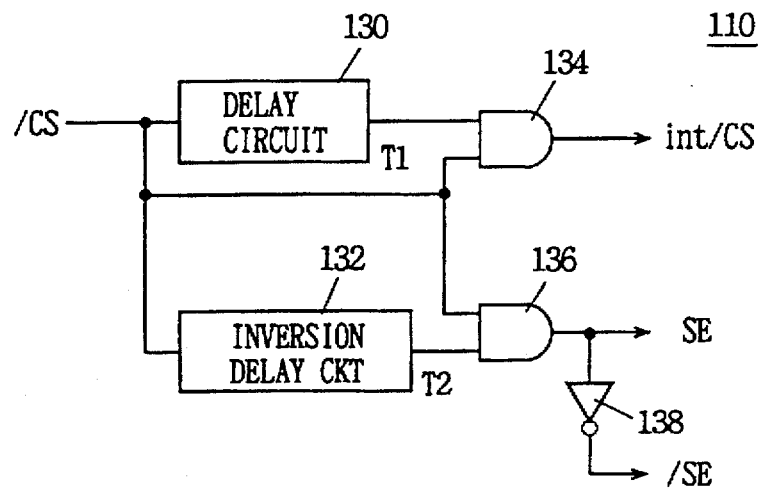
FIG. 5 shows a structure of a control circuit shown in FIG. 1.

FIG. 5 shows an example of a structure of a sense amplifier activating circuit in the SRAM according to the embodiment 1 of the invention. The sense amplifier activating circuit shown in FIG. 5 is included in control circuit 110 shown in FIG. 1. In FIG. 5, control circuit 110 includes a delay circuit 130 which delays externally applied chip select signal /CS by a predetermined time T1, an inverting and delaying circuit 132 which inverts external chip select signal /CS and delays the same by a predetermined time T2, an AND circuit 134 which receives chip select signal /CS and an output signal of delay circuit 130, an AND circuit 136 which receives chip select signal /CS and an output signal of inverting and delaying circuit 132, and an inverter circuit 138 which inverts an output signal of AND circuit 136. AND circuit 134 generates an internal chip select signal int/CS. AND circuit 136 generates a sense amplifier activating signal SE. Inverter circuit 138 generates sense amplifier activating signal /SE.

In the structure shown in FIG. 5, externally applied chip select signal /CS is utilized as a memory cycle selection instructing signal, i.e., memory cycle determining signal. Internal operations are executed only when internal chip select signal int/CS is active. Externally applied chip select signal /CS is utilized as a clock signal for determining the memory cycle, and is also utilized for activating the sense amplifier for a predetermined period after completion of the memory cell selection. Now, an operation of the control circuit shown in FIG. 5 will be described below with reference to an operation waveform diagram of FIG. 6.

When external chip select signal /CS is inactive at H-level, the output signal of delay circuit 130 is at H-level, and the output signal of inverting and delaying circuit 132 is at L-level. In this state, internal chip select signal int/CS is in the inactive state of H-level, and an internal operation of selecting a memory cell is not performed. Sense amplifier activating signal SE is in the inactive state of L-level, and the sense amplifier is inactive.

At time t1, external chip select signal /CS is set to the active state of L-level. Responsibly, internal chip select signal int/CS from AND circuit 134 is set to the active state of L-level, and the operation for memory cell selection starts. The row decoder performs decoding in accordance with activation of internal chip select signal int/CS, and the word line corresponding to the addressed row is driven to the selected state. Thereby, data of the selected memory cells are transmitted onto the corresponding bit lines.

At time t2, the output signal of delay circuit 130 attains L-level, and, at time t3, the output signal of inverting and delaying circuit 132 attains H-level. In this state, sense amplifier activating signal SE still maintains the inactive state of L-level.

When external chip select signal /CS rises to H-level, sense amplifier activating signal SE is set to the active state of H-level, because the output signal of inverting and delaying circuit 132 is at H-level, so that the sense amplifier is activated. The delay time T2 of inverting and delaying circuit 132 is longer than the delay time T1 of delay circuit 130. At time t5, internal chip select signal int/CS is set to the inactive state of H-level in response to rising of the output signal of delay circuit 130, so that the selected word line is deselected. Even in this case, sense amplifier activating signal SE still maintains active at H-level. Even the flip-flop of the memory cell having a low SNM (static noise margin) has its storage node potentials driven to potential levels corresponding to the original storage information by the sense amplifier, then selected word line is set to the nonselected state at L-level, and the load elements of the high resistance stably hold the rewritten storage information.

At time t6, the output signal of inverting and delaying circuit 132 lowers to L-level, and correspondingly, sense amplifier activating signal SE from AND circuit 136 is deactivated to attain L-level. Also, sense amplifier activating signal /SE is set to the inactive state of H-level.

As described above, the memory cycle is determined by using external chip select signal /CS as the memory cell selection instructing signal, whereby the time point of completion of the memory cell cycle can be easily detected, and the sense amplifier can be activated at a required timing for accurately rewriting original storage data into the selected memory cell.

FIG. 7A shows a structure of a portion generating equalize instructing signals /EQ and EQSA. This equalize instructing signal generating portion is included in control circuit 110 shown in FIG. 1. In FIG. 7A, the equalize instructing signal generating portion includes an NAND circuit 140 which receives internal chip select signal int/CS and sense amplifier activating signal /SE, and an inverter circuit 142 which inverts an output signal of NAND circuit 140. NAND circuit 140 generates equalize instructing signal /EQ, and inverter circuit 142 generates sense node equalize instructing signal EQSA. Now, an operation of equalize instructing signal generating portion shown in FIG. 7A will be described below with reference to an operation waveform diagram of FIG. 7B.

When external chip select signal /CS is set to the active state of L-level, internal chip select signal int/CS is set to the active state of L-level. In response to activation of internal chip select signal int/CS, equalize instructing signal EQ from NAND circuit 140 attains H-level, and equalizing of the bit line pairs stops. Also, sense node equalize instructing signal EQSA attains L-level, and equalizing of the sense nodes stops.

When external chip select signal /CS shifts to the inactive state of H-level, sense amplifier activating signal /SE is set to the active state of L-level for a predetermined period. Even if internal chip select signal int/CS rises to H-level during an active period of sense amplifier activating signal /SE, NAND circuit 140 maintains equalize instructing signal /EQ at the inactive state of H-level in accordance with the sense amplifier activating signal /SE at L-level. When sense amplifier activating signal /SE is set to the inactive state of H-level and thereby restoring (rewriting) of the memory cell is completed, equalize instructing signal /EQ from NAND circuit 140 is set to the active state of L-level, and sense amplifier node equalize instructing signal EQSA from inverter circuit 142 is set to H-level. Thereby, equalizing of the bit line pairs and equalizing of the sense nodes are executed.

When chip select signal /CS is utilized as a clock signal, equalize instructing signals /EQ and EQSA can be set to the inactive state for a period from start of internal memory cell selection operation to completion of rewriting of the memory cell data by the sense amplifier and deactivation of the sense amplifier.

FIG. 8A shows another structure of the equalize instructing signal generating portion. In FIG. 8A, the equalize instructing signal generating portion includes an ATD circuit 144 which is activated to detect transition in the address signal when internal chip select signal int/CS is activated, and an inverter circuit 146 which inverts an output signal of ATD circuit 144. ATD circuit 144 generates sense node equalize instructing signal EQSA, and inverter circuit 146 generates equalize instructing signal /EQ. Internal chip select signal int/CS is also applied to the address buffer. The address buffer is activated when internal chip select signal int/CS is activated, to produce the internal address signal in accordance with the externally applied address signal for applying the produced internal address signal to the row and column decoders and ATD circuit 144. Now, an operation of the equalize instructing signal generating portion shown in FIG. 8A will be described below with reference to an operation waveform diagram of FIG. 8B.

Even when the external address signal changes, the address buffer is inactive if internal chip select signal int/CS is at H-level, in which case the internal address signal maintains the level at the standby state. In this state, equalize instructing signal EQSA from ATD circuit 144 is at L-level, and equalize instructing signal /EQ is at H-level.

When internal chip select signal int/CS is set to the active state of L-level, the address buffer is activated to produce the internal address signal in accordance with an external address signal. In accordance with this internal address signal, ATD circuit 144 produces a one shot pulse signal having a predetermined time width, and equalize instructing signal /EQ is set to the active state of L-level for a predetermined time. Sense node equalize instructing signal EQSA is set to the active state of H-level. Thereafter, a word line is selected, and data of the memory cells connected to the selected word line are transmitted onto the corresponding bit line pairs.

Figure 6:
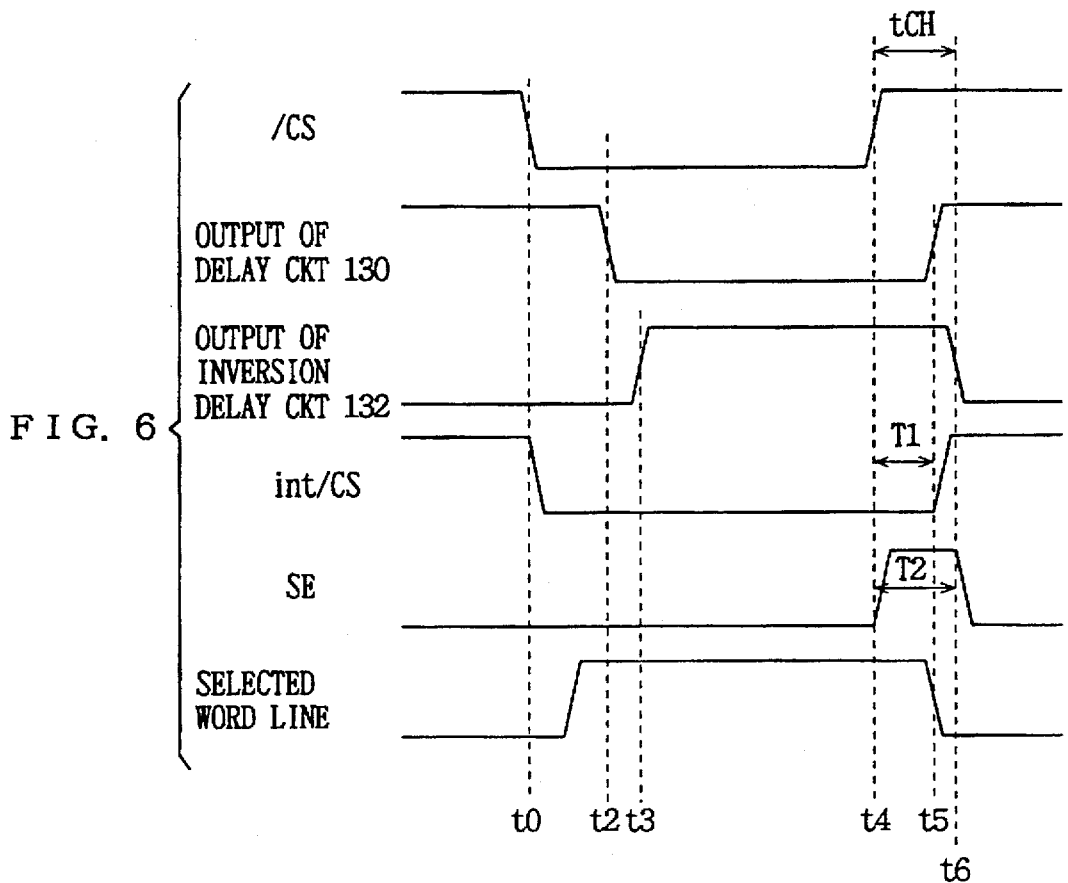
FIG. 6 is a signal waveform diagram representing an operation of the control circuit shown in FIG. 5.

As shown in FIG. 8A, ATD circuit 144 is used to produce the equalize instructing signal in the form of one-shot pulse. Even in this case, the bit line pair and sense nodes can be equalized to the predetermined intermediate potential. As shown in FIGS. 7B and 6, chip select signal /CS is used as a clock signal determining the memory cell cycle. In this case, external chip select signal /CS must hold H-level until the sense amplifier completes restoring (rewriting). An "H"-pulse period tCH of CS signal must be at least equal to a time difference between times t6 and t4 shown in FIG. 6, i.e., a period for which the sense amplifier is active.

Figure 9:
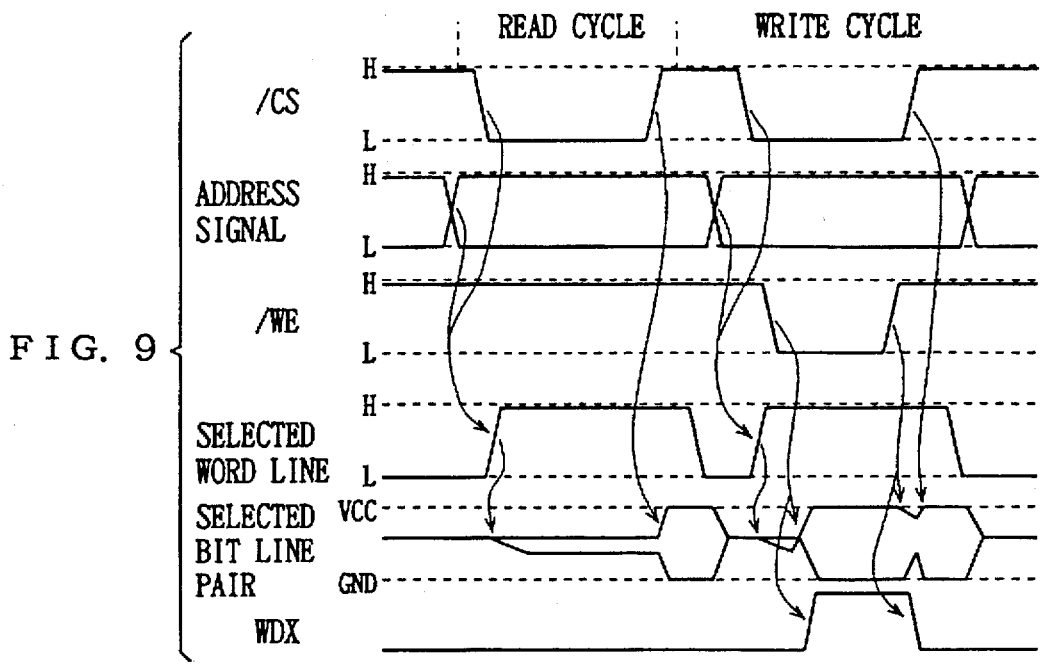
FIG. 9 is a waveform diagram representing data read/write operation of the semiconductor memory device according to the embodiment 1 of the invention.

FIG. 9 is a waveform diagram showing potential change of a selected word line and a selected bit line pair during data writing and reading of the SRAM of the embodiment 1 of the invention. Referring to FIG. 9, description will now be given on the data reading and writing of the SRAM according to the embodiment 1 of the invention.

When an address signal is externally applied, and subsequently external chip select signal /CS is set to the active state of L-level, the internal address signal becomes valid, and the potential on the selected word line rises to the power supply voltage VCC level, i.e., H-level in accordance with this internal row address signal. In accordance with rising of the potential on this selected word line, the access transistor of a selected memory cell is turned on, and the potentials on the corresponding bit line pair change in accordance with storage information of the selected memory cell. In the read cycle for data reading, write enable signal /WE is at H-level, and write data transfer instructing signal WDX is at L-level. In this state, the bit line pair (selected bit line pair) corresponding to the column designated by the column address signal is electrically connected to the internal data bus via the column select gate, and the preamplifier amplifies information on this internal data bus for reading out as the output data via the DQ buffer.

After this data reading, external chip select signal /CS is set to the inactive state of H-level, and completion of the read cycle is designated. In accordance with deactivation of externally applied chip select signal /CS, the sense amplifier is activated and differentially amplifies the potentials on each bit line pair. Thereby, storage information of the memory cell which was destructively read out is rewritten into the original memory cell, and the storage data is restored. At a given time when the sense amplifier is active, the selected word line is driven to the nonselected state, and the storage information of memory cell is completely held. Then, the sense amplifier is deactivated, and the read cycle is completed, so that the bit line pair is driven by the load element to the intermediate potential level.

Then, the address signal changes, and external chip select signal /CS is set to the active state of L-level again. The potential on a newly selected word line rises to H-level in accordance with the new address signal, and the potentials on each bit line pair change in accordance with storage information of the corresponding memory cell. In the write cycle for data writing, write enable signal /WE is set to the active state of L-level. In response to activation of write enable signal /WE, write data transfer instructing signal WDX is activated (and write driver is also activated). This write data is transmitted onto the bit line pair corresponding to the column selected by the column decoder. The write driver has a large driving capability, and the potentials on this selected bit line pair are fully swung to the power supply voltage VCC level and ground potential GND level, respectively in accordance with the write data.

When write enable signal /WE is set to the inactive state of H-level, write data transfer instructing signal WDX is deactivated, so that the write data is no longer transferred onto the bit line pair. In this state, the potentials on the selected bit line pair slowly change from the power supply voltage VCC level and ground potential GND level to the intermediate potential level (by virtue of the bit line load circuit), respectively. When the chip select signal /CS subsequently attains H-level, the sense amplifier is activated, and the potentials on each bit line pair are differentially amplified, so that the original storage information is restored and rewritten into each memory cell. When rewriting of this storage information is completed, the potential on the selected word line attains L-level, then the sense amplifier is deactivated, and the write cycle for data writing is completed.

Write data transfer instructing signal WDX is merely required to be generated in response to write enable signal /WE, and the circuit for generating the same can be formed of an inverter circuit.

[Modification 1]

Figure 10A:
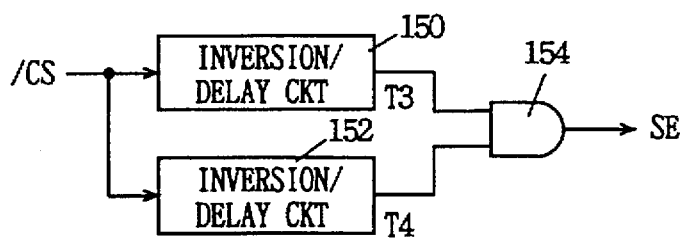
FIG. 10A shows a structure of a second modification of the control circuit shown in FIG. 1.
Figure 10B:
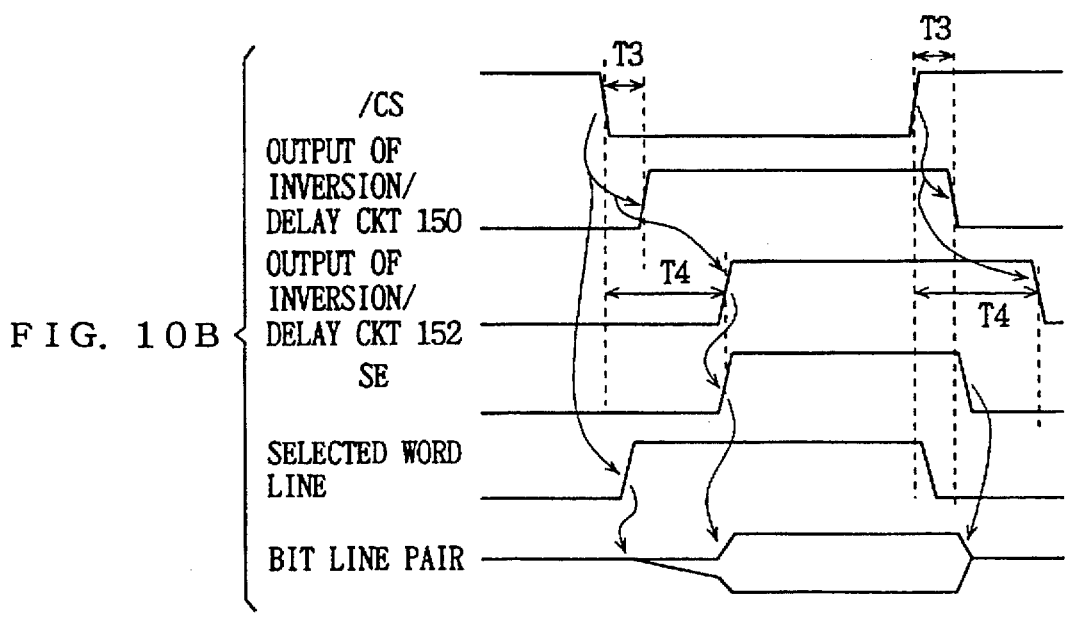
FIG. 10B shows operation waveforms representing an operation of the structure of FIG. 10A.

FIG. 10A schematically shows a structure of a modification 1 of the embodiment 1 of the invention. FIG. 10A shows a structure of a portion generating sense amplifier activating signal SE. In FIG. 10A, the sense amplifier activating signal generating portion includes an inverting and delaying circuit 150 for inverting externally applied chip select signal /CS and delaying the same by a predetermined time T3, an inverting and delaying circuit 152 for inverting externally applied chip select signal /CS and delaying the same by a predetermined time T4, and an AND circuit 154 for receiving output signals of inverting and delaying circuits 150 and 152. AND circuit 154 generates sense amplifier activating signal SE. Delay time T3 of inverting and delaying circuit 150 is shorter than delay time T4 of inverting and delaying circuit T4. Delay time T3 of inverting and delaying circuit 150 is longer than a time required from deactivation of chip select signal /CS to deselection of the word line. Now, an operation of the sense amplifier activating signal generating portion shown in FIG. 10A will be described below with reference to an operation waveform diagram of FIG. 10B.

When chip select signal /CS is at H-level, both output signals of inverting and delaying circuits 150 and 152 are at L-level, and sense amplifier activating signal SE is at L-level.

When chip select signal /CS is set to the active set of L-level, the memory cell selection operation internally starts, and the potential on the selected word line rises to H-level. Subsequently, the potentials on the bit line pair change in accordance with storage information of the memory cell. When time T3 elapses after lowering of chip select signal /CS, the output signal of inverting and delaying circuit 150 rises to H-level. When time T4 elapses after lowering of chip select signal /CS, the output signal of inverting and delaying circuit 152 rises to H-level. Thereby, sense amplifier activating signal SE from AND circuit 154 is set to the active state of H-level, and the sensing operation is performed, and the potentials on bit line pair are differentially amplified and latched. Thereby, storage information of the memory cell is rewritten.

When externally applied chip select signal /CS rises to H-level, the memory cycle is completed, and the potential on the select word line attains L-level. When time T3 elapses after rising of chip select signal /CS, the output signal of inverting and delaying circuit 150 falls to L-level, and sense amplifier activating signal SE attains L-level, so that the sense amplifier is deactivated. Then the potentials on the bit line pairs are driven to the intermediate potential level by the bit line load circuit.

Delay time T4 is merely required to have a time width equal to a period from falling of chip select signal /CS to L-level and selection of the word line to appearing of a potential difference on the bit line pair. Chip select signal /CS is used as a clock signal indicative of start and end of the memory cycle. Therefore, by activating sense amplifier activating signal SE within the memory cycle in accordance with chip select signal /CS, the sense amplifier can be made active for a sufficiently long time in the memory cycle period, so that rewriting of the memory cell data can be executed with a sufficient time margin. The output signal of inverting and delaying circuit 152 determines only the timing of start of activation of the sense amplifier, and does not affect the length of the memory cycle. Therefore, it is not necessary to provide a time period for activating the sense amplifier by internally delaying chip select signal /CS, so that the memory cycle can be made short.

Figure 11:
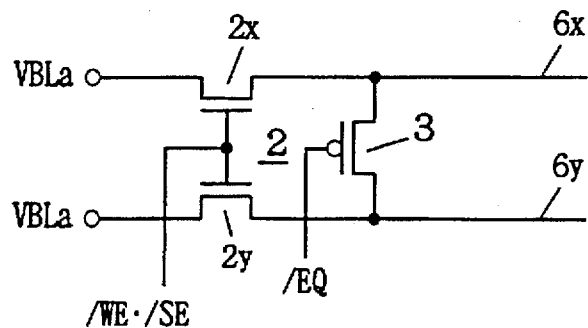
FIG. 11 shows a structure of a modification of a bit line load circuit shown in FIG. 1.

FIG. 11 shows a structure of a bit line load circuit used in this modification 1. FIG. 11 shows only a structure for one bit line pair. In FIG. 11, bit line load circuit 2 includes n-channel MOS transistors 2x and 2y, which are selectively turned on in response to a logical product signal /WE./SE of write enable signal /WE and sense amplifier activating signal /SE, to transmit intermediate potential VBLa to bit lines 6x and 6y, respectively. Equalize transistor 3 operates similarly in the previous embodiment, and is turned on for electrically short-circuiting bit lines 6x and 6y in response to activation of equalize instructing signal /EQ.

In the structure shown in FIG. 11, bit line load circuit 2 is deactivated when the sense amplifier is activated (signal /SE is at L-level) or data writing is performed (signal /WE is at L-level), so that it stops transmission of intermediate potential VBLa to bit lines 6x and 6y. During operation of the sense amplifier, it is possible to prevent flow of a current from bit lines 6x and 6y to the ground node via an N-sense amplifier portion included in the sense amplifier, and therefore a current consumption can be reduced. In the data write operation, supply of intermediate potential VBLa to bit lines 6x and 6y stops, whereby the potentials on bit lines 6x and 6y can be rapidly changed in accordance with write data.

In the structure of the bit line load circuit shown in FIG. 11, n-channel MOS transistors 2x and 2y do not cause voltage drop of threshold voltage VTH. Therefore, intermediate potential VBLa is lower than intermediate potential VBL by this threshold voltage.

According to the embodiment 1 of the invention, as described above, the sense amplifier is provided for each bit line pair for differentially amplifying and latching the potentials on the corresponding bit line pair. Therefore, even if storage information of the memory cell is destructively read out, this storage information is restored by the sense amplifier, so that destruction of the storage information of the memory cell can be prevented. Thereby, the conductance ratios (current supply capabilities) of the access transistor and drive transistor of the memory cell can be nearly equal to each other, and therefore the size (a ratio of channel width to channel length or a channel width) of the drive transistor can be equal to that of the access transistor, so that an area occupied by the memory cell can be reduced. Even if the power supply voltage is low, storage information of the memory cell can be surely restored and held, so that the SRAM can operate stably even with a low power supply voltage.

In order to control activation/deactivation of the sense amplifier, the chip select signal is used as the memory selection instructing signal (determining the memory cycle), so that the sense amplifier can be activated stably at an intended timing, and storage information can be surely rewritten.

[Embodiment 2]

Figure 12:
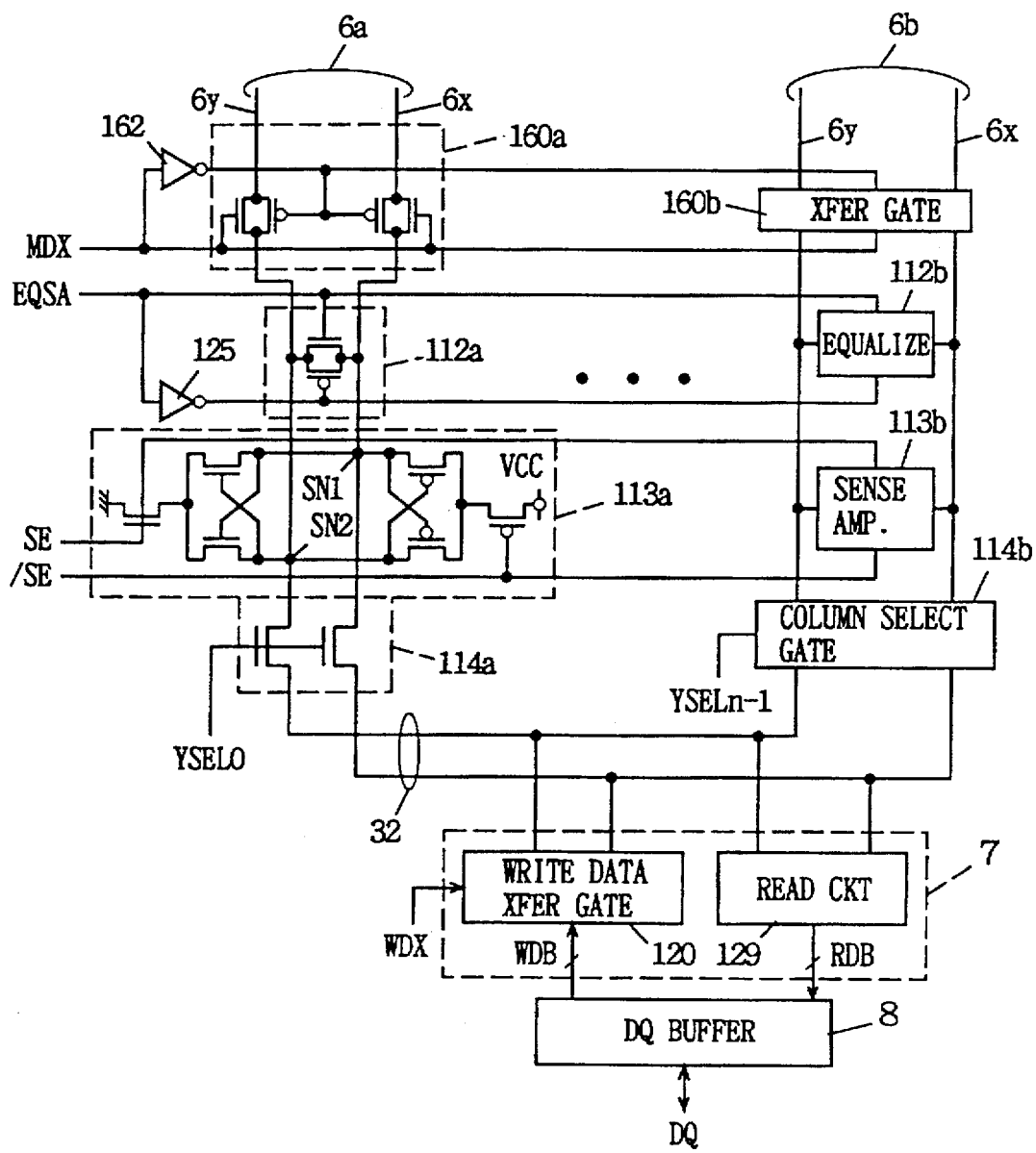
FIG. 12 schematically shows a structure of a main portion of a semiconductor memory device according to an embodiment 2 of the invention.

FIG. 12 shows a structure of a main portion of an SRAM according to an embodiment 2 of the invention. Corresponding to respective bit line pairs 6a . . . 6b, there are provided equalize circuits 112a . . . 112b, which equalize sense nodes SN1 and SN2 in response to sense node equalize instructing signal EQSA, sense amplifiers 113a . . . 113b, which are activated in response to sense amplifier activating signals SE and /SE to differentially amplify the potentials on sense nodes SN1 and SN2, and column select gates 114a . . . 114b, which are turned on in response to column select signals YSEL0 . . . YSELn−1 from a column decoder (not shown), to electrically connect the corresponding sense nodes SN1 and SN2 to internal data bus 32. Other structures are the same as those of the embodiment 1.

In this embodiment 2 of the invention, transfer gates 160a . . . 160b are provided for bit line pairs 6a . . . 6b for electrically connecting bit line pairs 6a . . . 6b to sense nodes SN1 and SN2 of the corresponding sense amplifiers 113a . . . 113b, respectively. Each of these transfer gates 160a . . . 160b includes CMOS transmission gates, which are provided for each of bit lines 6x and 6y of corresponding bit line pair 6a . . . 6b. The CMOS transmission gates included in the transfer gates 160a . . . 160b are turned on and off by transfer instructing signal MDX and an output signal of an inverter circuit 162 receiving transfer instructing signal MDX. When transfer instructing signal MDX is at H-level, transfer gates 160a . . . 160b are turned on, and bit line pairs 6a . . . 6b are electrically connected to the corresponding sense amplifiers 113a . . . 113b.

Figure 13:
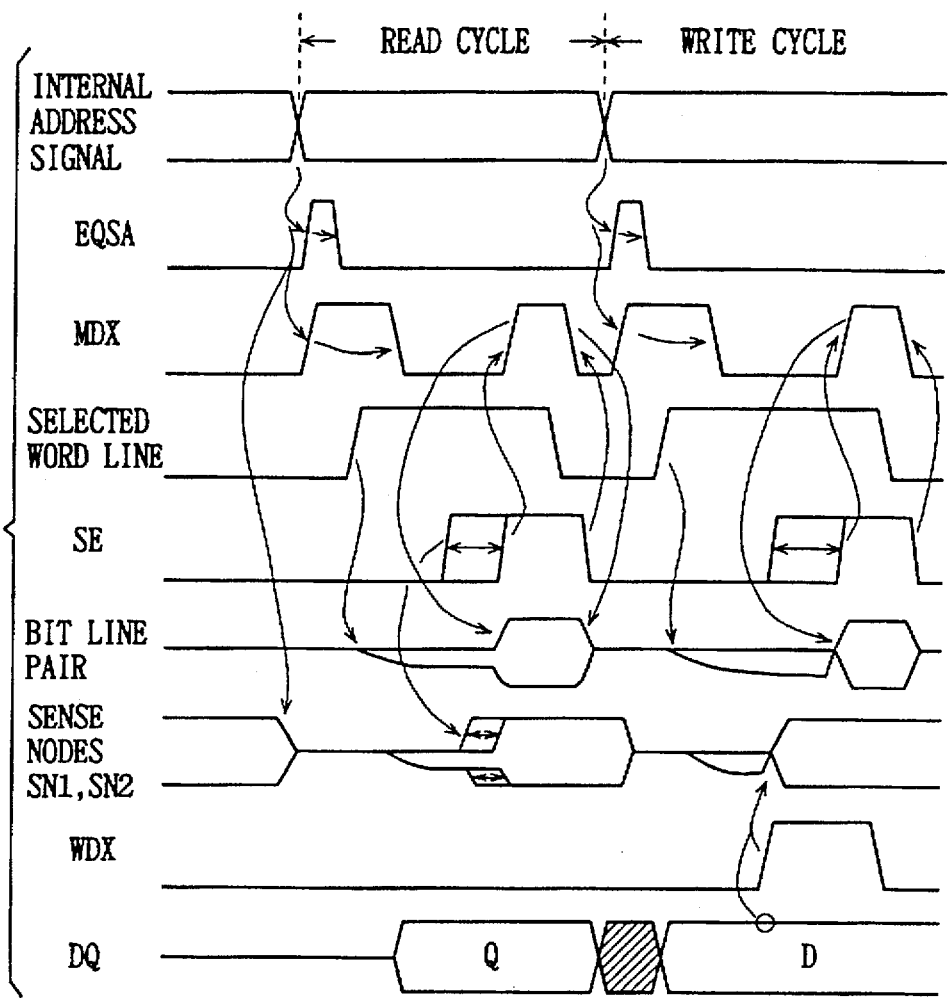
FIG. 13 is a signal waveform diagram representing an operation of the semiconductor memory device according to the embodiment 2 of the invention.

For internal data bus 32, there is provided preamplifier and write driver block 7. Preamplifier and write driver block 7 includes write data transfer circuit 120 which is turned on in response to write data transfer instructing signal WDX, and read circuit 129 which amplifies and read out data on internal data bus 32. Preamplifier and write driver block 7 is coupled to DQ buffer 8 via write bus WDB and read bus RDB. An operation of the SRAM shown in FIG. 12 will be described below with reference to an operation waveform diagram of FIG. 13.

When the internal address signal changes, sense node equalize instructing signal EQSA is set to the active state of H-level for a predetermined period in accordance with an address transition detection signal, and sense nodes SN1 and SN2 are equalized in potential. In the state prior to this, sense nodes SN1 and SN2 are held at the potential levels of the memory cell data which is read in the last cycle (even if sense amplifiers 113a . . . 113b are inactive, sense nodes SN1 and SN2 are electrically floated). Further, transfer instructing signal MDX is set to the active state of H-level for a predetermined period in accordance with transition of the internal address signal. This transfer instructing signal MDX is active (H-level) for a period, during which the potential on a selected word line rises to H-level, and the potentials on bit line pair change in accordance with storage data of the memory cell, so that the sense nodes SN1 and SN2 change in accordance with the potentials on these bit lines.

When the transfer instructing signal MDX is set to H-level, transfer gates 160a . . . 160b are turned on, and bit line pairs 6a . . . 6b are electrically connected to sense nodes SN1 and SN2 of the corresponding sense amplifiers 113a . . . 113b. Thereby, the potential difference appearing on the bit line pair is transmitted to sense nodes SN1 and SN2. At this time, column selection instructing signal YSEL (one of YESL0 . . . YSELn−1) from the column decoder (not shown) is set to the selected state, and the potentials on the bit line pair corresponding to the selected column are read by read circuit 129 and are applied externally as read data Q via DQ buffer 8.

When transfer instructing signal MDX is set to the inactive state of L-level, bit line pairs 6a . . . 6b are electrically isolated from sense amplifiers 113a ... 113b. In this state where bit line pairs 6a ... 6b are electrically isolated from sense amplifiers 113a ... 113b, the sense amplifier is activated. Since sense amplifiers 113a ... 113b are electrically isolated from corresponding bit line pairs 6a ... 6b, loads on sense nodes SN1 and SN2 are sufficiently small except for the sense amplifier (driving the internal data bus) corresponding to the selected bit line pair, so that the sense operation is performed rapidly. Since transfer gates 160a ... 160b are turned off, it is possible to suppress a current flowing from the bit line load circuit to the sense amplifier during activation of sense amplifiers 113a ... 113b, if the bit line load circuit is always on as in the embodiment 1. Thereby, a current consumption can be reduced.

Then, transfer instructing signal MDX is set to the active state of H-level again at a predetermined timing, and sense amplifiers 113a ... 113b are electrically connected to bit line pairs 6a ... 6b, so that the potentials on bit line pair are set to the potential levels corresponding to the potentials on sense nodes SN1 and SN2 of sense amplifiers 113a ... 113b. Thereby, rewriting of storage information of the memory cell is performed. When a predetermined time elapses, transfer instructing signal MDX is set to the inactive state of L-level again, and sense amplifier activating signal SE is set to the inactive state of L-level. Before deactivation of sense amplifier activating signal SE, the potential on the selected word line is driven to L-level, and the memory cell can surely hold data transmitted by the sense amplifier. When sense amplifier activating signal SE is deactivated, and sense amplifiers 113a ... 113b are deactivated, sense nodes SN1 and SN2 are electrically floated (transfer gates 160a ... 160b are off).

The bit line pair is restored to a predetermined intermediate potential by the bit line load circuit and the equalize transistor. At this time, bit line pairs 6a ... 6b are electrically isolated from sense amplifiers 113a ... 113b. Thus the bit line load circuit and equalize transistor are merely required to drive the corresponding bit line pairs 6a ... 6b, and bit line pairs 6a ... 6b can be restored rapidly to the predetermined intermediate potential level VBL (or VBLa).

In the write cycle for data writing, sense node equalize instructing signal EQSA is set to H-level for a predetermined period in response to change in the internal address signal, so that sense nodes SN1 and SN2 are equalized. In parallel to this equalization, transfer instructing signal MDX is set to H-level, and bit line pairs 6a ... 6b are connected to sense amplifiers 113a ... 113b, respectively. The potential on the selected word line rises, and the potentials on the bit line pair change in accordance with storage information of the memory cell connected to this selected word line. Also, the potentials on sense nodes SN1 and SN2 change in accordance with the potentials on this bit line pair.

In the data writing operation, write data transfer instructing signal WDX is set to H-level, and the potentials on sense nodes SN1 and SN2 change in accordance with the write data. In this data write operation, if transfer instructing signal MDX has been lowered to L-level, the write data from write data transfer circuit 120 is merely required to change the potential levels on sense nodes SN1 and SN2 of the sense amplifier, and a write driver having a large current driving capability is not required. If the write data is to be transferred while the sense amplifier is active, the write driver will be required to invert the latched state of the sense amplifier, so that a large current drive capability will be required. If latching capability of the sense amplifier is not so large, such operation sequence may be used. In the data write operation, only the latched information of the sense amplifier corresponding to the bit line pair receiving the write data changes in accordance with the write data, and the potentials on sense nodes SN1 and SN2 of each sense amplifier provided corresponding to the nonselected bit line hold the potential levels corresponding to the storage information of the corresponding memory cell.

At a predetermined timing, sense amplifiers 113a ... 113b are activated, and transfer instructing signal MDX is set to the active state of H-level, whereby rewriting of storage information by sense amplifiers 113a ... 113b is performed, and rewriting of the destructively read storage information and writing of write data are performed. Then, the potential on the selected word line falls to the L-level, sense amplifier activating signal SE is set to L-level, and transfer instructing signal MDX is set to L-level.

Figure 14:
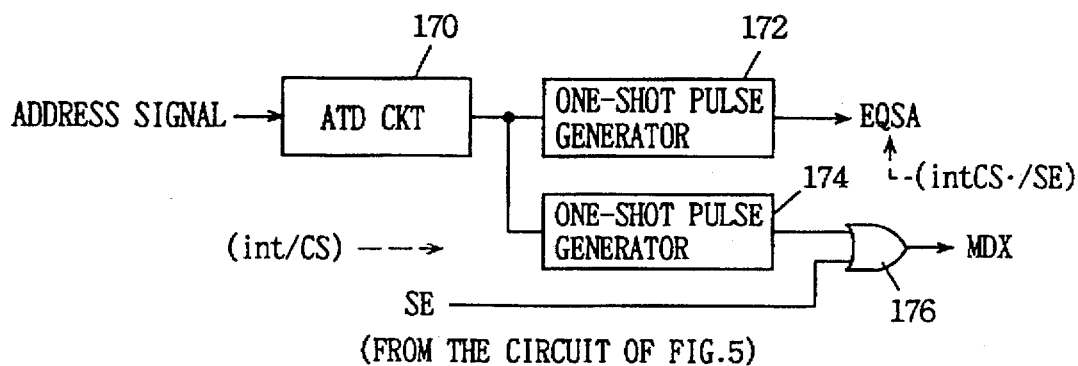
FIG. 14 shows a structure of an internal instruction signal generating portion in the embodiment 2 of the invention.

FIG. 14 shows a structure of the transfer instructing signal generating portion. In FIG. 14, the transfer instructing signal generating portion includes an ATD circuit 170 which detects transition of the address signal, a one-shot pulse generating circuit 172 which generates a one shot pulse signal having a predetermined time width in response to rising of the address transition detection signal sent from ATD circuit 170, a one-shot pulse generating circuit 174 which generates a one shot pulse signal having a predetermined time width in response to falling of the address transition detection signal from ATD circuit 170, and an OR circuit 176 which receives an output signal of one-shot pulse generating circuit 174 and sense amplifier activating signal SE. The sense amplifier activating signal SE is applied from the circuit shown in FIG. 5. One-shot pulse generating circuit 172 generates sense node equalize instructing signal EQSA, and OR circuit 176 generates transfer instructing signal MDX. Equalizing of the sense nodes and connection of the bit line pair to the sense nodes for a predetermined time can be performed easily, when the internal address signal changes, and a memory cell is designated.

In the structure shown in FIG. 14, equalize instructing signal /EQ for activating the equalize transistor provided for the bit line pair is produced by inverting sense node equalize instructing signal EQSA from one-shot pulse generating circuit 172. As shown within parentheses in FIG. 14, the transfer instructing signal of one shot may be generated at rising of internal chip select signal int/CS. In this case, equalize instructing signal EQSA is a logical product of internal chip select signal int/CS and sense amplifier activating signal /SE.

Figure 15A:
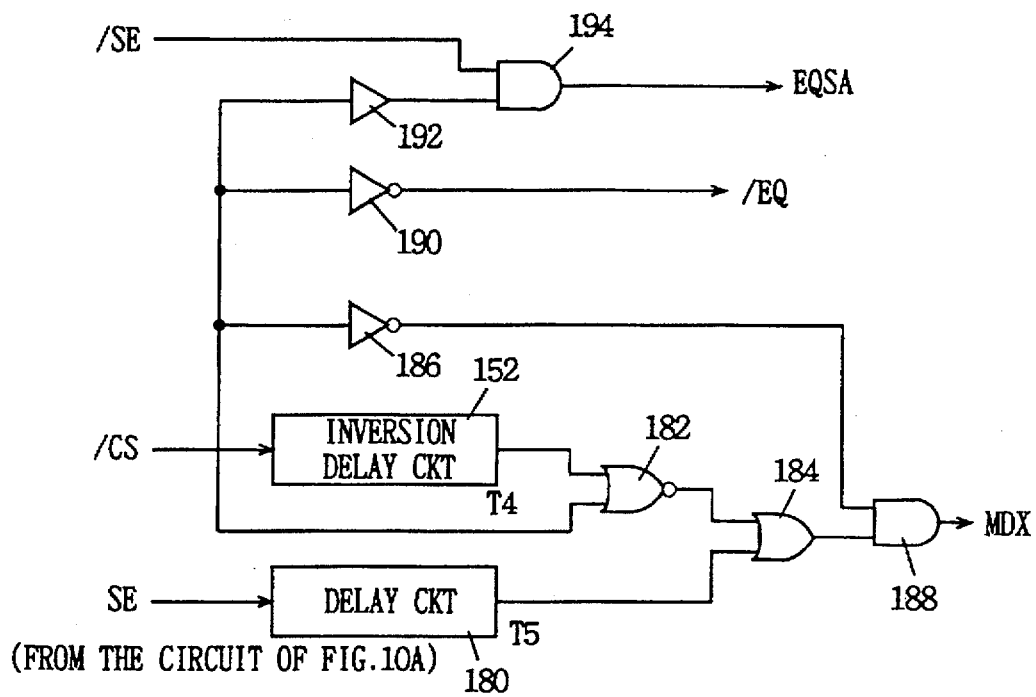
FIG. 15A shows a structure of a modification of an internal control signal generating portion in the embodiment 2 of the invention.

FIG. 15A shows another structure of the transfer instructing signal generating portion. In FIG. 15A, the transfer instructing signal generating portion includes an inverting and delaying circuit 152 which delays chip select signal /CS by a predetermined time T4 and inverts the same, a delay circuit 180 which delays sense amplifier activating signal SE by a predetermined time T5, an NOR circuit 182 which receives an output signal of inverting and delaying circuit 152 and chip select signal /CS, an OR circuit 184 which receives an output signal of NOR circuit 182 and an output signal of delay circuit 180, an inverter circuit 186 which inverts chip select signal /CS, and an AND circuit 188 which receives an output signal of inverter circuit 186 and an output signal of OR circuit 184. AND circuit 188 generates transfer instructing signal MDX.

Equalize instructing signal generating portion includes an inverter circuit 190 inverting chip select signal /CS, a buffer circuit 192 buffering chip select signal /CS, and an AND circuit 194 receiving an output signal of buffer circuit 192 and sense amplifier activating signal /SE. Inverter circuit 190 generates equalize instructing signal /EQ. AND circuit 194 generates sense node equalize instructing signal EQSA.

Figure 15B:
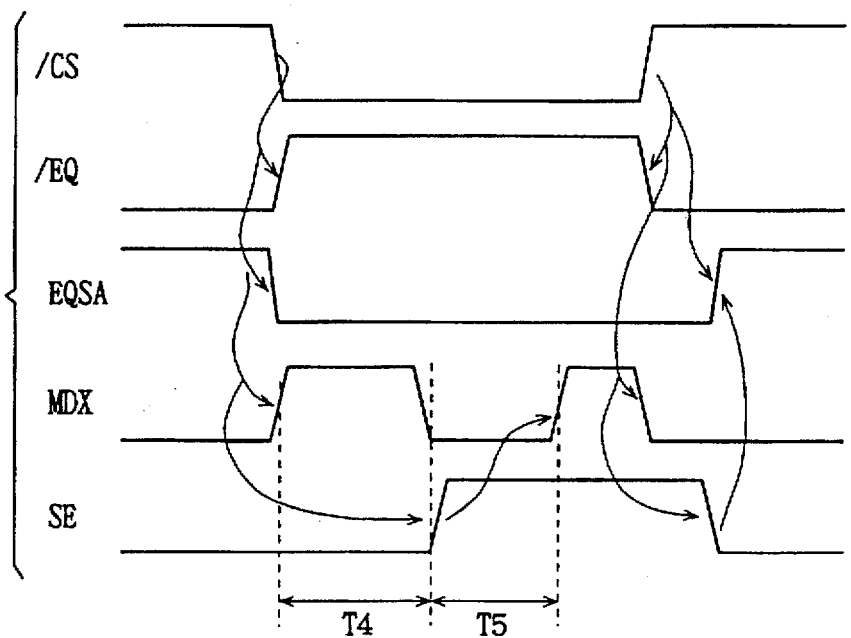
FIG. 15B shows signal waveforms representing an operation of the structure of FIG. 15A.

Sense amplifier activating signals SE and /SE are applied from the circuit structure shown in FIG. 10A. An operation of the circuit structure shown in FIG. 15A will be described below with reference to an operation waveform diagram of FIG. 15B.

When chip select signal /CS is at H-level, equalize instructing signal /EQ from inverter 190 is at L-level, and sense node equalize instructing signal EQSA from AND circuit 194 is at H-level (sense amplifier activating signal /SE is at H-level).

When chip select signal /CS falls to L-level, equalize instructing signal /EQ rises to H-level, and sense node equalize instructing signal EQSA falls to L-level. At this time, the output signal of inverting and delaying circuit 152 is still at L-level, and output signals of NOR circuit 182 and OR circuit 184 attain H-level. The output signal of inverter circuit 186 is at H-level, and therefore transfer instructing signal MDX from AND circuit 188 attains H-level. When time T4 elapses after falling of chip select signal /CS, the output signal of inverting and delaying circuit 152 attains H-level, and the output signal of NOR circuit 182 attains L-level. The output signal of delay circuit 180 is still at L-level, and therefore transfer instructing signal MDX from AND circuit 188 attains L-level.

In accordance with rising of the output signal of inverting and delaying circuit 152 to H-level, sense amplifier activating signal SE is set to the active state of H-level (inverting and delaying circuit 152 is the same as that in FIG. 10A).

When time T5 elapses after rising of sense amplifier activating signal SE, the output signal of delay circuit 180 attains H-level, the output signal of OR circuit 184 attains H-level again, and transfer instructing signal MDX from AND circuit 188 attains H-level. In response to rising of transfer instructing signal MDX, storage information of the memory cell is rewritten again.

When external chip select signal /CS rises to H-level, equalize instructing signal /EQ attains L-level, and the bit lines are equalized. In response to rising of chip select signal /CS, the output signal of inverter circuit 186 attains L-level, and transfer instructing signal MDX from AND circuit 188 attains L-level. Thereby, the bit line pair is isolated from the sense amplifier. When a predetermined time elapses after rising of chip select signal /CS, sense amplifier activating signal SE attains H-level (refer to the waveform diagram of FIG. 10B). When the sense amplifier activating signal SE falls, sense amplifier activating signal /SE attains H-level, and sense node equalize instructing signal EQSA from AND circuit 194 attains H-level, so that the sense nodes are equalized in potential. In accordance with deactivation of the sense amplifier, the sense nodes can be equalized in potential.

In the structure utilizing the circuit structure shown in FIGS. 15A and 10A, the sense amplifier activating signal is activated at a relatively early timing. In the data read operation, therefore, the internal data bus can be driven by the sense amplifier to the potential levels having a sufficiently large potential difference. In this case, read circuit 129 (refer to FIG. 12) may be formed of a conventional inverter circuit instead of a conventional differential amplifier circuit of a current mirror type. The write driver must have a relatively large current supply capability, because it must invert the latched information of the sense amplifier. In this case, such a structure may be employed that a write driver is not provided, and an input buffer provided in DQ buffer 8 (refer to FIG. 12) has a relatively large driving capability for driving the internal data bus.

As described above, according to the embodiment 2 of the invention, since the transfer gates to be selectively turned on are arranged between the respective bit line pairs and the corresponding sense amplifiers, the sense nodes can be isolated from the corresponding bit line pairs when the sense amplifiers perform the sensing operation. The loads on the sense nodes are reduced, and the sense amplifier can rapidly perform amplification. By provision of the transfer gates, it is not necessary to drive directly the bit line pair in accordance with the write data in the data write operation, so that the drive capability of the write circuit can be reduced. This is because that writing of write data into the memory cell is performed after activation of the sense amplifier.

[Embodiment 3]

FIGS. 16A–16E illustrates the signal changes in reading and writing of data of a memory cell according to an embodiment 3 of the invention. In the embodiment 3 of the invention, data is nondestructively read in the data read operation. In the data write operation, data is once destructively read and then writing is executed. Now, writing and reading of data in this embodiment 3 of the invention will be described below.

Figure 16A:
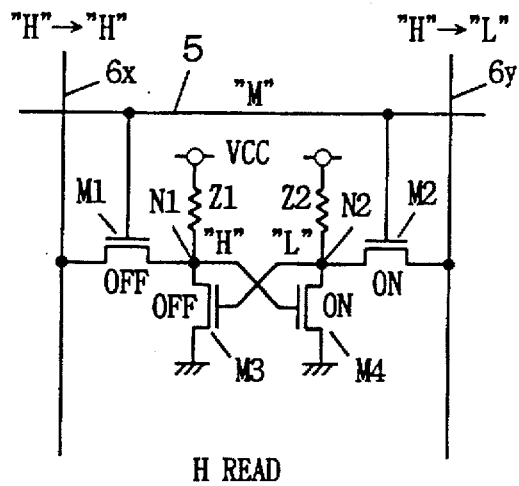
FIGS. 16A to 16D show voltage levels applied on respective nodes on a memory cell during memory cell accessing in a semiconductor memory device according to an embodiment 3 of the invention.

FIG. 16A illustrates an operation of reading storage information from storage nodes N1 and N2, which have stored information at H-level ("H") and L-level ("L"), respectively. The potential on the selected word line is set to such a state that the potential at L-level stored in storage node N2 is lower than threshold voltage VTH of drive transistors M3 and M4. The intermediate voltage "M" transmitted onto the selected word line is nearly equal to 2·VTH. Bit lines 6x and 6y have been precharged to H-level (VBL−VTH level). When intermediate voltage "M" is applied to word line 5, access transistor M1 maintains off-state, because its gate potential is lower than its source and drain potentials. Meanwhile, access transistor M2 is turned on because the potential difference between its gate and source moves to a value nearly equal to threshold voltage VTH level, and a current flows from bit line 6y to storage node N2. When a potential on storage node N2 rises and a gate to source potential difference of access transistor M2 attains threshold voltage VTH, access transistor M2 is turned off. The potential level on storage node N1 lowers extremely slowly in accordance with MOS transistor M3 (having a gate potential of VTH or less) which is extremely weakly turned on in accordance with rising of the potential on storage node N2. By detecting the bit line pair potential difference caused by the current flowing through bit line 6y, data reading is performed. When word line 5 is deselected to have its potential level fallen to ground potential GND level, both access transistors M1 and M2 are turned off. In this state, drive transistor M4 discharges storage node N2 to the ground potential level again.

Figure 16B:
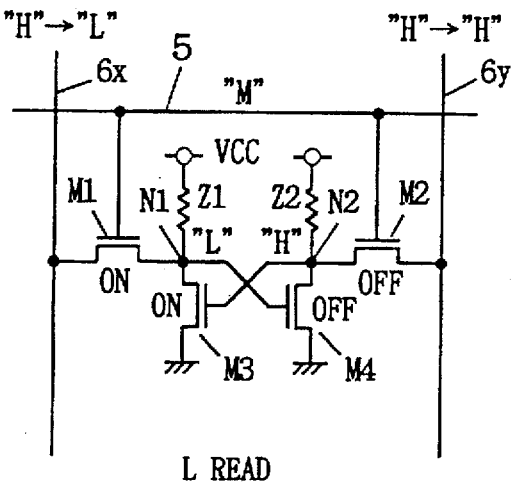

Conversely, in the state as shown in FIG. 16B, specifically, in the state that storage node N1 holds information at L-level and storage node N2 holds information at H-level, access transistor M1 is turned on, and access transistor M2 is turned off. Thereby, a current flows from bit line 6x to storage node N1, so that the potential on bit line 6x lowers. Thereby, reading of data can be performed.

In the data read operation, the voltage level transmitted onto the selected word line is set to the intermediate voltage "M", and its voltage level is set to 2·VTH level. Therefore, the potential on the storage node storing information at L-level rises only up to VTH. Thus, the gate potential on drive transistor connected to the storage node storing information at H-level is prevented from rising to or above threshold voltage VTH, and the potential on the storage node storing information at H-level is prevented from lowering through the turn-on drive transistor, so that destruction of storage information is prevented.

Figure 16C:
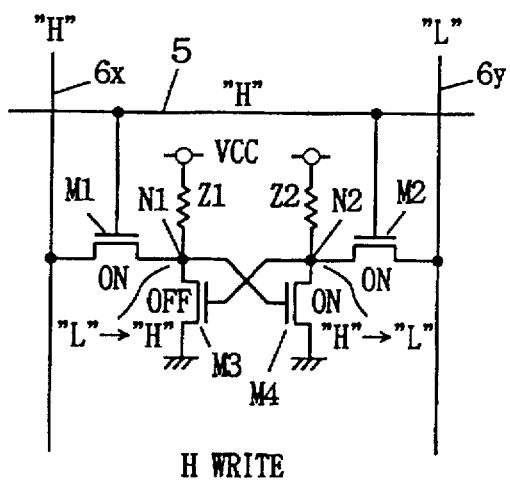

In the data write operation mode, a voltage at power supply voltage VCC level, i.e., at H-level is transmitted onto the selected word line for performing data writing. If intermediate voltage "M" were transmitted onto the selected word line, the access transistor would be able to transmit only a voltage at VTH level, i.e., a voltage lower than its gate voltage by threshold voltage VTH, so that data writing would be impossible. For data writing, therefore, the potential on selected word line is raised to power supply voltage VCC level. In this case, as shown in FIG. 16C, information at H-level is transmitted to bit line 6x. Even when storage node N1 has stored information at L-level, access transistors M1 and M2 are turned on, and the potential on storage node N1 rises to H-level. Meanwhile, storage node N2 is discharged by the write driver or sense amplifier to ground potential GND level. Therefore, drive transistor M3 is surely turned off, and information at H-level can be written into storage node N1.

Figure 16D:
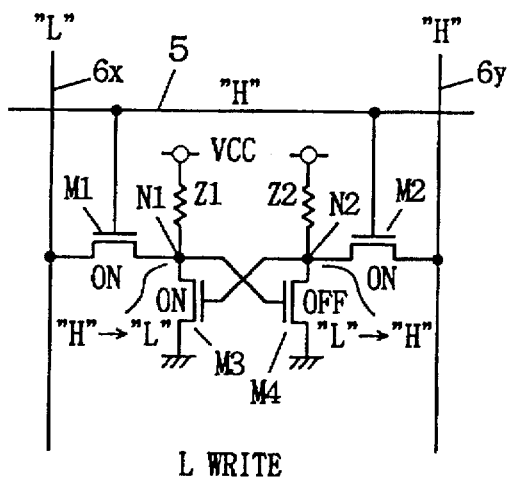

When information at L-level is transmitted to bit line 6x as shown in FIG. 16D, potential at H-level is transmitted onto bit line 6y. Similarly to the write operation illustrated in FIG. 16C, storage node N1 is driven to ground potential GND level by the write driver or sense amplifier, and drive transistor M4 is turned off owing to driving of storage node N1 to the ground potential level, so that information at H-level is surely transmitted to node N2.

Figure 16E:
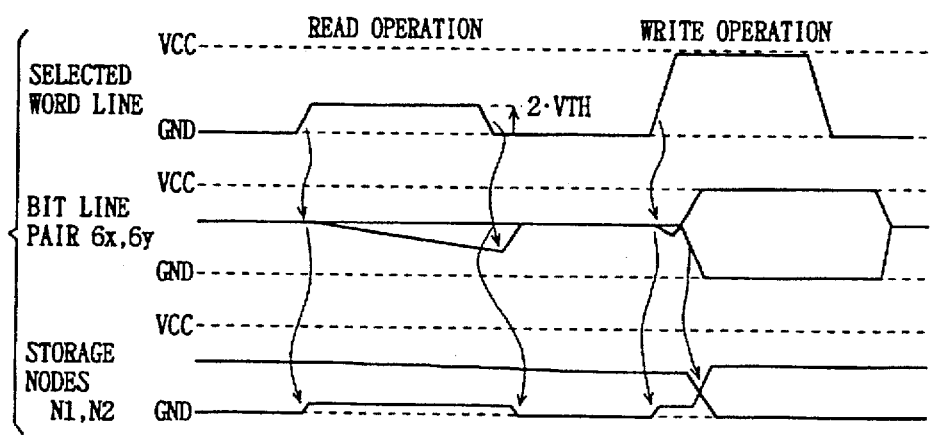
FIG. 16E shows operation waveforms during data writing/reading.

As shown in FIG. 16E, the operation in data reading is performed in such a manner that the potential on selected word line is raised to an intermediate potential (approximately 2·VTH level) for preventing destruction of storage information held at storage nodes N1 and N2. In the write operation, the potential on selected word line is raised to power supply voltage VCC level, the bit line pair potentials are fully swung between power supply voltage VCC level and ground potential GND level for writing of the write data into storage nodes N1 and N2 of the selected memory cell.

In the structure of the memory cell shown in FIGS. 16A to 16D, load elements Z1 and Z2 are formed of high resistance elements. However, they may be formed of thin film transistors.

Figure 17:
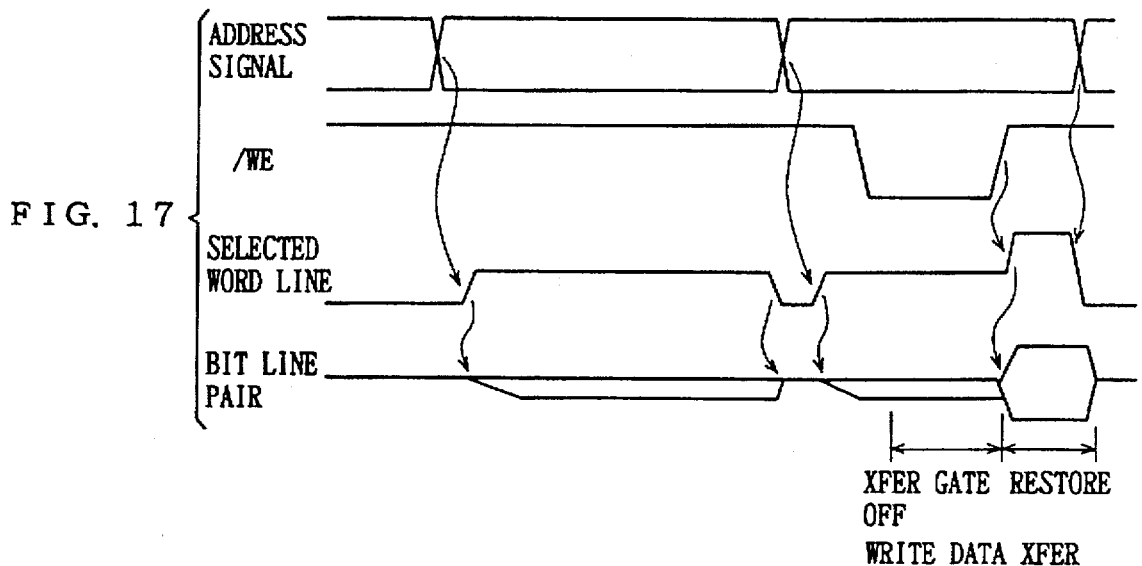
FIG. 17 is a signal waveform diagram representing an operation of the semiconductor memory device according to the embodiment 3 of the invention.

FIG. 17 is a signal waveform diagram representing the operation of SRAM according to the embodiment 3 of the invention. In the operation waveform diagram of FIG. 17, change in signals on only the selected word line and bit line pair is shown. As shown in FIG. 17, when the address signal changes, the word line is driven to the selected state in accordance with the changed address signal. When write enable signal /WE is at H-level indicative of data reading, the potential on the selected word line is set to the intermediate potential "M" level. Thereby, the storage information of memory cell is nondestructively read onto the bit line pair, and data reading is performed. The sense amplifier may be activated during this data reading.

In the data write operation, write enable signal /WE is set to L-level. In the data write cycle, the selected word line is first held at the intermediate potential, and data of the selected memory cell is nondestructively read out, similarly to the data reading operation. In response to falling of write enable signal /WE, the write data is internally produced and transmitted to the sense amplifier portion. When write enable signal /WE rises to H-level, the potential on the selected word line is raised to power supply voltage VCC level, and this write data is transmitted from the sense amplifier onto the bit line pair, whereby the write data is written into the selected memory cell. In the data write operation, original storage information which is latched by the sense amplifier is rewritten into each memory cell on each nonselected column.

In the operation waveform diagram of FIG. 17, rewriting of storage information is performed in synchronization with rising of write enable signal /WE. Therefore, the cycle time of read cycle can be equal to that of the write cycle. Now, a circuit structure for achieving the operation waveform shown in FIG. 17 will be described below.

Control of activation/deactivation of the sense amplifier can be performed in the same manner as that utilized in the embodiment 2. This is allowed by setting the timing of rewriting of data, i.e., the timing of potential boosting of the selected word line to be responsive to rising of write enable signal /WE. Other structures can be the same as those in the embodiment 2. Still another sense amplifier activation timing will be described below.

FIG. 18 shows a structure of the sense amplifier activating signal generating portion. In FIG. 18, the sense amplifier activating signal generating portion includes an ATD circuit 190 for detecting transition in the address signal, a one-shot pulse generating circuit 192 which generates a one shot pulse having a predetermined time width in response to the address transition detection signal from ATD circuit 190, an inverting and delaying circuit 194 which inverts an output signal and delaying the same by a predetermined time T6, and a set/reset flip-flop 196 which is set in response to rising of an output signal of inverting and delaying circuit 194, and is reset in response to rising of an output signal of one-shot pulse generating circuit 192.

One-shot pulse generating circuit 192 generates sense node equalize instructing signal EQSA, and flip-flop 196 generates sense amplifier activating signal SE at its output Q. Now, an operation of the sense amplifier activating signal generating portion shown in FIG. 18A will be described below with reference to an operation waveform diagram of FIG. 18B.

When address signal makes a transition, the address transition detection signal from ATD circuit 190 is activated. In response to this, sense node equalize instructing signal EQSA from one-shot pulse generating circuit 192 is set to H-level for a predetermined period, and the sense nodes of sense amplifier are equalized in potential. Upon elapsing of delay time T6 of inverting and delaying circuit 194, the output signal of inverting and delaying circuit 194 rises to H-level, flip-flop 196 is set, and sense amplifier activating signal SE is set to the active state of H-level, whereby the sense amplifier operates. The bit line potentials read onto bit line pair are sensed, amplified and latched. When a new address signal is applied, the address transition detection signal from ATD circuit 190 is activated again, and one-shot pulse generating circuit 192 generates sense node equalize instructing signal EQSA in the form of a one-shot pulse. In response to rising of sense node equalize instructing signal EQSA from this one-shot pulse generating circuit 192, set/reset flip-flop 196 is reset, and sense amplifier activating signal SE is deactivated after driving of the selected word line to the nonselected state, and the sense amplifier stops its amplifying and latching operation.

Figure 18A:
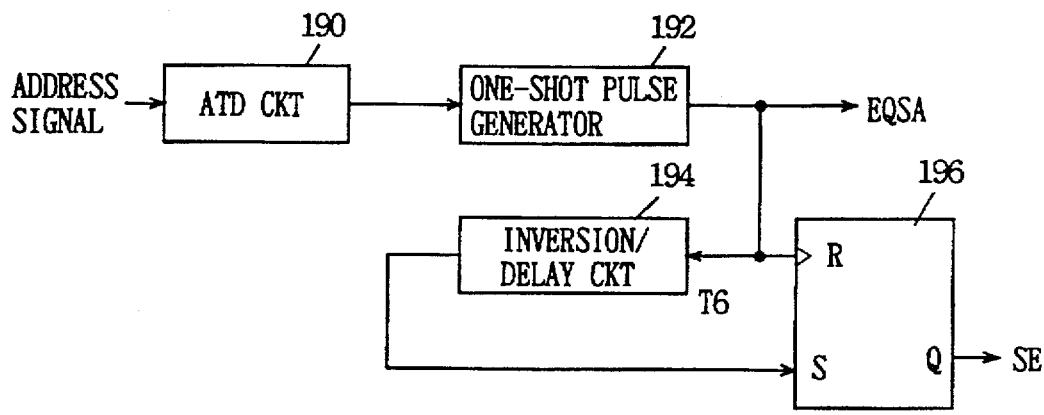
FIG. 18A shows a structure of an internal control signal generating portion in the embodiment 3 of the invention.
Figure 18B:
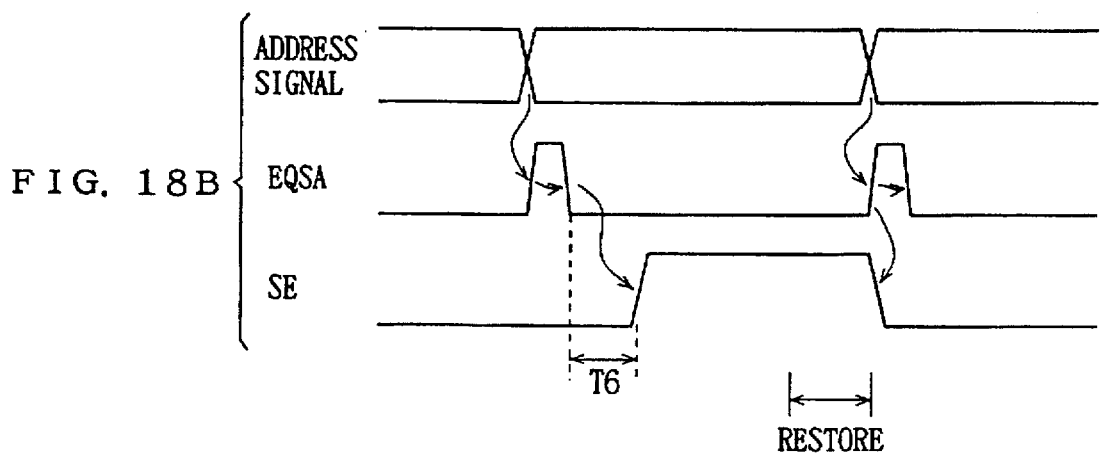
FIG. 18B shows operation waveforms representing an operation of the structure of FIG. 18A.

In the case utilizing the structure shown in FIG. 18A, if a transfer gate is arranged between the bit line pair and the sense amplifier, such transfer gate is required only to be on during a period from activation of sense node equalize instructing signal EQSA to activation of sense amplifier activating signal SE and a period for restoring. In the structure shown in FIG. 18A, the sense amplifier is activated at a relatively early timing. Without internally providing the preamplifier, the internal data bus can be sufficiently driven to the potential level corresponding to read data by the drive power of this sense amplifier. Therefore, such a structure may be employed that a sense amplifier of a current mirror type is not used but a buffer circuit such as an inverter circuit is used for transferring read data to a DQ buffer performing data input/output.

In the data writing, the write driver is used, and the write data is transferred to the sense amplifier in accordance with write enable signal /WE for setting the latch information of the selected sense amplifier to the state corresponding to the write data. These data writing structures may be the same as those already described with reference to the embodiments 1 and 2. Therefore, such a structure may be employed that the sense amplifier and transfer gate are activated/deactivated at the same timings in the data writing and data reading. Alternatively, such a structure may be utilized that the same timing is set for activation of the sense amplifier in both the read cycle for data reading and the write cycle for data writing, and only the transfer gate is turned on again only during restoring in the data write cycle. This sequence can be implemented by a structure in which the transfer gate is activated for a predetermined period in response to rising of write enable signal /WE, and such structure can be easily achieved by using the one-shot pulse generating circuit.

Figure 19A:
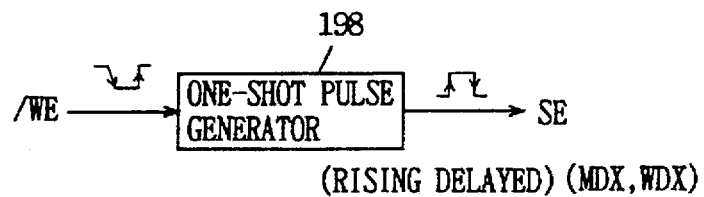
FIGS. 19A and 19B show another structure and operating waveforms of a sense amplifier activating signal generating portion in the embodiment 3 of the invention.
Figure 19B:
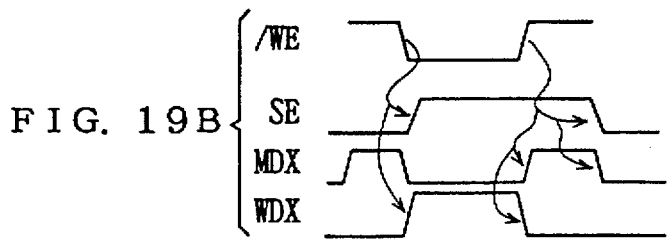

FIG. 19A shows still another structure of a sense amplifier activating signal generating portion. In FIG. 19A, the sense amplifier activating signal generating portion includes a one-shot pulse generating circuit (rising delay circuit) 198 which generates a one-shot pulse signal having a predetermined time width in response to rising of write enable signal /WE. One-shot pulse generating circuit 198 generates sense amplifier activating signal SE. Sense amplifier activating signal SE from one-shot pulse generating circuit 198 is activated in response to falling of write enable signal /WE, and is deactivated upon elapsing of a predetermined time in response to deactivation of signal /WE. Thereby, the sense amplifier can be activated only in the data write operation. As shown in FIG. 19B, write data transfer instructing signal WDX is active while write enable signal /WE is active. If the transfer gate is employed, signal MDX is activated during restoration in response to rising of signal /WE.

Figure 20:
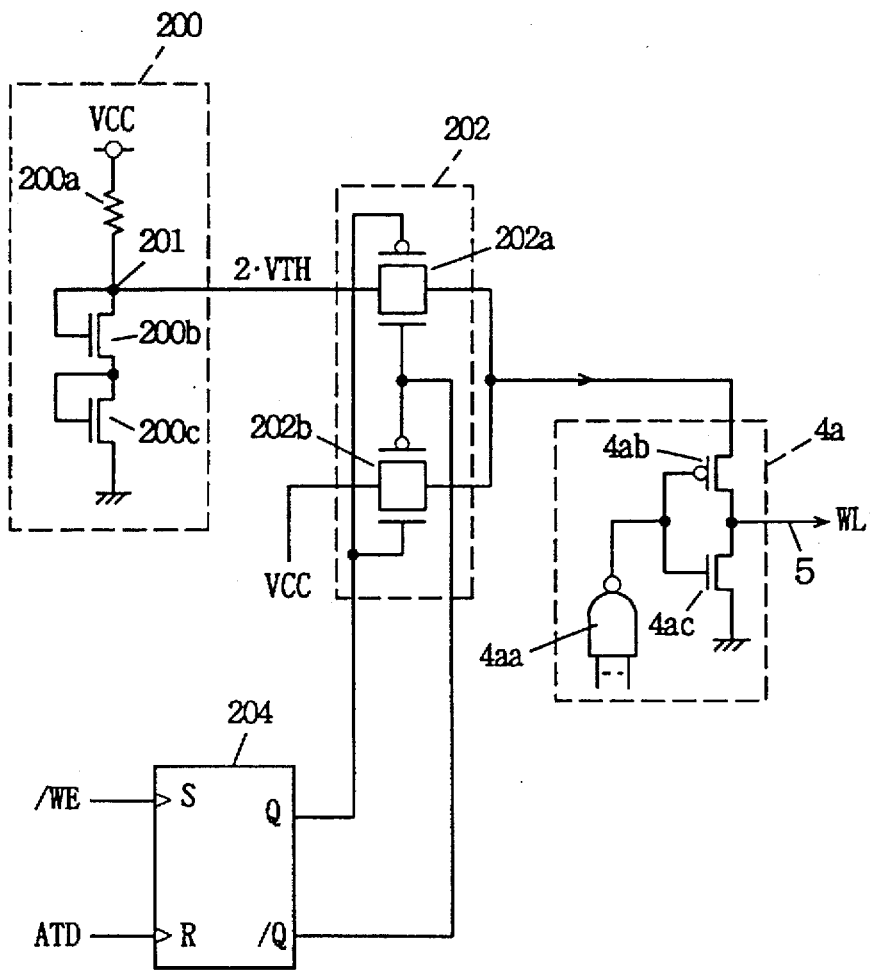
FIG. 20 shows a structure of a word line drive voltage generating portion in the embodiment 3 of the invention.

FIG. 20 shows an example of a structure of a selected word line driving voltage generating portion. In FIG. 20, the selected word line driving voltage generating portion includes an intermediate voltage generating circuit 200 which always produces intermediate voltage "M" (=2·VTH), a set/reset flip-flop 204 which is set in response to rising of write enable signal /WE and is reset in response to rising of address transition detection signal ATD, and a select circuit 202 which selects either intermediate voltage 2·VTH supplied from intermediate voltage generating circuit 200 or power supply voltage VCC in accordance with output signals from outputs Q and /Q of set/reset flip-flop 204. The output voltage of select circuit 202 is applied to row decode circuit 4a provided corresponding to each word line. Row decode circuit 4a transmits the voltage applied from select circuit 202 onto the selected word line.

The intermediate voltage generating circuit 200 includes a resistance element 200a of a high resistance connected between power supply node VCC and an output node 201, and two diode-connected n-channel MOS transistors 200b and 200c which are connected in series between output node 201 and the ground node. In the structure of intermediate voltage generating circuit 200, a resistance value of high resistance element 200a is sufficiently larger than channel resistances of MOS transistors 200b and 200c, so that n-channel MOS transistors 200b and 200c operate in a diode mode and each cause voltage drop of threshold voltage VTH. Thereby, a voltage of 2·VTH is generated at output node 201 of intermediate voltage generating circuit 200.

Set/reset flip-flop 204 is set to provide at its output Q the signal at "H" when write enable signal /WE rises and the operation mode shifts from the data write mode to the data read mode. Set/reset flip-flop 204 is reset upon each activation of address transition detection signal ADT (rising to H-level). Therefore, the signal from output Q of this set/reset flip-flop 204 attains H-level only when the operation mode shifts from the write mode for data writing to the read mode for data reading.

Select circuit 202 includes CMOS transmission gates 202a and 202b which are mutually complementarily turned on in response to output signals from outputs Q and /Q of set/reset flip-flop 204. CMOS transmission gate 202a is turned on when the signal from output Q of set/reset flip-flop 204 is at H-level, to select intermediate voltage 2·VTH sent from intermediate voltage generating circuit 200 for applying the same to row decode circuit 4a. CMOS transmission gate 202b is turned on when the signal from output Q of set/reset flip-flop 204 is at L-level, to apply power supply voltage VCC to row decode circuit 4a. The output voltage of select circuit 202 is applied commonly to the respective row decode circuits included in the row decoder. FIG. 20 representatively shows the row decode circuit 4a provided corresponding to one word line.

Row decode circuit 4a includes a multi-input NAND type decode circuit 4aa, which decodes the address signal and generates a signal at L-level when addressed, a p-channel MOS transistor 4ab which is turned on when the output signal of NAND type decode circuit 4aa is at L-level and to transmit the output voltage of select circuit 202 onto corresponding word line 5, and n-channel MOS transistor 4ac which is turned on when the output signal of NAND type decode circuit 4aa is at H-level, to drive corresponding word line 5 to the ground potential level.

Now, an operation of the intermediate voltage generating portion and the word line drive portion (row decode circuit) will be described below with reference to a waveform diagram of FIG. 21.

In FIG. 21, chip select signal /CS is fixed at L-level, and the SRAM is in the selected state. Write enable signal /WE is at H-level, and flip-flop 204 (refer to FIG. 20) is at the reset state generating a signal at L-level from its output Q. In the select circuit 202, CMOS transmission gate 202a is on to select intermediate voltage 2·VTH from intermediate voltage generating circuit 200 for application to row decode circuit 4a. In the row decode circuit corresponding to the addressed word line, p-channel MOS transistor 4ab is on, the intermediate voltage applied from select circuit 202 is transmitted to word line (WL1).

When the address signal changes to designate another word line, n-channel MOS transistor 4ac is turned on to discharge the potential on selected word line WL1 to the ground potential level. Address transition detection signal ATD may be used for temporarily resetting NAND type decode circuit 4aa, and alternatively row decode circuit 4a may statically decode an applied address signal. Address change detection signal ATD can be simply used for providing a timing for resetting the boosted voltage level of the word line in the data write operation.

In accordance with the address signal thus changed, the address transition detection signal ATD is set to the active state of H-level for a predetermined period, and flip-flop 204 is reset again to hold the potential of signal from its output Q at L-level. In this manner, select circuit 202 continuously selects and generates the intermediate voltage "M" (=2·VTH). In accordance with the address signal thus changed, the word line selection is performed again, and the corresponding row decode circuit 4a raises the potential on selected word line (WL2) to the intermediate potential level. In this memory cycle, the write enable signal /WE lowers from H-level to L-level. Thereby, data is written internally and is transmitted to the sense amplifier. Whether the write data is latched by the sense amplifier or is simply transferred to the sense amplifier depends on the structures of the internal data write portion and sense amplifier, which will be described later.

When write enable signal /WE rises to "H", flip-flop 204 is set, and the signal from its output Q rises to "H", CMOS transmission gate 202b of select circuit 202 is turned on, and power supply voltage VCC is applied to row decode circuit 4a. Thereby, the potential on selected word line WL2 rises to power supply voltage VCC level. When the address signal makes a transition and the address transition detection signal ATD is activated, flip-flop 204 is reset, and the signal from its output Q is set to L-level. If row decode circuit 4a is statically performing decoding, the potential on selected word line is driven to the ground potential level in accordance with the changed address signal (when selection of the word line is performed asynchronously with address transition detection signal ATD).

In the next cycle, word line selection is performed again in accordance with another address signal, and selected word line WL3 is driven to intermediate voltage 2·VTH level.

As described above, select circuit 202 is used to raise the word line potential when write enable signal /WE shifts from the active state to the inactive state, i.e., when the operation mode shifts from the data write mode to the data read mode, whereby data can be written into the memory cell connected to the selected word line. In this operation, since the sense amplifier has latched data read from the memory cell, restoring is performed for storage data of the memory cell which was destroyed by word line boosting.

FIG. 22A shows a structure of a portion generating write data transfer instructing signal WDX. In FIG. 22A, the write data transfer instructing signal generating portion includes an NOR circuit 210 which receives chip select signal /CS and write enable signal /WE, and a set/reset flip-flop 212 which is set in response to rising of the output signal of NOR circuit 210 and is reset in response to rising of sense amplifier activating signal /SE. Flip-flop 212 generates write data transfer instructing signal WDX at its output Q. Now, an operation of the write data transfer instructing signal generating portion shown in FIG. 22A will be described below with reference to an operation waveform diagram of FIG. 22B.

FIG. 22B shows operation waveforms during data writing and reading in the case where chip select signal /CS is set to the active state of L-level.

In the data read operation, write enable signal /WE is at H-level, NOR circuit 210 generates a signal at L-level, and flip-flop 212 maintains the reset state. Sense amplifier activating signal SE is activated at a predetermined timing (refer to FIGS. 18 and 19), and flip-flop 212 is surely maintained at the reset state. If a transfer gate is provided to couple the bit line pair and the sense amplifier together, connection control signal MDX is set to the active state for a predetermined period during reading of data of the selected memory cell and restoring. In the restore operation, transfer instructing signal MDX is deactivated in response to deactivation of sense amplifier activating signal SE. In the data read operation, data of the selected memory cell is read in accordance with the applied address signal, and subsequently, the sense amplifier is activated at a predetermined timing (or may maintain the inactive state).

When write enable signal /WE falls to L-level, the output signal of NOR circuit 210 is set to H-level, flip-flop 212 is set, write data transfer instructing signal WDX from flip-flop 212 is set to the active state of H-level, and, the write data is transmitted to the sense nodes of sense amplifier. When sense amplifier activating signal SE is active, storage data of the sense amplifier provided corresponding to the selected column changes in accordance with the write data.

When the transfer instructing signal MDX is at H-level, the write data is transmitted onto the selected column. When transfer instructing signal MDX is at L-level, the write data is merely transmitted to the sense nodes of sense amplifier.

Then, write enable signal /WE attains H-level, and the operation mode shifts from the data write mode to the data read mode. At the time of rising of write enable signal /WE, sense amplifier activating signal SE is made active at H-level, and transfer instructing signal MDX is active and therefore at H-level. Thereby, the sense amplifier performs amplification, and the potentials held on the sense nodes of sense amplifier is transmitted to each bit line pair for restoring (writing) storage data into the memory cell. When sense amplifier activating signal SE is set to the inactive state of L-level, sense amplifier activating signal /SE rises to H-level, flip-flop 212 is reset, and write data transfer instructing signal WDX is set to L-level. Thereby, writing is completed.

In FIG. 22B, lines with double arrows denote periods in which sense amplifier activating signal SE can be activated at an appropriate timing in accordance with the form of the embodiment. Data transfer instructing signal MDX in the illustrated form may be set to the H-level during the memory cycle period in accordance with a manner of activation of sense amplifier activating signal SE, or may be set to H-level for a predetermined period.

As described above, write data transfer instructing signal WDX is activated in accordance with activation of write enable signal /WE, and write data is transmitted to the sense nodes of sense amplifier provided corresponding to the selected column. Thereby, the write data can be transferred to the sense nodes of sense amplifier during restoring, and writing and restoring of the memory cell data can be surely performed in the data write operation.

Figure 23A:
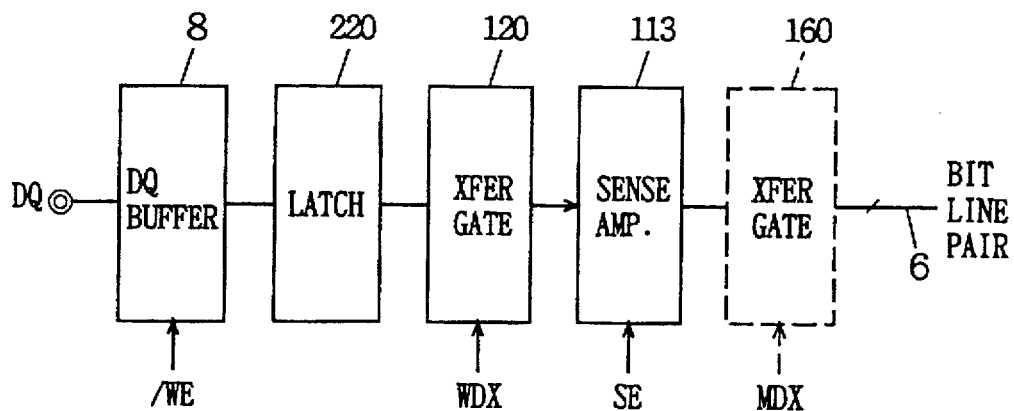
FIG. 23A schematically shows a structure of a data writing portion in the semiconductor memory device according to the embodiment 3 of the invention.
Figure 23B:
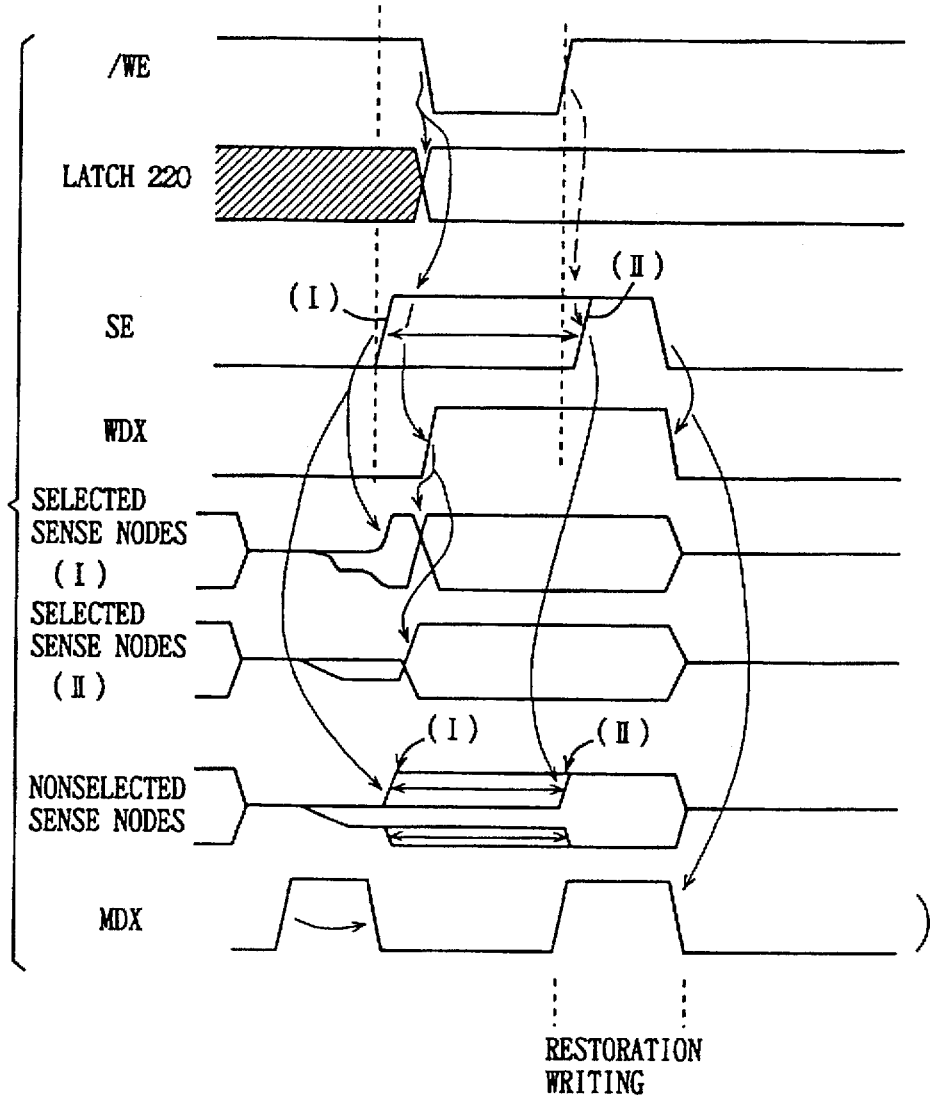
FIG. 23B shows operation waveforms representing an operation of the structure of FIG. 23A.

FIG. 23A schematically shows a structure of a path for data writing. In the structure shown in FIG. 23A, a latch 220 is arranged between DQ buffer 8 and write data transfer gate 210. Latch 220 is formed of, e.g., an inverter latch. Latch 220 latches internal write data from an input buffer included in DQ buffer 8. The input buffer is activated in response to write enable signal /WE, to receive externally applied write data for producing and applying internal write data to latch 220. Transfer gate 220 between sense amplifier 113 and bit line pair 6 may be eliminated. An operation of the data writing portion shown in FIG. 23A will be described below with reference to an operation waveform diagram of FIG. 23B. FIG. 23B also shows operation waveforms in such cases that the sense amplifier is activated upon elapsing of a predetermined time after start of the memory cycle, and that the sense amplifier is activated when write enable signal /WE is set to H-level and restoring is performed.

When write enable signal /WE is set to the active state of L-level, the input buffer included in DQ buffer 8 is activated to produce internal write data from external write data, so that latched information of latch 220 changes and is fixed in accordance with the internal write data.

Sense amplifier activating signal SE is activated before activation of write enable signal /WE (case (I)), or is activated after deactivation of write enable signal /WE (case (II)). Write data transfer instructing signal WDX is activated in response to write enable signal /WE, so that transfer gate 120 is turned on, and latched data of latch 220 is transmitted to sense amplifier 113.

In the case (I), the sense nodes of sense amplifier 113 provided corresponding to the selected column change in accordance with the write data transmitted from latch 220 via transfer gate 120, and sense amplifier 113 latches the write data thus applied. The sense amplifier provided corresponding to the nonselected column amplifies and latches the data of memory cell transmitted from the corresponding bit line pair.

In the case (II), sense amplifier activating signal SE is still inactive, and the potentials on sense nodes of sense amplifier provided corresponding to the selected column change in accordance with the write data transmitted from latch 220 via transfer gate 120. A current supply capability of latch 220 is sufficiently larger than a current drive capability of sense amplifier 113. In this state, the potentials on sense nodes of sense amplifier provided corresponding to the selected column change to power supply voltage VCC and ground potential GND level in accordance with the write data transmitted from latch 220, respectively. The sense nodes of sense amplifier provided corresponding to the nonselected column still maintain the potential level corresponding to information of the memory cell transmitted from the corresponding bit line pair.

When write enable signal /WE rises from L-level to H-level, restoring of the memory cell data is performed. In the case (I), sense amplifier activating signal SE is activated in response to rising of write enable signal /WE. The sense nodes of sense amplifier provided corresponding to the selected column hold the potential levels corresponding to write data unchangeably. Meanwhile, the sense nodes of sense amplifier provided corresponding to the nonselected column are driven to power supply voltage VCC level and ground potential GND level by the corresponding sense amplifier in response to sense amplifier activating signal SE. In this restoring operation, transfer instructing signal MDX is set to the active state of H-level, and the potentials on sense nodes of the sense amplifier are transmitted to the storage nodes of the corresponding memory cell via the corresponding bit line pair for restoring and writing the memory cell data, transfer gate 160 is provided.

As described above, latch 220 is arranged between DQ buffer 8 and transfer gate 120, whereby the write data is surely transferred to the sense nodes of sense amplifier provided corresponding to the selected column and can be sensed and amplified by the sense amplifier, regardless of the timing relationship between sense amplifier activating signal SE and write enable signal /WE.

Transfer instructing signal MDX may be constructed such that it is set to L-level for a predetermined period in accordance with the address transition detection signal and maintains H-level for the memory cycle period.

According to the above description, sense amplifier activating signal SE is active for a predetermined period in both of the read cycle for data reading and the write cycle for data writing. The sense amplifier can be controlled in the same manner in both the read cycle and write cycle, so that the control can be made easy. However, such a structure may be employed that sense amplifier activating signal SE is made active only in the write cycle for data writing as shown in FIG. 19A. The structure in which sense amplifier activating signal SE is made active only in the write cycle for data writing may be different from that shown in FIG. 19A, and may be formed of a structure in which sense amplifier activating signal SE is set to the active state of H-level for a predetermined period in response to rising of write enable signal /WE. In this case, transfer gate 160 is provided, and the write data transferred in accordance with write enable signal /WE is transferred to the sense nodes so that the sense node potentials change.

[Modification of Write Data Transfer]

Figure 24A:
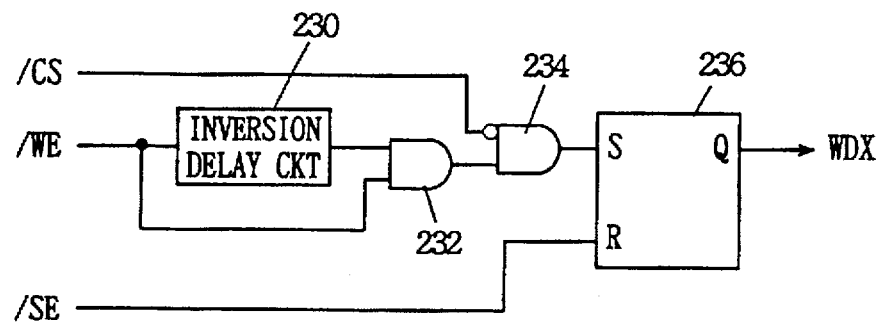
FIG. 24A shows another structure of the write data transfer instructing signal generating portion in the embodiment 3 of the invention.

FIG. 24A shows another structure of the write data transfer instructing signal generating portion. In FIG. 24A, the write data transfer instructing signal generating portion includes an inverting and delaying circuit 230 which delays write enable signal /WE by a predetermined period and inverts the same, an AND circuit 232 which receives an output signal of inverting and delaying circuit 230 and write enable signal /WE, a gate circuit 234 which receives an output signal of AND circuit 232 and chip select signal /CS, and a set/reset flip-flop 236 which is set in response to rising of an output signal of gate circuit 234 and is reset in response to deactivation of sense amplifier activating signal /SE.

Figure 24B:
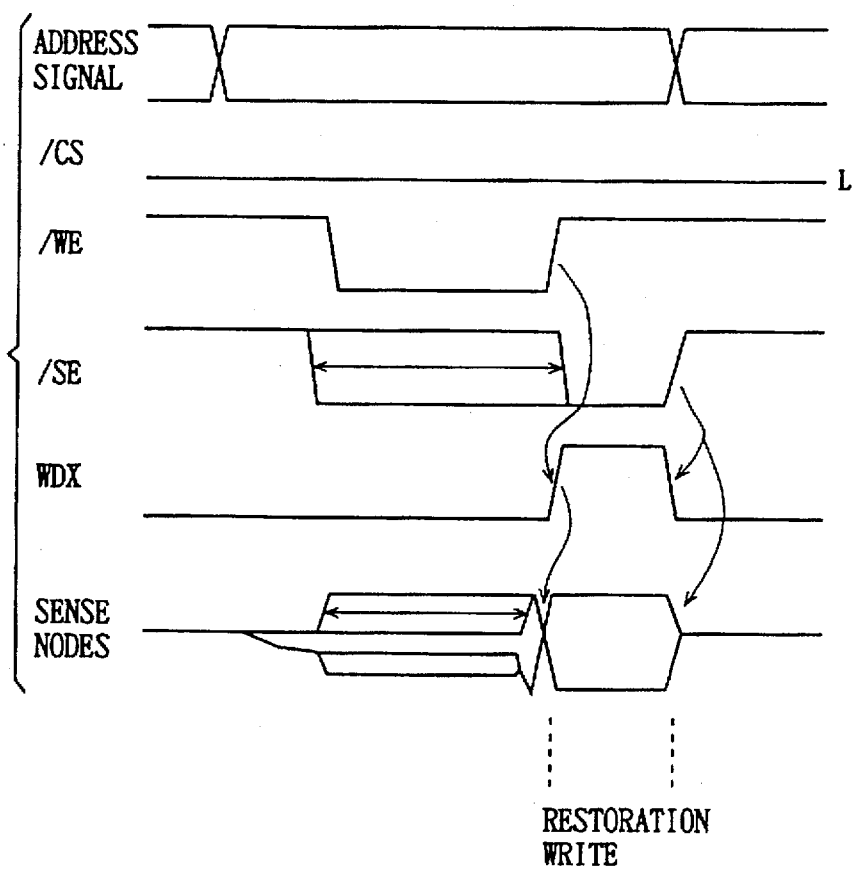
FIG. 24B shows operation waveforms representing an operation of the structure of FIG. 24A.

This set/reset flip-flop 236 generates write data transfer instructing signal WDX at its output Q. Gate circuit 234 is enabled to pass the output signal of AND circuit 232, when chip select signal /CS is at L-level. When chip select signal /CS is at H-level, gate circuit 234 generates a signal at L-level. Now, an operation of the write data transfer instructing signal generating portion shown in FIG. 24A will be described below with reference to an operation waveform diagram of FIG. 24B. In FIG. 24B, activation timing of sense amplifier activating signal /SE is set at any timing in a period denoted by double arrows. Chip select signal /CS is at L-level, and this SRAM is in the selected state.

When the address signal changes and the memory cycle starts, the storage information of memory cell is transmitted to the sense nodes of sense amplifier. Thereafter, write enable signal /WE is set to the active state of L-level at a predetermined timing. When the write enable signal /WE is activated, sense amplifier activating signal SE may be activated at the same time or with a delay. When write enable signal /WE rises from L-level to H-level, the output signal of AND circuit 232 attains H-level, flip-flop 236 is set, and write data transfer instructing signal WDX is set to H-level.

Internal write data, which is produced when write enable signal /WE is activated, is already latched by latch 220 shown in FIG. 23A. In response to the active state of write data transfer instructing signal WDX, transfer gate 120 (refer to FIG. 23A) is turned on, and the write data latched by latch 220 is transmitted to the sense nodes of sense amplifier 113 provided corresponding to the selected column. Thereby, the write data is transmitted to the memory cell in the selected column, and the original storage information latched by the sense amplifier is rewritten into the memory cell provided corresponding to each of the remaining, i.e., nonselected columns. When sense amplifier activating signal /SE is set to the inactive state of H-level, flip-flop 236 is reset, write data transfer instructing signal WDX is set to the inactive state of L-level, and transfer gate 120 shown in FIG. 23A is disabled. After deselection of the word line, sense amplifier 113 is deactivated, and all the bit line pairs are returned to the precharge state.

Only in the restoring which is performed in response to rising of write enable signal /WE, write data transfer instructing signal WDX may be made active. Even in this case, provision of latch 220 between DQ buffer 8 and transfer gate 120 allows such an operation that the storage information of sense nodes of sense amplifier provided corresponding to the selected column surely change in accordance with the write data, and the data of the selected memory cell can change in accordance with the write data.

According to the embodiment 3 of the invention, as described above, the potential on selected word line is raised from the intermediate potential level to the power supply voltage level in the data writing operation, and the potential on selected word line is held at the intermediate potential level in the data reading operation. Therefore, reading of data can be performed without destruction of the storage information of the memory cell, and writing of write data into the selected memory cell can be performed accurately.

[Embodiment 4]

Figure 25:
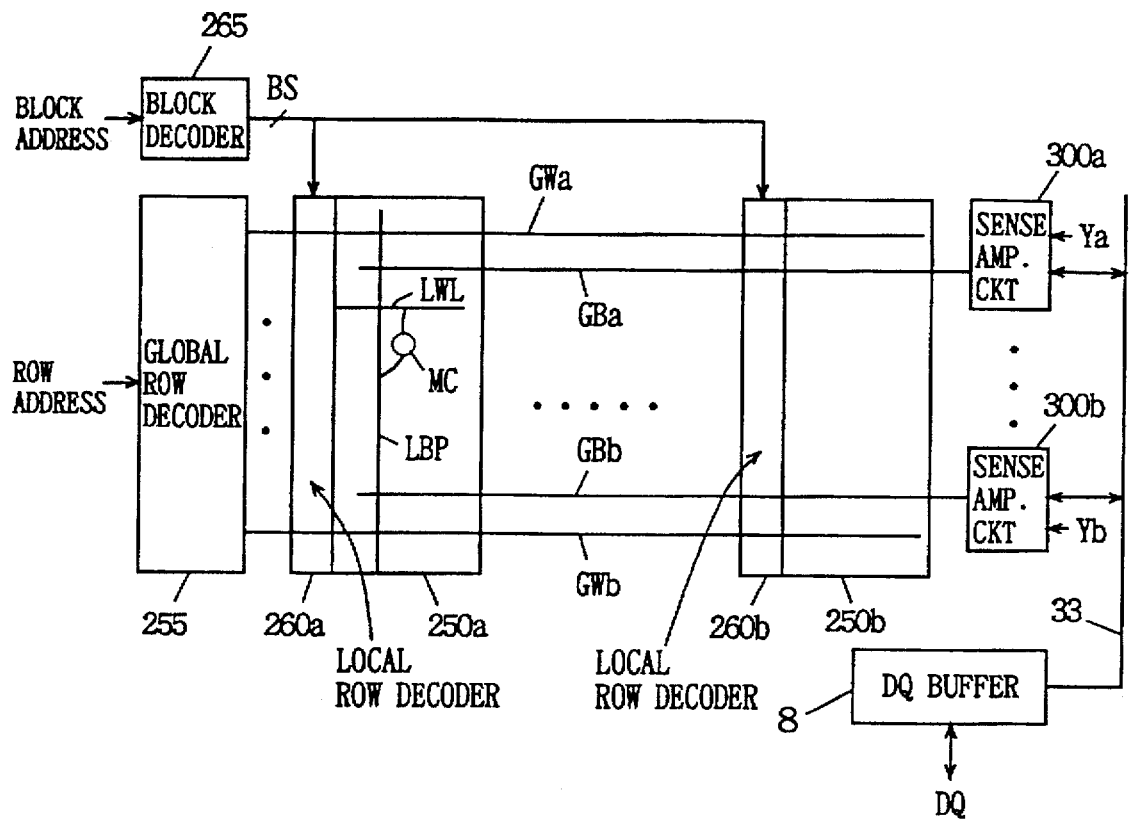
FIG. 25 schematically shows a whole structure of a semiconductor memory device according to an embodiment 4 of the invention.

FIG. 25 schematically shows a structure of a main portion of an SRAM according to the embodiment 4 of the invention. In FIG. 25, the SRAM according to the embodiment 4 of the invention includes memory blocks 250a ... 250b each having a plurality of memory cells arranged in a matrix of rows and columns, a plurality of global word lines GWa ... GWb which are arranged over memory blocks 250a ... 250b and corresponding to the rows of memory blocks 250a ... 250b, respectively, a global row decoder 255 which decodes an applied row address signal and drives one of global word lines GWa ... GWb to the selected state, a block decoder 265 which decodes the applied block address signal and produces a block select signal BS which in turn designates one of memory blocks 250a ... 250b, and local row decoders 260a ... 260b which are provided corresponding to memory blocks 250a ... 250b, respectively, are activated in response to the block select signal from block decoder 265, to drive the corresponding row in the addressed memory block in accordance with the signal potentials transmitted onto global word lines GWa ... GWb from global row decoder 255.

Each of memory blocks 250a ... 250b includes a plurality of local word lines LWL which are arranged corresponding to the rows of memory cells, respectively, and local bit line pairs LBP which are arranged corresponding to the columns of memory cells, respectively. Memory cells MC are arranged corresponding to crossings of local word lines LWL and local bit line pairs LBP, respectively. Local row decoders 260a ... 260b transmit signals on the corresponding global word lines GWa ... GWb onto local word lines LWL of the corresponding memory blocks, respectively. Owing to the structure that local word lines LWL are arranged independently in each memory block, and global word lines GWa ... GWb are arranged commonly to memory blocks 250a ... 250b, any memory cells are not connected to global word lines GWa ... Gb, so that loads on these global word lines GWa ... GWb can be made small, and row select signal from global row decoder 255 can be rapidly transmitted to memory blocks 250a ... 250b.

Each of local row decoders 260a ... 260b is merely required to drive the local word line of the corresponding memory block to the selected state when selected. Owing to block division of the memory, array into memory blocks, the memory cells connected to each local word line LWL can be small in number, and accordingly, a load on local word line LWL can be reduced. Therefore, in the selected memory block, the selected local word line can be rapidly driven to the selected state, allowing rapid access.

The SRAM further includes global bit line pairs GBa ... GBb which extend parallel to global word lines GWa ... GWb and are arranged commonly to the plurality of memory blocks 250a ... 250b, and sense amplifier circuits 300a ... 300b which are provided for global bit line pairs GBa ... GBb, respectively. These global bit line pairs GBa ... GBb are connected to bit line pairs provided corresponding to columns in memory blocks 250a ... 250b via block select gates which will be described later. Therefore, global bit line pairs GBa ... GBb are provided commonly to the columns in memory blocks 250a ... 250b and are arranged corresponding the respective rows.

The structure in which the global bit line pairs are arranged in the row direction, i.e., the direction perpendicular to the local bit line pairs LBP extending in the column direction is called a "T-shaped bit line array structure". This T-shaped bit line array structure is disclosed in Japanese Patent Laying-Open No. 4-228188 (corresponding to U.S. Pat. No. 5,280,441), Communications Association Study meeting (CAS91-58, SDM91-63, ICD91-67), Shiomi et al, "A 5.8 ns 256 Kb BiCMOS TTL SRAM with T-shaped Bit Line Architecture", IEEE Journal of Solid-State Circuits, Vol. 28, December 1993, pp. 1362–1369.

The embodiment 4 fully utilizes the T-shaped bit line array structure to reduce an area occupied by the array. More specifically, owing to provision of sense amplifier circuits 300a ... 300b for these global bit line pairs GBa ... GBb, it is not necessary to provide sense amplifier circuits for each of memory blocks 250a ... 250b, and an area occupied by the sense amplifier circuits can be reduced. Each of sense amplifier circuits 300a ... 300b is connected to DQ buffer 8 via read/write data bus 33.

Figure 26:
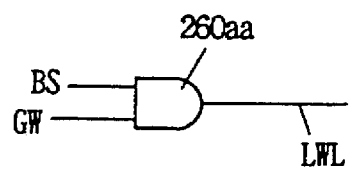
FIG. 26 shows a structure of a unit decode circuit in a local row decoder shown in FIG. 25.

FIG. 26 shows an example of a structure of an unit decode circuit which is included in the local row decoder. In FIG. 26, local row decoder 260 (260a ... 260b) includes an AND-type decode circuit 260aa, which is provided corresponding to local word line LWL and receives block select signal BS and a signal GW on the global word line. AND-type decode circuit 260aa drives corresponding local word line LWL to the selected state of H-level, when both block select signal BS and signal potential GW on the global word line attain H-level. When the intermediate voltage is to be transmitted to the selected word line, as is done in the embodiment 3, a drive circuit is arranged at an output of the AND-type decode circuit 260aa, and the intermediate voltage and the power supply voltage are selectively applied to the power supply node of this drive circuit.

Figure 27:
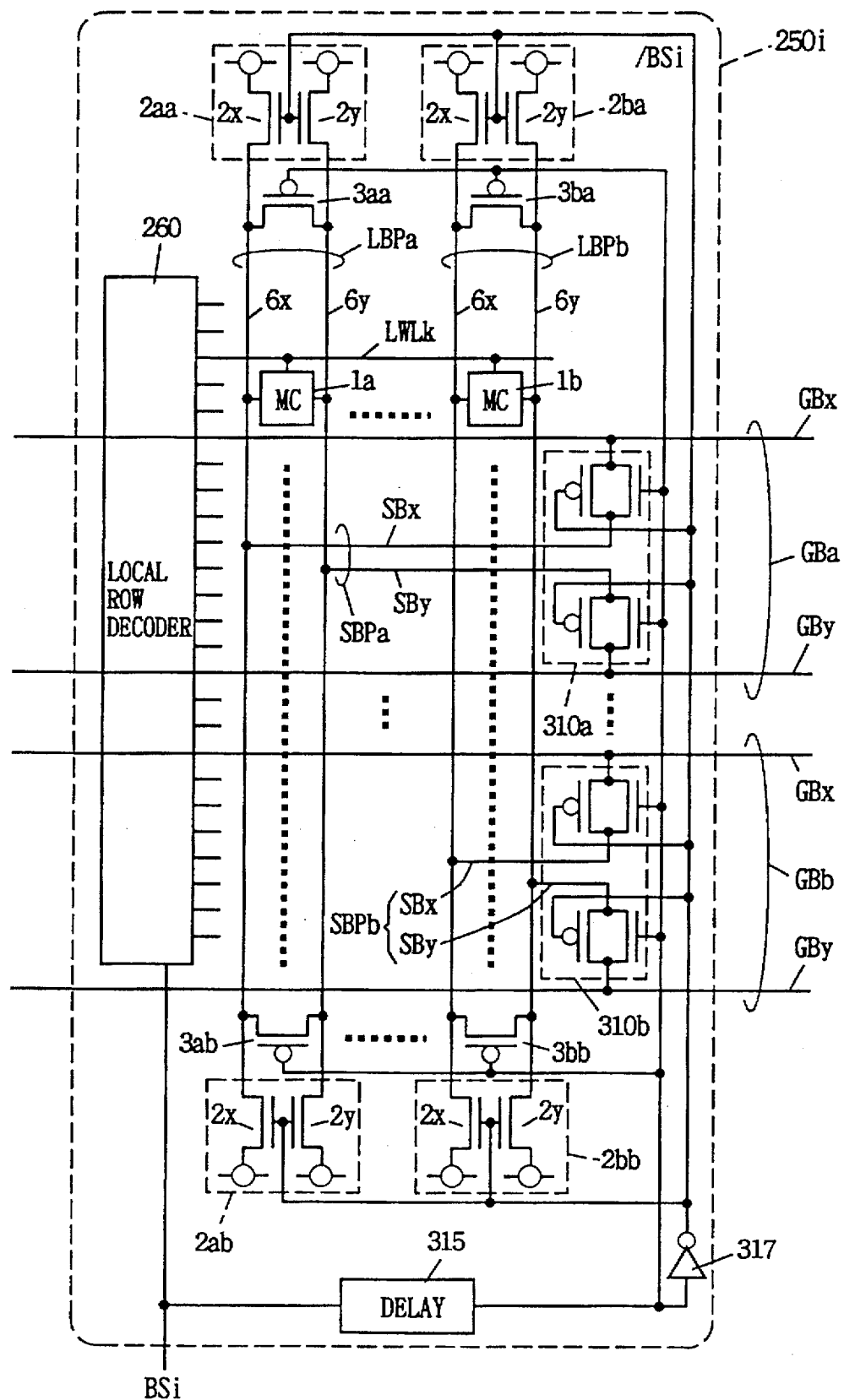
FIG. 27 shows a specific structure of a memory block shown in FIG. 25.

FIG. 27 shows more specifically the structure of memory blocks 250a ... 250b. FIG. 27 representatively shows one memory block 250i. In FIG. 27, memory block 250i includes a plurality of memory cells (MC) 1a ... 1b arranged in rows and columns, a plurality of local word lines LWL which are arranged corresponding to the rows of memory cells, respectively, and a local row decoder 260 which is activated in response to block select signal BSi, to transmit the signal potential transmitted onto the global word lines onto the corresponding local word line. FIG. 27 representatively shows one local word line LWLk and memory cells (MC) 1a ... 1b in one row connected to this local word line LWLk.

The memory block 250i further includes local bit line pairs LBPa ... LBPb which are arranged corresponding to the respective columns of memory cells, as well as equalize transistors 3aa, 3ab ... 3ba and 3bb and bit line load circuits 2aa, 2ab ... 2bb and 2ba which are arranged at opposite ends of local bit line pairs LBPa ... LBPb. For bit line pair LBPa, equalize transistor 3aa formed of a p-channel MOS transistor and bit line load circuit 2aa are arranged at one end, and equalize transistor 3ab and bit line load circuit 2ab are arranged at the other end. For bit line pair LBPb, equalize transistor 3ba and bit line load circuit 2ba are arranged at one end, and equalize transistor 3bb and bit line load circuit 2ba are arranged at the other end.

Equalize transistors 3aa, 3ab... 3ba and 3bb are supplied on their control electrodes (gates) with a block select signal BSi via a delay circuit 315. Each of bit line load circuits 2aa, 2ab... 2bb and 2ba includes n-channel MOS transistors 2x and 2y. These MOS transistors 2x and 2y are supplied with block select signal /BSi at their gates via an inverter circuit 317 receiving an output signal of delay circuit 315.

Corresponding to local bit line pairs LBPa... LBPb, respectively, there are arranged sub-bit line pairs SBPa... SBPb which extend parallel to global bit line GBP and are arranged only within memory block 250i, and block select gates 310a... 310b which connect sub-bit line pairs SBPa... SBPb to global bit lines GBa... GBb in response to the block select signals from delay circuit 315 and inverter circuit 317, respectively. Each of block select gates 310a.. .310b includes a CMOS transmission gate which is arranged between paired sub-bit lines SBx and SBy and paired global bit lines GBx and GBy of global bit line pair GB. By using the CMOS transmission gate, the signal potentials can be transmitted without a loss of the threshold voltage of the MOS transistor.

When memory block 250i is selected, block select signal BSi is set to H-level. When a delayed time of delay circuit 315 elapses, equalize transistors 3aa... 3bb and bit line load circuits 2aa... 2ba are deactivated. The word line select signal is transmitted to local word line LWLk for the selected row via the global row decoder, global word line and local row decoder. Delay circuit 315 compensates for the time delay caused in this transmission. Bit line pairs LBPa... LBPb are precharged and equalized to a predetermined potential immediately before or after driving of selected local word line LWLk to the selected state, a period for keeping the bit line pair at the electrically floating state can be made minimum, and the potential difference corresponding to the storage information of the memory cell is surely produced at each bit line pair without an influence by a noise. Bit line load circuits 2aa... 2ba and equalize transistors 3aa... 3bb are inactive only in the selected memory block. The purpose of this selective inactivation is to flow a current through the bit line pairs only in the selected memory block, increase a bit line potential amplitude, increase sufficiently a potential difference at the global bit lines, and reduce a current consumption.

The equalize transistors and bit line load circuits are arranged at the opposite ends of local bit line pairs LBPa... LBPb by the following reasons.

Local bit line pairs LBPa... LBPb are connected to global bit line pairs GBa and GBb via block select gates 310a... 310b and sub-bit line pairs SBPa... SBPb. The sub-bit line pairs are parallel to the local word lines. Therefore, sub-bit line pairs SBPa... SBPb (global bit line pairs GBa... GBb) are connected to local bit line pairs LBPa... LBPb at positions which are staggered from each other in the column extending direction (i.e., extending direction of the local bit line pair). When the memory cells are selected, the selected memory cells are located in one row. In the structure where the selected memory cells are spaced from the global bit line pairs GBa... GBb by different distances, respectively, different potential distributions appear on respective local bit line pairs LBPa... LBPb (due to interconnection line resistances of the local bit line pairs), even if the same potential differences are present at global bit line pairs GBa... GBb.

In order to precharge rapidly the local bit line pairs with different potential distributions to a predetermined potential when the data writing or reading is completed, the equalize transistors and bit line load circuits are arranged at opposite ends of respective local bit line pairs LBPa... LBPb. Therefore, even in such a case that potential distributions on local bit line pairs LBPa... LBPb are different from each other, these local bit line pairs LBPa... LBPb can be rapidly precharged and equalized to the original intermediate potential at the same timing by doing supply of the precharge current and equalization from the opposite ends, regardless of the potential distributions on the local bit line pairs.

Figure 28:
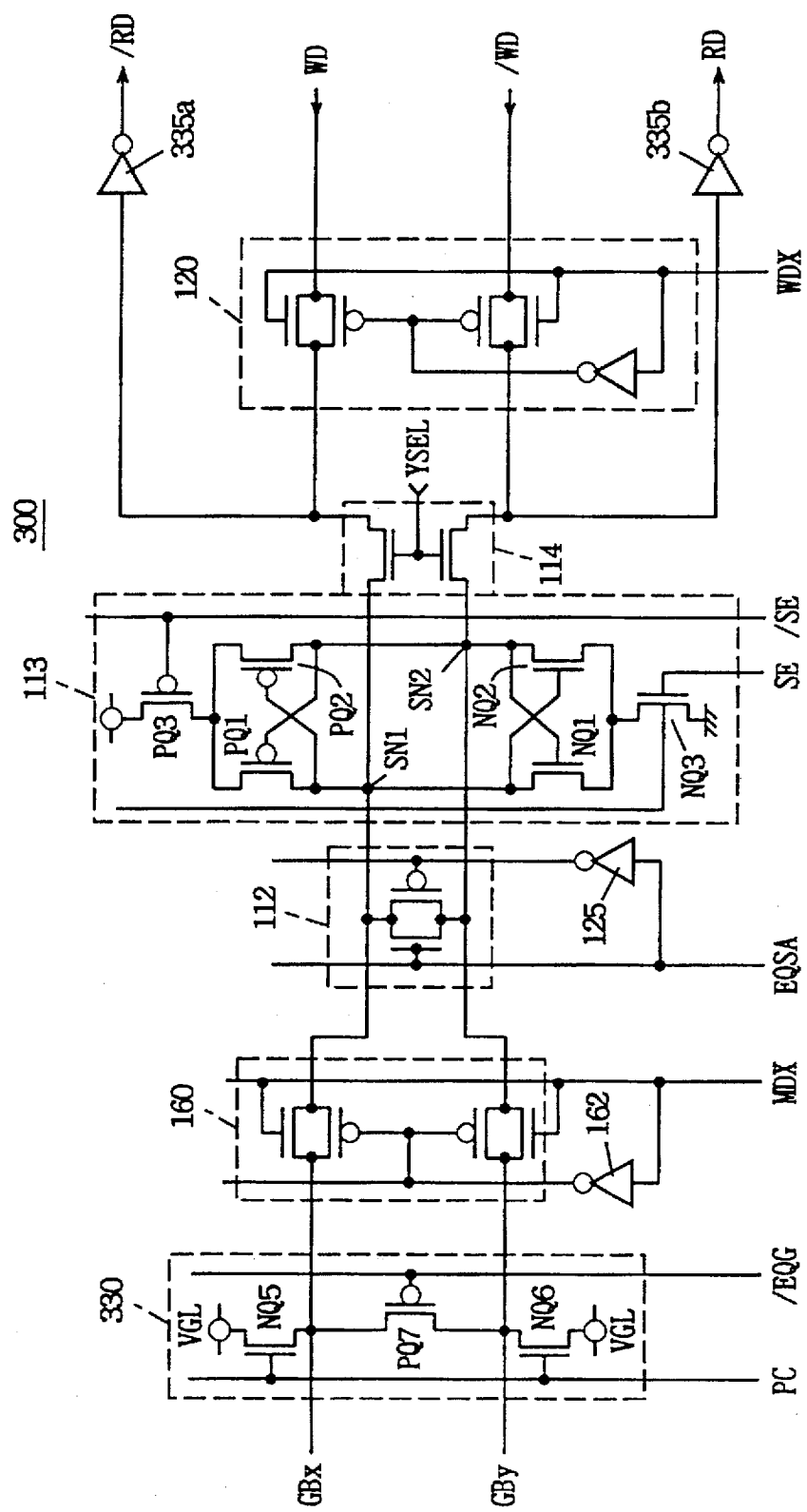
FIG. 28 schematically shows a structure of a sense amplifier circuit shown in FIG. 25.

FIG. 28 shows a specific structure of sense amplifier circuits 300a... 300b shown in FIG. 25. FIG. 28 representatively shows sense amplifier circuit 300 provided for one global bit line pair. Sense amplifier circuit 300 shown in FIG. 28 has the same structure as the sense circuit in the embodiment 1 shown in FIG. 3. The corresponding portions bear the same reference numerals, and will not be described below in detail. In the sense amplifier circuit 300 shown in FIG. 28, a global bit line precharge/equalize circuit 330 is arranged between transfer gate 160 and global bit lines GBx and GBy for precharging and equalizing global bit lines GBx and GBy to a predetermined potential VGL. This global bit line precharge/equalize circuit 330 includes n-channel MOS transistors NQ5 and NQ6 which are turned on in response to a precharge instructing signal PC to transmit a predetermined potential VGL to global bit lines GBx and GBy, respectively, and a p-channel MOS transistor PQ7, which is turned on in response to an equalize instructing signal /EQG to electrically short-circuits global bit lines GBx and GBy.

Predetermined potential VGL to which global bit lines GBx and GBy are precharged may be equal to or higher than the potential VBL (or VBLa) to which local bit line 6 is precharged. The potential level of global bit line precharge voltage VGL is set such that the potential levels, which are transmitted to sense nodes SN1 and SN2 via global bit lines GBx and GBy during reading of memory cell data, may be in a voltage region providing a high sensitivity of sense amplifier 113.

For read data bus lines /RD and RD for data reading, there are arranged inverter circuits 335a and 335b, respectively, which further amplify the amplified information of sense amplifier 113 transmitted via column select gate 114. In this structure, valid data is outputted via column select gate 114, inverter circuits 335a and 335b, and the DQ buffer, after amplification by sense amplifier 113. An operation of sense amplifier circuit 300 shown in FIG. 28 will be described below with reference to an operation waveform diagram of FIG. 29.

When the address signal changes, block decoder 265 (see FIG. 25) operates in accordance with this address signal, and block select signal BS for the selected memory block is set to the active state of H-level. Thereby, precharging and equalizing of local bit line pair LBP stops in the selected memory block. In accordance with block select signal BS, the local row decoder is activated, and the word line select signal, which is applied from the global row decoder via the global word line, is transmitted onto the corresponding local word line LWL. A time period from the change in address signal and the rising of block select signal BS to the rising of local word line LWL corresponds to a delay time of the delay circuit 315 shown in FIG. 27. At a certain time during this period, precharge instructing signal PS is set to the inactive state of L-level in accordance with block select signal BS, and also global bit line equalize signal /EQG is set to the inactive state of H-level. Likewise, sense node equalize instructing signal EQSA is set to the inactive state of L-level, and the operation of equalizing sense nodes SN1 and SN2 is completed. In accordance with change in the address signal (or internal chip select signal), transfer instructing signal MDX is set to the active state of H-level for a predetermined period, and transfer gate 160 is turned on.

Local word line LWL is set to the selected state, and a potential change corresponding to the storage information of the memory cell appears at the corresponding bit line pair. This potential change is transmitted onto global bit line pair BG via sub-bit line pairs SBPa . . . SBPb and block select gates 310a . . . 310b. Block select gates 310a . . . 310b are turned on in accordance with the delayed signal of block select signal BS.

Then, transfer instructing signal MDX is set to the inactive state of L-level, and transfer gate 160 is turned off, so that sense amplifier 113 is isolated from global bit line pair GBx and GBy. At a predetermined timing, sense amplifier activating signal SE is activated in accordance with rising of transfer instructing signal MDX, so that sense amplifier 113 operates to amplify complementarily the potentials on sense nodes SN1 and SN2 for latching. Transfer instructing signal MDX is set to L-level, and sense amplifier 113 is activated while transfer gate 160 is off, so that sense amplifier 113 can perform rapid sensing without being influenced by loads on global bit lines GBx and GBy extending over memory blocks 250a . . . 250b.

In the data read operation, sense amplifier 113 is connected to inverter circuits 335a and 335b corresponding to the selected column in accordance with column select signal YSEL after activation of the sense amplifier (for eliminating an influence of the load on the internal data bus upon the sensing operation). Thereby, data amplified by sense amplifier 113 is inverted and amplified by inverter circuits 335a and 335b, and is transmitted to DQ buffer 8 for externally outputting of read data. In the data write operation, write data transfer instructing signal WDX is activated at a predetermined timing in accordance with activation of write enable signal /WE, and the write data is transmitted to sense nodes SN1 and SN2 of sense amplifier 113. The potential change, which occurs on sense nodes SN1 and SN2 and global bit line pair GB in the data write operation, are shown by broken lines.

When the sensing operation of sense amplifier 113 is completed and the potential levels on sense nodes SN1 and SN2 are made definite, transfer instructing signal MDX is set again to the active state of H-level at a predetermined timing, and the storage information latched on sense nodes SN1 and SN2 is transmitted onto global bit line pair GB via transfer gate 160. Global bit line pair GB is connected to sub-bit line pairs SBPa . . . SBPb via block select gates 310a . . . 310b, respectively, and storage information is rewritten into the memory cell connected to the selected row in the selected memory block.

When the address signal changes, the block select signal BS for the selected memory block lowers to L-level. When block select signal BS is deactivated, the local row decoder is deactivated, and the potential level on local word line LWL lowers to L-level, so that the memory cell connected to selected local word line LWL is isolated from the corresponding bit line pair, and the storage information is surely held in each memory cell.

In response to deactivation of block select signal BS, precharge instructing signal PC attains H-level, and global bit line equalize instructing signal /EQG lowers to L-level, so that precharging and equalizing of global bit line pair GB are performed. In parallel to these operations, sense amplifier activating signal SE is deactivated, and sense amplifier 113 stops its latch operation and is deactivated. Thereby, sense nodes SN1 and SN2 are set to the same potential levels as those of global bit lines GBx and GBy. After deactivation of sense amplifier activating signal SE, transfer instructing signal MDX is set to the inactive state of L-level, and transfer gate 160 is turned off.

Figure 29:
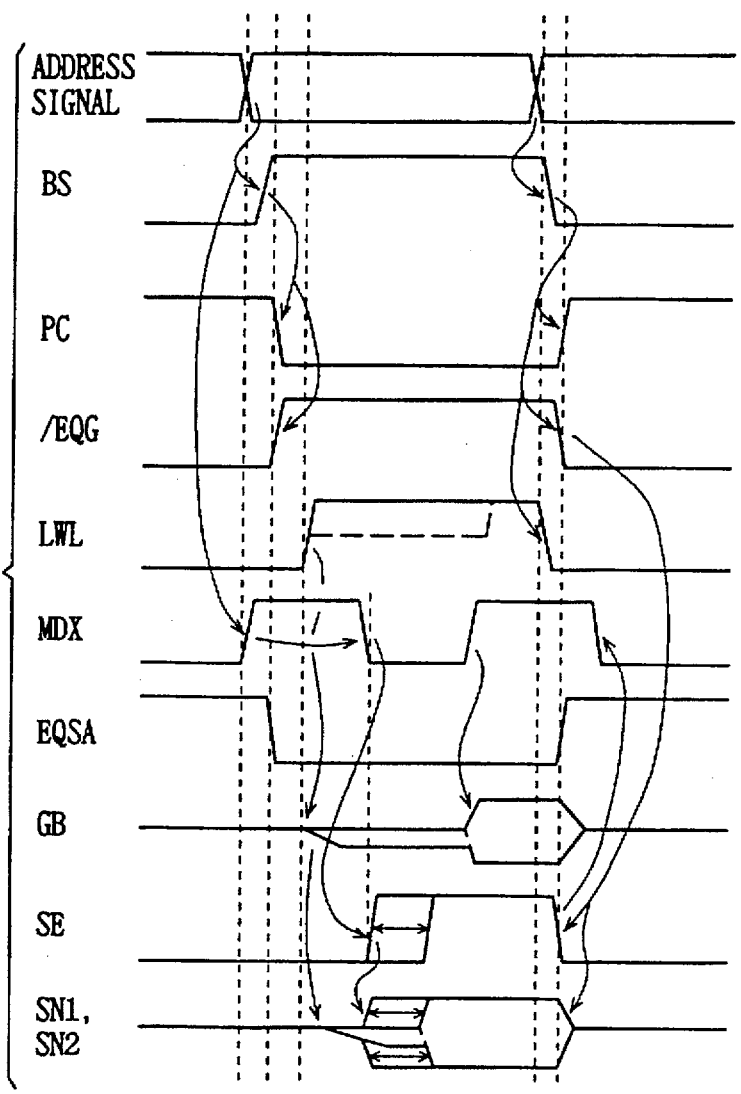
FIG. 29 is a signal waveform diagram representing an operation of the sense amplifier circuit shown in FIG. 28.

In the operation waveform shown in FIG. 29, start of each memory cycle may be set by any one of the structures of the embodiments 1 to 3 already described. In the structure shown in FIG. 29, transfer instructing signal MDX is set to H-level for a predetermined period in response to change in the address signal, and then is set to L-level for a predetermined period. Thereafter, transfer instructing signal MDX is set to the active state of H-level when performing data storing operation. Sense amplifier activating signal SE is set to the active state for a predetermined period in response to falling of transfer instructing signal MDX, and then is deactivated in response to deactivation of equalize instructing signal /EQG. The structure for these operations can be achieved utilizing the structures of the embodiments 1 to 3.

In the structure shown in FIG. 28, read data is transmitted onto read data bus lines /RD and RD via inverter circuits 335a and 335b, respectively. In this case, reading of data is performed after operation of sense amplifier 113. Valid data may be read out before the sensing operation of sense amplifier 113, or data reading is performed at an earlier timing. In this case, preamplifiers of a current mirror type may be used instead of inverter circuits 335a and 335b. A write driver may be arranged before write data transfer gate 120, or a latch similar to that in the embodiment 3 may be arranged before the gate.

Figure 30:
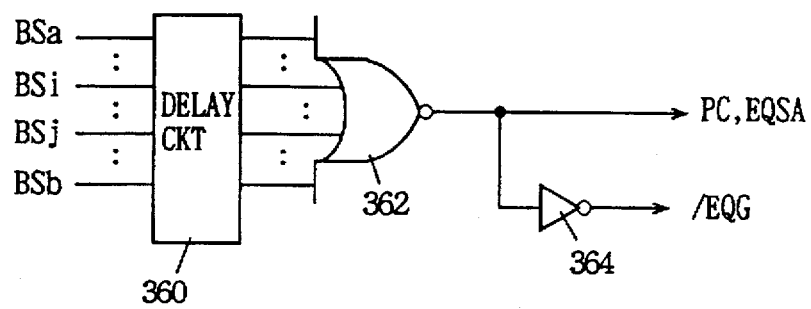
FIG. 30 shows another structure of the internal control signal generating portion in the semiconductor memory device according to the embodiment 4 of the invention.
Figure 31:
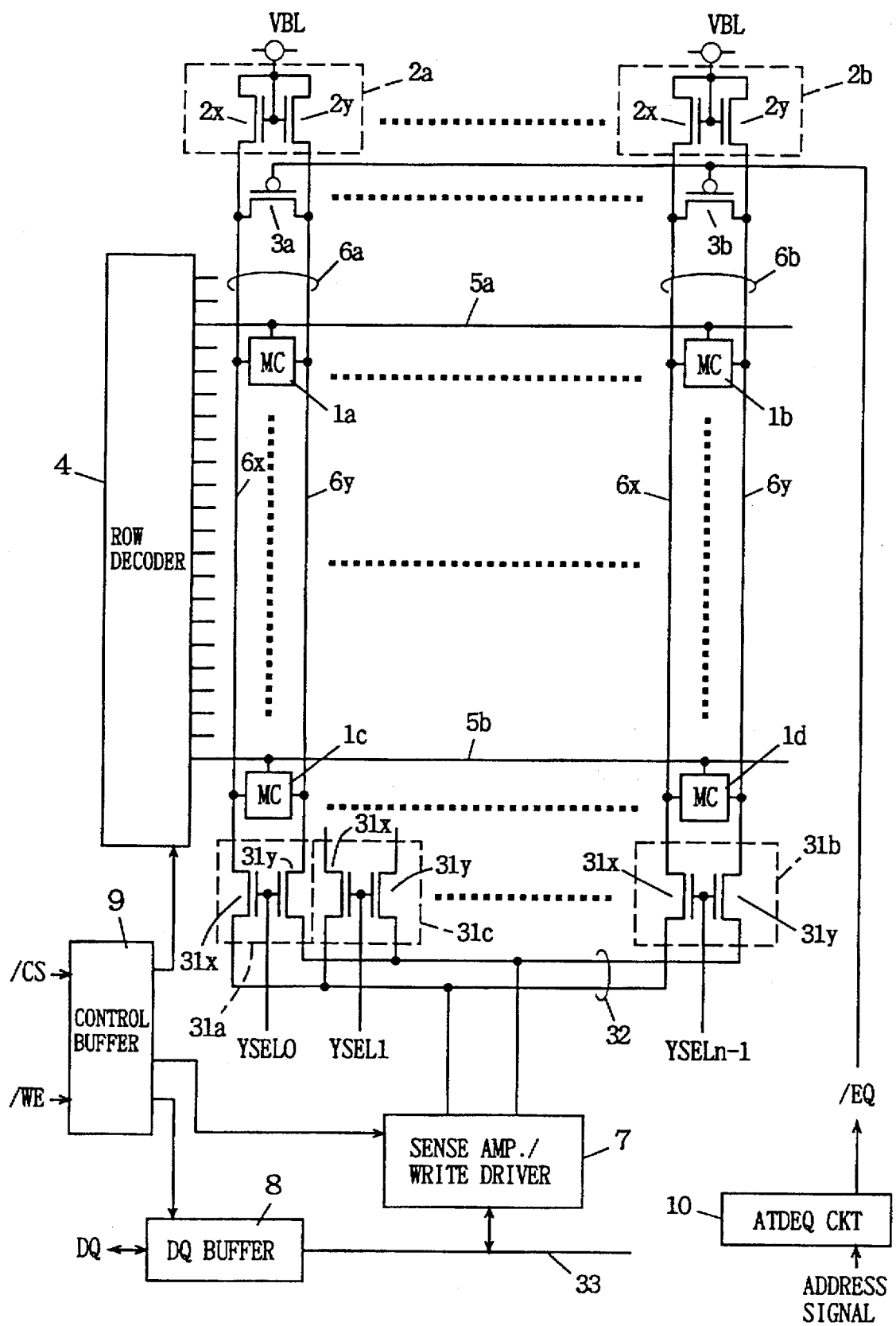
FIG. 31 schematically shows a whole structure of a conventional SRAM.
Figure 32:
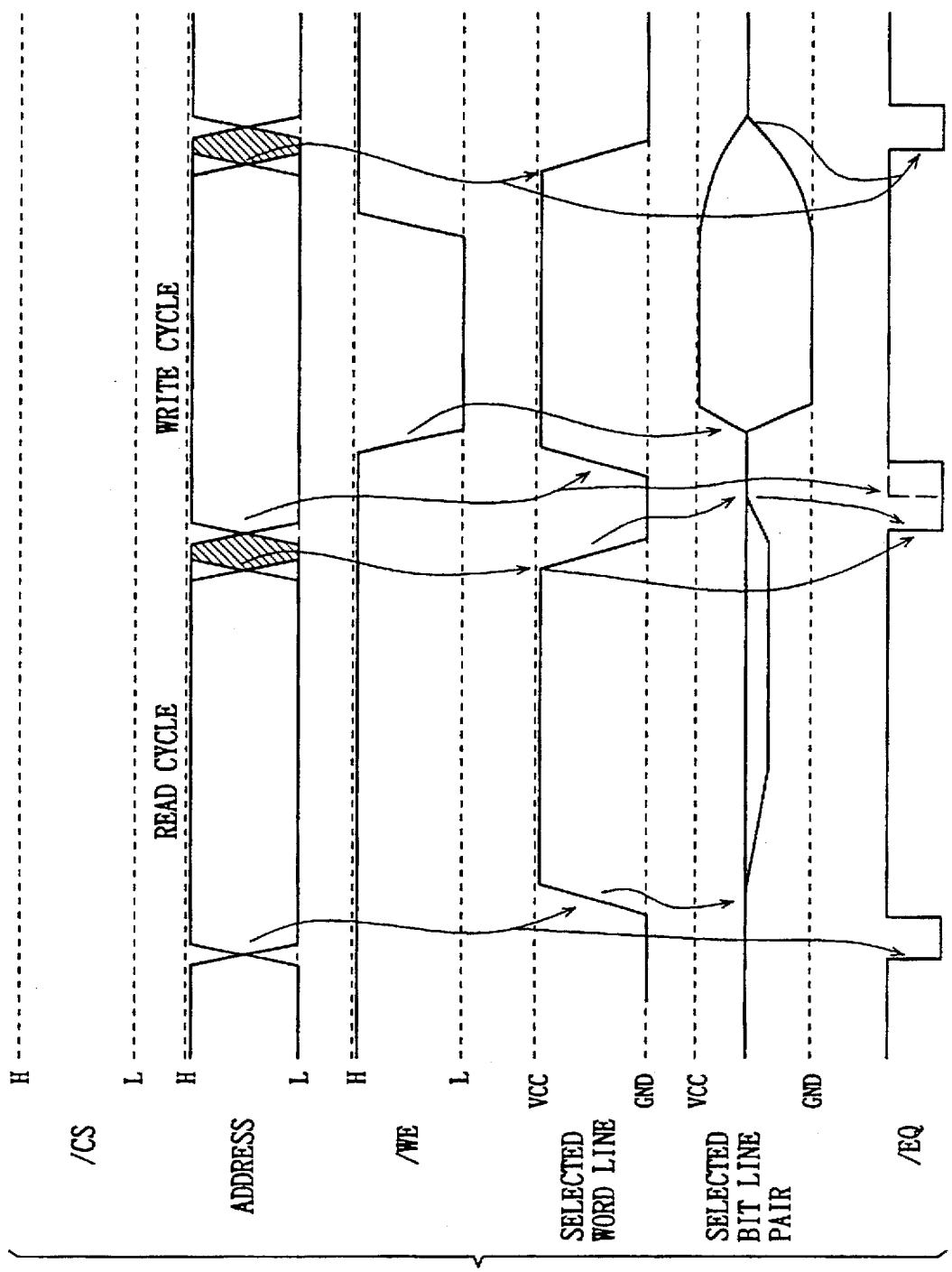
FIG. 32 is a signal waveform diagram schematically representing a whole operation of the semiconductor memory device shown in FIG. 31.
Figure 33A:
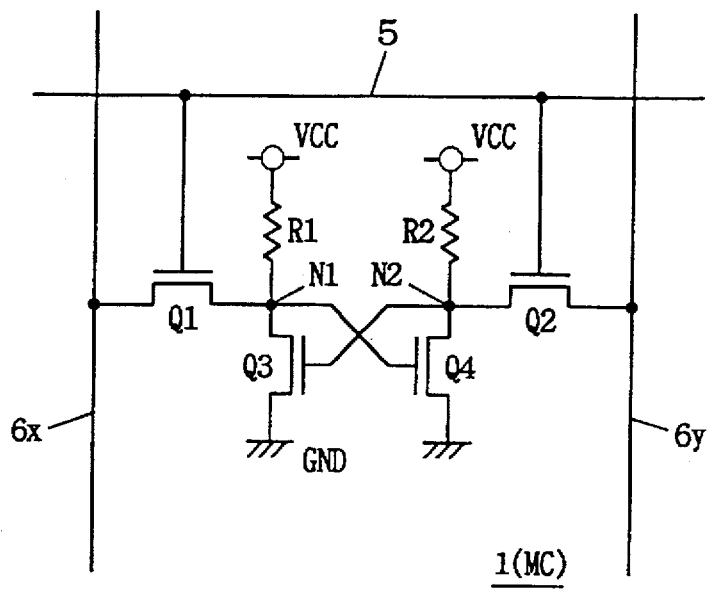
FIGS. 33A and 33B each show a structure of a memory cell shown in FIG. 31.
Figure 33B:
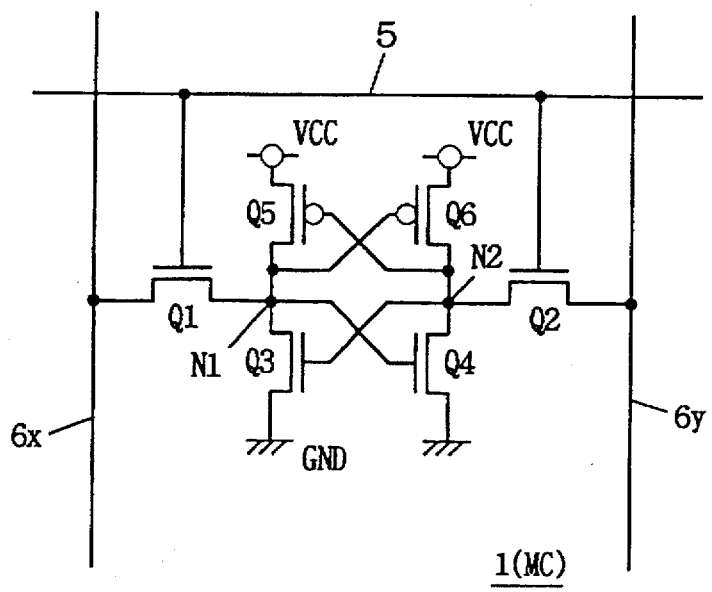

FIG. 30 shows another structure of a portion generating the equalize instructing signal and precharge instructing signal which determine the memory cycle. The structure shown in FIG. 30 includes a delay circuit 360 receiving block select signals BSa . . . BSb, an NOR circuit 362 receiving a delay block select signal from delay circuit 360, and an inverter circuit 364 inverting an output signal of NOR circuit 362. Delay circuit 360 has a delay time similar to that of delay circuit 315 shown in FIG. 27. NOR circuit 362 generates global bit line precharge instructing signal PC and sense node equalize instructing signal EQSA, and inverter circuit 364 generates global bit line equalize instructing signal /EQG. NOR circuit 362 sets signals PC and EQSA to the inactive state of L-level and sets equalize instructing signal /EQG to the inactive state of H-level, when one of the delay block select signals from delay circuit 360 is set to the selected state of H-level.

By utilizing block select signals BSa . . . BSb as the memory cycle designating signals, activation and deactivation of signals PC, EQSA and /EQG can be controlled surely at predetermined timings. In the structure shown in FIG. 30, as a period for precharging and equalizing the global bit line pair, a period between inactivation the selected one of block select signals BSa . . . BSb and subsequent driving of another block select signal to the selected state is required. In order to ensure the period for precharging and equalizing the global bit line pair, a rising delay circuit may be arranged at an output of NOR circuit 360.

In the waveform diagram of FIG. 29, the potential on selected local word line LWL is raised to the power supply voltage level, and storage data of the memory cell is destructively read out, as is done in the embodiment 1. However, such structure may be employed that, in the data read operation, the potential on selected local word line LWL is held at the intermediate potential level, and, in the restore operation, the potential on selected local word line LWL is raised to the power supply voltage level, as is done in the embodiment 3. This can be achieved by applying the row decode circuit in the embodiment 3 to the local row decode circuit.

According to the embodiment 4 of the invention, as described above, the global bit line pairs are arranged commonly to the plurality of memory blocks and corresponding to the respective memory cell columns (local bit line pairs) in each memory block. Further, sense amplifiers are provided corresponding to the global bit line pairs, respectively, for sensing, amplifying, latching and rewriting the data of memory cell. Therefore, in both cases that the cell ratio is small and that the power supply voltage is low, destruction of storage data of the memory cell can be prevented, and the SRAM can achieve a stable operation. Since the sense amplifier circuit is arranged commonly to the plurality of memory blocks, the number of sense amplifier circuits can be reduced to (1/(the number of memory blocks)) of that in the structure where the sense amplifier circuits are arranged for each memory block, so that an area occupied by a peripheral circuit can be remarkably reduced, and therefore an area occupied by the SRAM can be small.

According to the invention, as described above, the sense amplifier is arranged for each bit line pair, and this sense amplifier senses, amplifies and latches the data of memory cell. Therefore, even if the memory cell has a small cell ratio and/or a low power supply voltage is used, the storage information is not destroyed, so that it is possible to provide the SRAM, which can stably retin the storage information, and can also achieve a small occupying area and/or the operation with a low power supply voltage.

In the memory cell structure, the load element is arranged hierarchically with respect to the drive transistor. This prevents disadvantages such as the latch-up phenomenon and allows stable operation with a small occupying area in contrast to the structure in which p- and n-channel MOS transistors are arranged on the same substrate, as is done in a CMOS memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of word lines arranged in a row direction;

a plurality of bit line paris arranged in a column direction;

a plurality of memory cells arranged at crossings between said plurality of word lines and said plurality of bit line pairs, the memory cells each storing information, each of said plurality of memory cells including (i) a pair of load elements coupled between a first power supply node and first and second storage nodes for driving said first and second storage nodes to a voltage level on said first power supply node, respectively, (ii) a pair of cross-coupled drive transistor elements coupled between said first and second storage nodes and a second power supply node for holding potentials on said first and second storage nodes, respectively, and (iii) a pair of access transistor elements responsive to a signal potential on a corresponding word line to connect electrically said first and second storage nodes to bit lines of a corresponding bit line pair, respectively;

a plurality of sense amplifiers provided corresponding to said plurality of bit line pairs for sensing, amplifying and latching potential differences of corresponding bit line pairs when activated, respectively;

sense amplifiers activating means responsive to a memory cell selection instructing signal for activating said plurality of sense amplifiers;

row selecting means for decoding an applied address signal and driving a word line among said plurality of word lines arranged corresponding to an addressed row to the selected state;

column selecting means for decoding another applied address signal and selecting a bit line pair among said plurality of bit lines arranged corresponding to an addressed column; and writing means for transferring a write data onto the selected bit line pair when activated in response to a write operation instructing signal being active, wherein said row selecting means includes means for writing the write data into a memory cell on the selected bit line pair while restoring data corresponding to the potential differences latched by the sense amplifiers into memory cells on respective bit line pairs other than the selected bit line pair.

2. The semiconductor memory device according to claim 1, wherein said sense amplifier activating means includes means for activating said plurality of sense amplifiers by delaying activation of said memory cell selection instructing signal by a predetermined time.

3. The semiconductor memory device according to claim 1, wherein said memory cell selection instructing signal is a chip select signal setting said semiconductor memory device to the selected state, and said sense amplifier activating means includes means for activating said plurality of sense amplifiers in response to deactivation of said chip select signal.

4. The semiconductor memory device according to claim 1, wherein said row selecting means includes:
means for transmitting an intermediate voltage intermediate the voltages on said first and second power supply nodes onto the selected word line when a read operation instructing signal is active; and drive means for transmitting said intermediate voltage onto said selected word line when the write operation instructing signal is active, and subsequently driving said selected word line to a voltage level on said first power supply node when data held by said plurality of sense amplifiers is written into selected memory cells coupled to the selected word line.

5. The semiconductor memory device according to claim 1, wherein said memory cell selection instructing signal is an address transition detection signal indicative of transition of said applied address signal.

6. The semiconductor memory device according to claim 4, wherein said drive means includes means for boosting the potential on said selected word line in response to shift of said write operation instructing signal from active state instructing a data write operation to an inactive state.

7. The semiconductor memory device according to claim 1, further comprising:

a plurality of transfer gates arranged between said plurality of bit line pairs and corresponding sense amplifiers, and turned on for a predetermined period in response to activation of said memory cell selection instructing signal, to electrically connecting the bit line pairs to the corresponding sense amplifiers, respectively, and wherein said sense amplifier activating means includes means for activating said plurality of sense amplifiers in response to elapsing of said predetermined period.

8. The semiconductor memory device according to claim 7, further comprising means for turning on said plurality of transfer gates again in response to deactivation of said memory cell selection instructing signal.

9. The semiconductor memory device according to claim 7, further comprising means for turning on said plurality of transfer gates again in response to shift of a read/write mode designating signal designating one of a data write mode and a data read mode from designation of data write to designation of data read, said write operation instructing signal being made active in response to the read/write mode designating signal designating the data write.

10. The semiconductor memory device according to claim 1, wherein
each of said drive transistor elements and said access transistor elements is an insulated gate field effect transistor having a threshold voltage VTH, and
said row selecting means includes means for transmitting a voltage substantially at a level of 2·VTH equal to a double of said threshold voltage onto the selected word line at least in a data read operation mode.

11. The semiconductor memory device according to claim 1, wherein
each of said drive transistor elements and said access transistor elements is an insulated gate field effect transistor having a transfer coefficient β, and
a ratio of the transfer coefficients β of said drive transistor elements and said access transistor elements is substantially equal to 1.

12. A semiconductor memory device comprising:
a plurality of memory blocks each including (i) a plurality of word lines arranged in a row direction, (ii) a plurality of local bit line pairs arranged in a column direction, and (iii) a plurality of memory cells arranged at crossings between said plurality of local bit lines pairs and said plurality of word lines, respectively, each of said plurality of memory cells including (a) a pair of load elements connected between a first power supply node and first and second storage nodes for driving said first and second storage nodes to a voltage level on said first power supply node, respectively, (b) a pair of cross-coupled drive transistor elements coupled between said first and second storage nodes and a second power supply node for holding the potentials on said first and second storage nodes, respectively, and (c) a pair of access transistor elements responsive to a signal potential on a corresponding word line to connect electrically said first and second storage nodes to local bit lines of a corresponding local bit line pair, respectively;
a plurality of global bit line pairs provided commonly to said plurality of memory blocks and corresponding to said plurality of local bit line pairs, respectively, and responsive to a block select signal to be electrically connected to corresponding local bit line pairs of a memory block selected by said block select signal, respectively, and arranged in said row direction over said plurality of memory blocks;
a plurality of sense amplifiers provided corresponding to said plurality of global bit line pairs for sensing, amplifying and latching potential differences of the corresponding global bit line pairs when activated, respectively;
sense amplifiers activating means responsive to a memory cell selection instructing signal for activating said plurality of sense amplifiers;
row selecting means for decoding an applied address signal and driving a word line among said plurality of word lines arranged corresponding to an addressed row to the selected state;
column selecting means for decoding another applied address signal and selecting a global bit pair among said plurality of global bit line pairs arranged corresponding to an addressed column; and
writing means for transferring a write data onto a selected local bit line pair arranged corresponding to the addressed column in the selected memory block through the selected global bit line pair when activated in response to a write operation instructing signal being active, wherein
said row selection means includes means for writing the write data into a memory cell on the selected local bit line pair while restoring data corresponding to the potential differences latched by the sense amplifiers and held thereby into memory cells on respective local bit line pairs other than the selected local bit line pair.

13. The semiconductor memory device according to claim 12, wherein said sense amplifier activating means includes means for activating said plurality of sense amplifiers by delaying an activation of said memory cell selection instructing signal by a predetermined time.

14. The semiconductor memory device according to claim 12, wherein
said memory cell selection instructing signal is a chip select signal setting said semiconductor memory device to a selected state, and
said sense amplifier activating means includes means for activating said plurality of sense amplifiers in response to deactivation of said chip select signal.

15. The semiconductor memory device according to claim 12, wherein
said row selecting means includes:
means for transmitting an intermediate voltage intermediate the voltages on said first and second power supply nodes onto the selected word line when a read operation instructing signal is active; and
drive means for transmitting said intermediate voltage onto said selected word line when the write operation instructing signal is active, and subsequently driving said selected word line to a voltage level on said first power supply node when data held by said plurality of sense amplifiers is written into the selected memory cells connected to said selected word line.

16. The semiconductor memory device according to claim 12, wherein said memory cell selection instructing signal is an address transition detection signal indicative of a transition of said applied address signal.

17. The semiconductor memory device according to claim 15, wherein said drive means includes means for boosting the potential on said selected word line in response to shift of said write operation instructing signal from an active state instructing the data write operation to an inactive state.

18. The semiconductor memory device according to claim 12, further comprising:
a plurality of transfer gates arranged between said plurality of global bit line pairs and corresponding sense amplifiers, and turned on for a predetermined period in response to activation of said memory cell selection instructing signal, to electrically connecting the global bit line pairs to the corresponding sense amplifiers, respectively, and wherein
said sense amplifier activating means includes means for activating said plurality of sense amplifiers in response to elapsing of said predetermined period.

19. The semiconductor memory device according to claim 18, further comprising means for turning on said plurality of transfer gates again in response to deactivation of said memory cell selection instructing signal.

20. The semiconductor memory device according to claim 18, further comprising means for turning on said plurality of transfer gates again in response to shift of a read/write mode designating signal designating one of a data write mode and a data read mode from designation of data write to designation of data read, said write operation instructing signal being made active in response to the read/write mode designating signal designating the data write.

21. The semiconductor memory device according to claim 12, wherein each of said drive transistor elements and said access transistor elements is an insulated gate field effect transistor having a threshold voltage VTH, and said row selecting means includes means for transmitting a voltage of 2·VTH equal to a substantially at a level double of said threshold voltage onto the selected word line at least in a data read operation mode.

22. The semiconductor memory device according to claim 12, wherein each of said drive transistor elements and said access transistor elements is an insulated gate field effect transistor having a transfer coefficient $\beta$, and a ratio of the transfer coefficients $\beta$ of said drive transistor elements and said access transistor elements is substantially equal to 1.

\* \* \* \* \*